(12) United States Patent
Yamazaki et al.

(10) Patent No.: US 9,947,800 B2
(45) Date of Patent: Apr. 17, 2018

(54) TRANSISTOR, METHOD FOR MANUFACTURING TRANSISTOR, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Tokyo (JP); Yoshitaka Yamamoto, Nara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 15/610,683

(22) Filed: Jun. 1, 2017

(65) Prior Publication Data

US 2017/0271521 A1 Sep. 21, 2017

Related U.S. Application Data

(62) Division of application No. 15/057,364, filed on Mar. 1, 2016, now Pat. No. 9,685,560.

(30) Foreign Application Priority Data

Mar. 2, 2015 (JP) ................................ 2015-040597
Mar. 19, 2015 (JP) ................................ 2015-056030

(51) Int. Cl.
*H01L 29/10* (2006.01)
*H01L 29/786* (2006.01)
(Continued)

(52) U.S. Cl.
CPC ...... *H01L 29/7869* (2013.01); *H01L 21/0262* (2013.01); *H01L 21/02554* (2013.01);
(Continued)

(58) Field of Classification Search
CPC . H01L 29/7869; H01L 29/0684; H01L 29/24; H01L 29/66969; H01L 21/02554;
(Continued)

(56) References Cited

U.S. PATENT DOCUMENTS 5,528,032 A 6/1996 Uchiyama
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Patnaik.P, "Aluminum Oxide", Handbook of Inorganic Chemicals, 2003, p. 11, McGraw-Hill.
(Continued)

*Primary Examiner* — Tu-Tu Ho
(74) *Attorney, Agent, or Firm* — Fish & Richardson P.C.

(57) ABSTRACT

A transistor with favorable electrical characteristics, a transistor with stable electrical characteristics, or a highly integrated semiconductor device is provided. In a top-gate transistor in which an oxide semiconductor is used for a semiconductor layer where a channel is formed, elements are introduced to the semiconductor layer in a self-aligned manner after a gate electrode is formed. After that, a side surface of the gate electrode is covered with a structure body. The structure body preferably contains silicon oxide. A first insulating layer is formed to cover the semiconductor layer, the gate electrode, and the structure body. A second insulating layer is formed by a sputtering method over the first insulating layer. Oxygen is introduced to the first insulating layer when the second insulating layer is formed.

10 Claims, 54 Drawing Sheets

(51) Int. Cl.
  *H01L 29/66* (2006.01)
  *H01L 29/24* (2006.01)
  *H01L 21/02* (2006.01)
  *H01L 29/06* (2006.01)
  *H01L 21/477* (2006.01)

(52) U.S. Cl.
  CPC ...... *H01L 21/02565* (2013.01); *H01L 21/477* (2013.01); *H01L 29/0684* (2013.01); *H01L 29/24* (2013.01); *H01L 29/66969* (2013.01)

(58) Field of Classification Search
  CPC ........... H01L 21/02565; H01L 21/0262; H01L 21/477
  USPC .......................................................... 257/43
  See application file for complete search history.

(56) References Cited

U.S. PATENT DOCUMENTS

| | | | |
|---|---|---|---|
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,015,550 B2 | 3/2006 | Sugimae et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,461,007 B2 | 6/2013 | Yamazaki | |
| 8,466,463 B2 | 6/2013 | Akimoto et al. | |
| 8,530,289 B2 | 9/2013 | Yamazaki | |
| 8,546,225 B2 | 10/2013 | Yamazaki | |
| 8,547,771 B2 | 10/2013 | Koyama | |
| 8,629,069 B2 | 1/2014 | Akimoto et al. | |
| 8,669,550 B2 | 3/2014 | Akimoto et al. | |
| 8,790,959 B2 | 7/2014 | Akimoto et al. | |
| 8,796,069 B2 | 8/2014 | Akimoto et al. | |
| 8,956,912 B2 | 2/2015 | Yamazaki | |
| 8,995,174 B2 | 3/2015 | Koyama | |
| 9,099,562 B2 | 8/2015 | Akimoto et al. | |
| 9,112,036 B2 | 8/2015 | Koezuka et al. | |
| 9,240,488 B2 | 1/2016 | Yamazaki et al. | |
| 9,412,874 B2 | 8/2016 | Miyamoto et al. | |
| 9,741,794 B2 * | 8/2017 | Yamazaki ........... H01L 29/1054 | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0113972 A1 | 6/2003 | Hayashi et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0233575 A1 | 10/2005 | Abe | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2008/0308805 A1 | 12/2008 | Akimoto et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092809 A1 | 4/2010 | Itagaki et al. | |
| 2010/0109002 A1 | 5/2010 | Itagaki et al. | |
| 2010/0224871 A1 | 9/2010 | Yamaguchi et al. | |
| 2010/0304529 A1 | 12/2010 | Sasaki et al. | |
| 2011/0095288 A1 | 4/2011 | Morosawa et al. | |
| 2011/0104851 A1 | 5/2011 | Akimoto et al. | |
| 2011/0121290 A1 | 5/2011 | Akimoto et al. | |
| 2011/0212570 A1 | 9/2011 | Yamazaki et al. | |
| 2011/0263083 A1 | 10/2011 | Yamazaki | |
| 2011/0303913 A1 | 12/2011 | Yamazaki et al. | |
| 2012/0187396 A1 | 7/2012 | Yamazaki et al. | |
| 2012/0187397 A1 | 7/2012 | Yamazaki et al. | |
| 2012/0231580 A1 | 9/2012 | Yamazaki et al. | |
| 2012/0315730 A1 | 12/2012 | Koezuka et al. | |
| 2013/0092924 A1 | 4/2013 | Sasagawa et al. | |
| 2013/0126862 A1 | 5/2013 | Yamazaki | |
| 2013/0146870 A1 | 6/2013 | Yamazaki | |
| 2013/0157422 A1 | 6/2013 | Yamazaki | |

(56) References Cited

U.S. PATENT DOCUMENTS

| | | | |
|---|---|---|---|
| 2013/0161610 A1 | 6/2013 | Yamazaki | |
| 2013/0203214 A1 | 8/2013 | Isobe et al. | |
| 2013/0330877 A1 | 12/2013 | Yamazaki | |
| 2015/0034949 A1 | 2/2015 | Yamazaki | |
| 2015/0155312 A1 | 6/2015 | Yamazaki | |
| 2015/0280691 A1 | 10/2015 | Koyama | |
| 2015/0340513 A1 | 11/2015 | Akimoto et al. | |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 06-275697 A | 9/1994 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-096055 A | 4/2007 | |
| JP | 2007-123861 A | 5/2007 | |
| JP | 2010-016163 A | 1/2010 | |
| JP | 2012-257187 A | 12/2012 | |
| JP | 2016-167590 A | 9/2016 | |
| WO | WO-2004/114391 | 12/2004 | |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1270-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review, A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID DIGEST '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2008, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. Electrochem. Soc. (Journal of Electrochemical Society), 2008, vol. 155, No. 12, pp. H1009-H1014.
Ohara.H et al., "21.3:4.0 IN. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

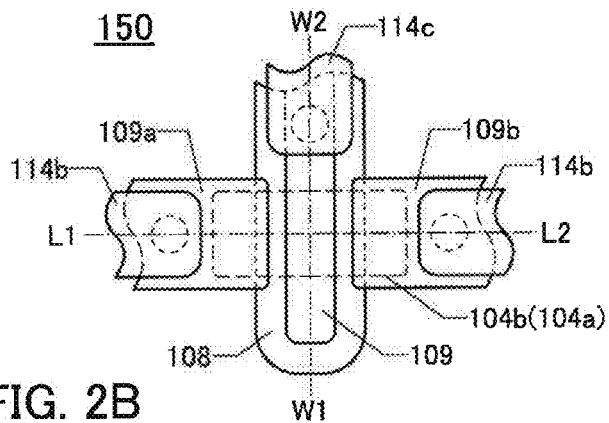
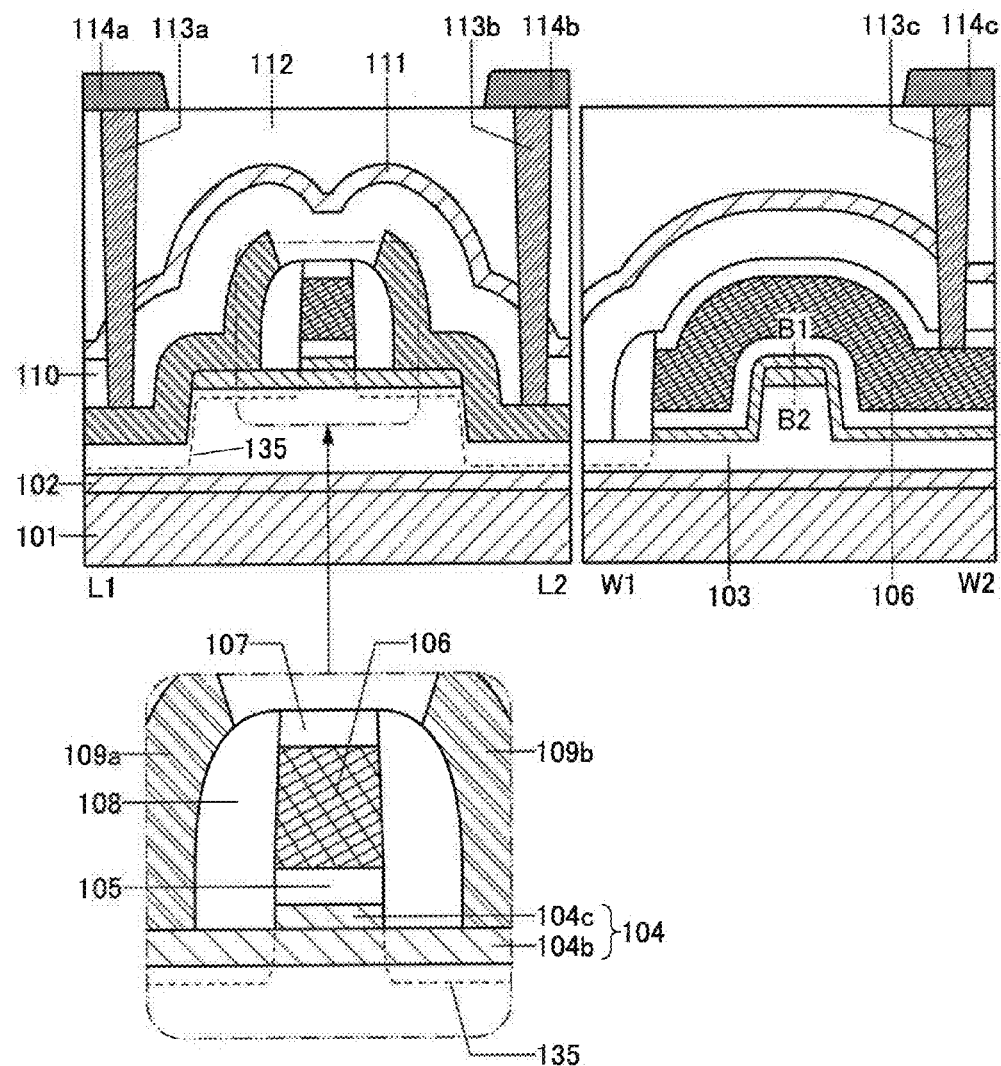

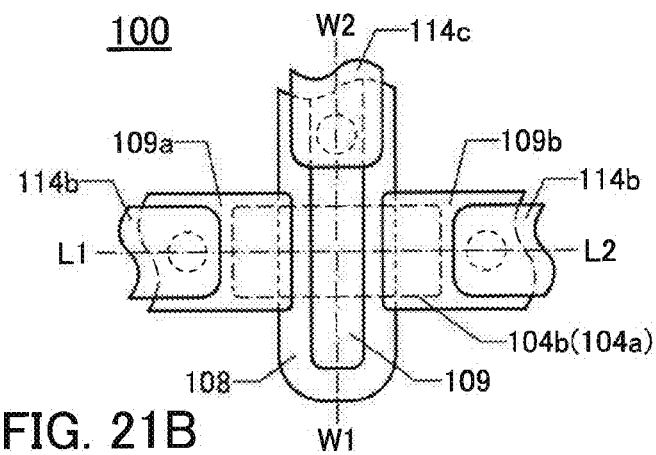
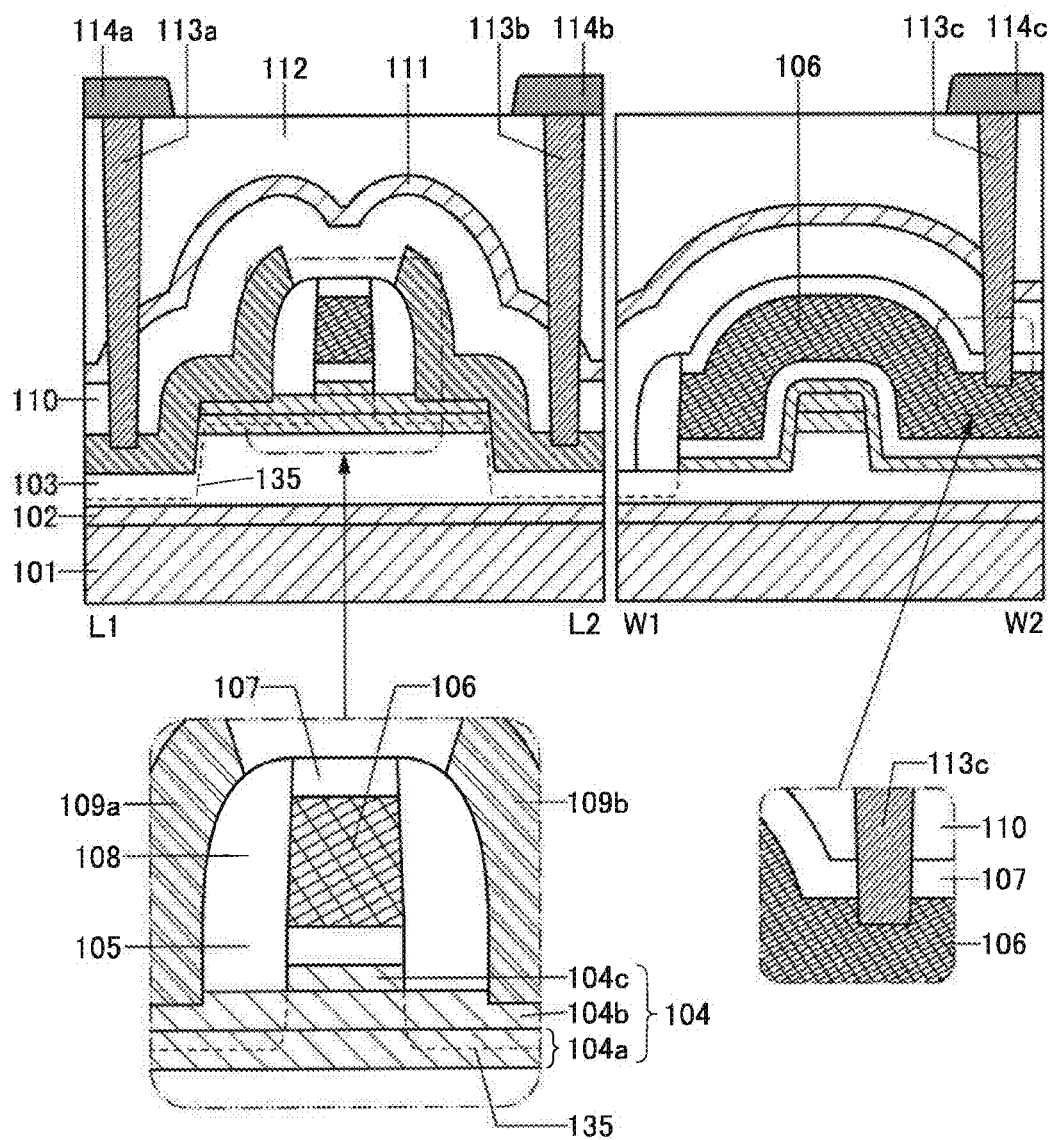

FIG. 23A
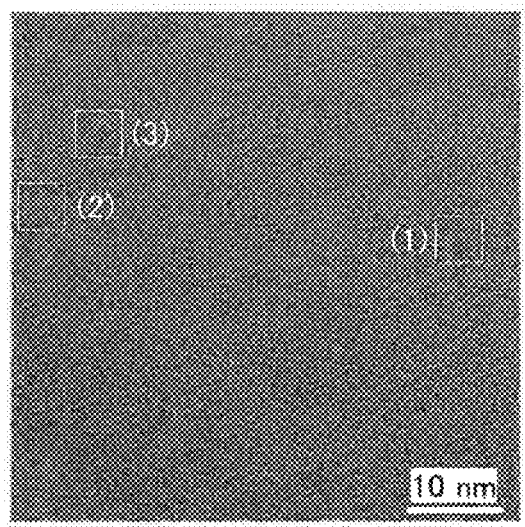
FIG. 23B      FIG. 23C      FIG. 23D
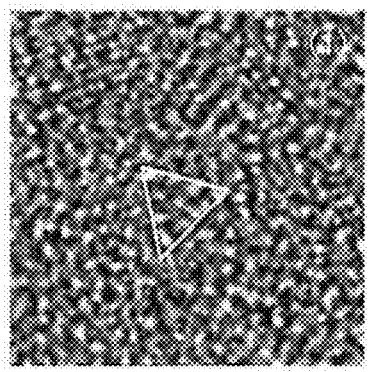  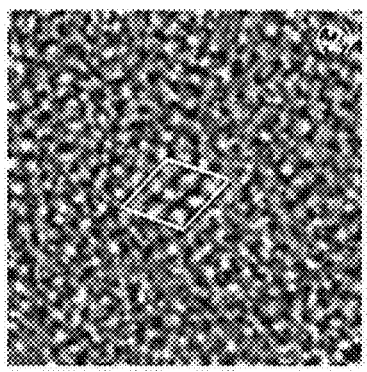  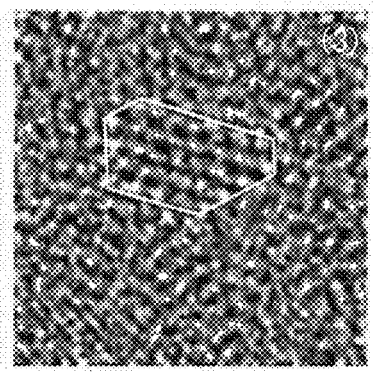

in-plane method φ scan
CAAC-OS in-plane method φ scan
Single crystal OS

FIG. 25A
FIG. 25B
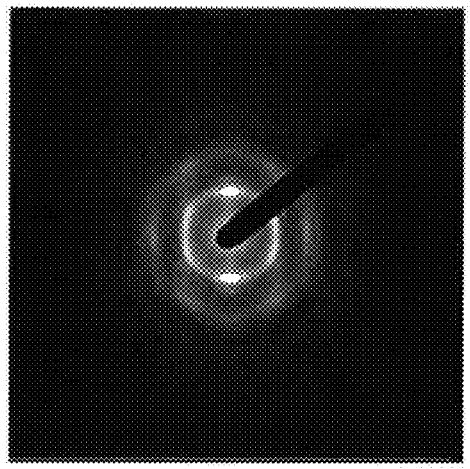
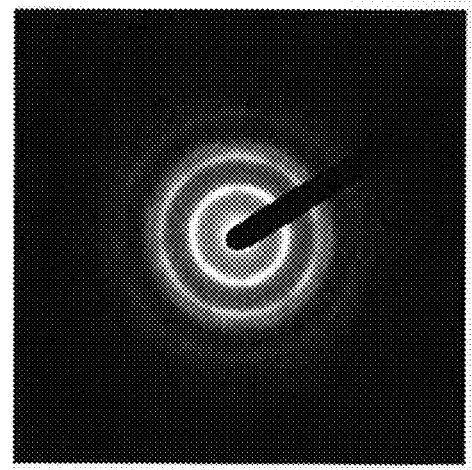

FIG. 45A1
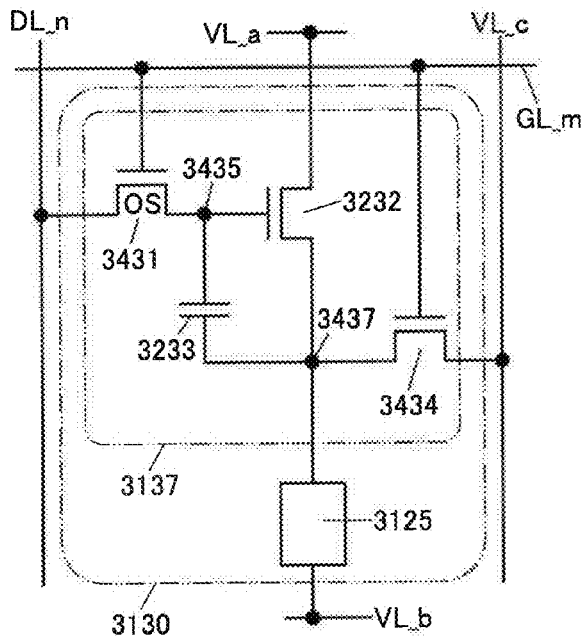
FIG. 45B1
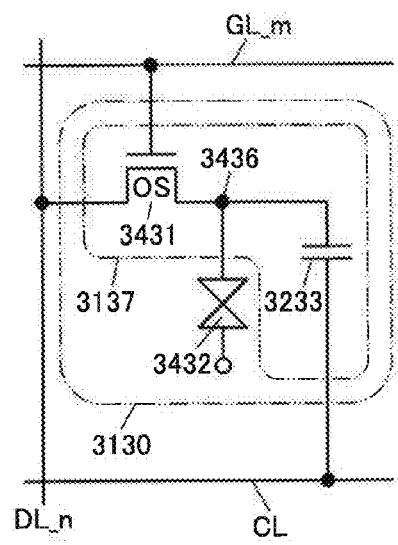
FIG. 45A2
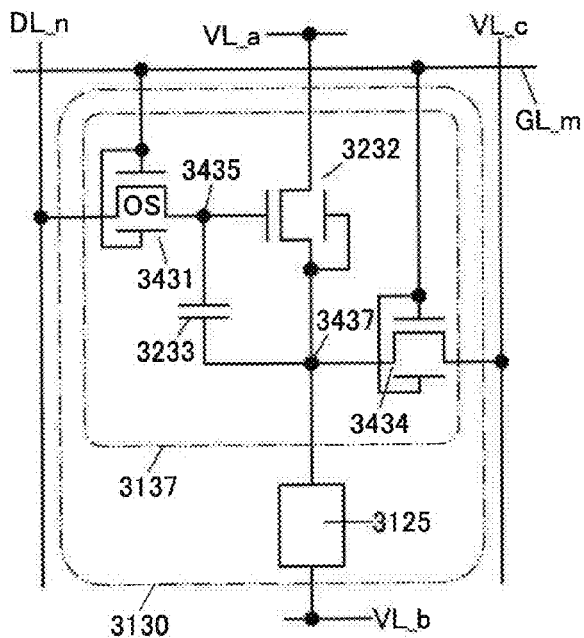
FIG. 45B2
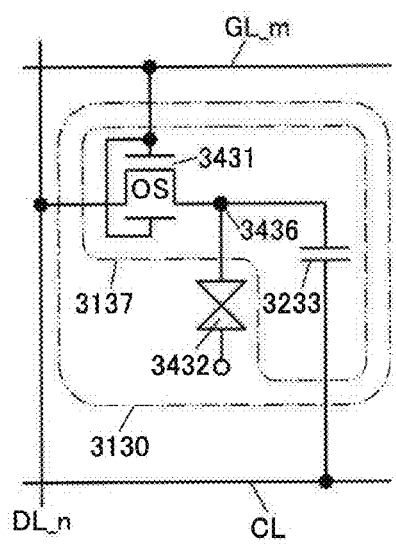

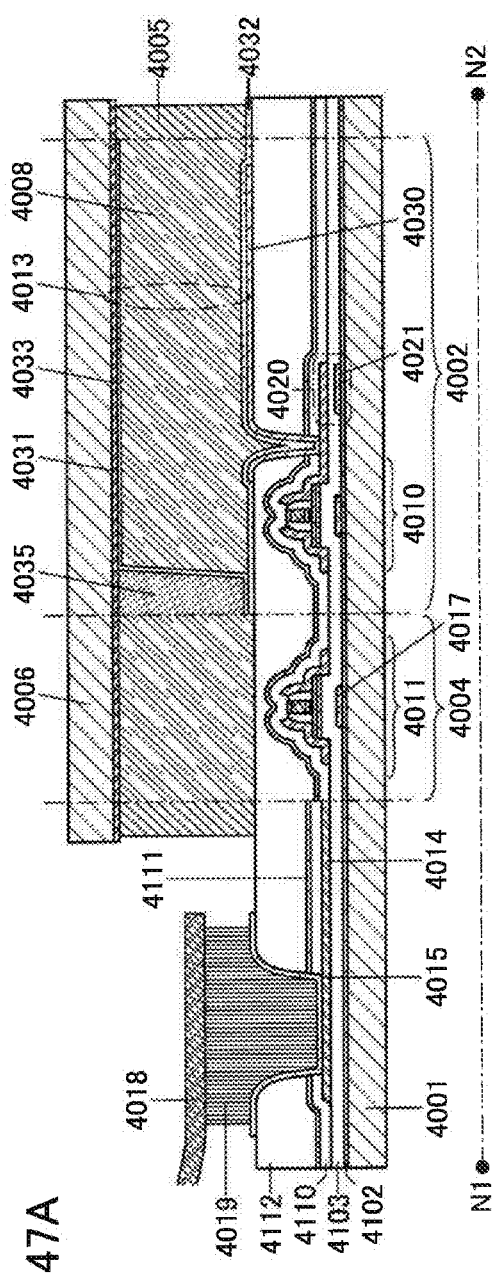
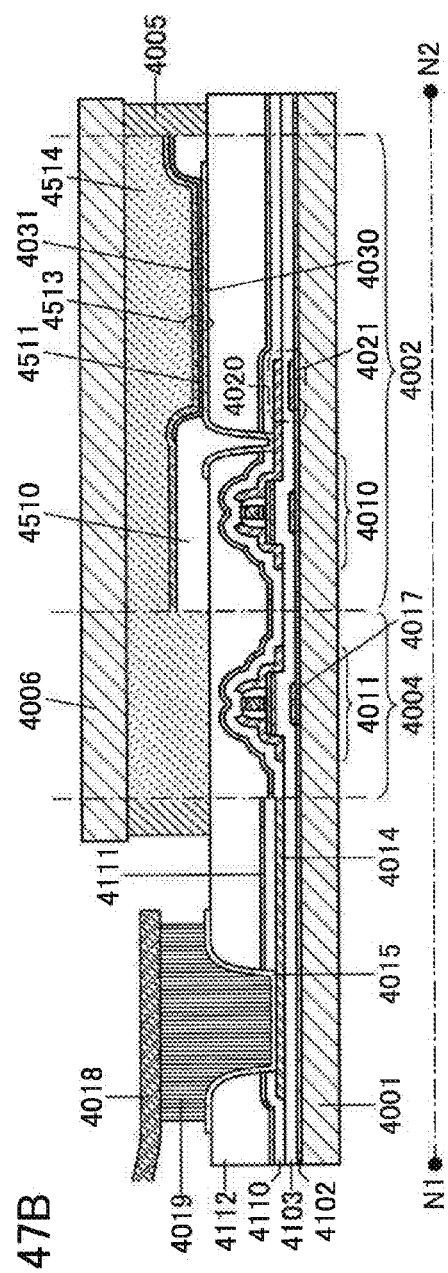
FIG. 47A
FIG. 47B

TRANSISTOR, METHOD FOR MANUFACTURING TRANSISTOR, SEMICONDUCTOR DEVICE, AND ELECTRONIC DEVICE

CROSS-REFERENCE TO RELATED APPLICATIONS

This application is a divisional of U.S. application Ser. No. 15/057,364, filed Mar. 1, 2016, now allowed, which claims the benefit of foreign priority applications filed in Japan as Serial No. 2015-040597 on Mar. 2, 2015, and Serial No. 2015-056030 on Mar. 19, 2015, all of which are incorporated by reference.

BACKGROUND OF THE INVENTION

1. Field of the Invention

One embodiment of the present invention relates to a transistor, a semiconductor device, and a manufacturing method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device (e.g., a liquid crystal display device and a light-emitting display device), a lighting device, an electro-optical device, a power storage device, a memory device, a semiconductor circuit, an imaging device, an electronic device, and the like may include a semiconductor device.

2. Description of the Related Art

In recent years, a transistor including an oxide semiconductor has attracted attention. An oxide semiconductor can be formed by a sputtering method or the like, and thus can be used for a semiconductor of a transistor in a large display device. In addition, a transistor including an oxide semiconductor is advantageous in reducing capital investment because part of production equipment for a transistor including amorphous silicon can be retrofitted and utilized.

It is known that a transistor including an oxide semiconductor has an extremely low leakage current in an off state. For example, a low-power-consumption CPU and the like utilizing the characteristics that a leakage current of the transistor including an oxide semiconductor is extremely low is disclosed (see Patent Document 1).

REFERENCE

[Patent Document 1] Japanese Published Patent Application No. 2012-257187

SUMMARY OF THE INVENTION

An object is to provide a miniaturized transistor. Another object is to provide a transistor with low parasitic capacitance. Another object is to provide a transistor with high frequency characteristics. Another object is to provide a transistor with favorable electrical characteristics. Another object is to provide a transistor with stable electrical characteristics. Another object is to provide a transistor with low power consumption. Another object is to provide a transistor with high reliability. Another object is to provide a novel transistor. Another object is to provide a semiconductor device including at least one of these transistors.

Note that the descriptions of these objects do not disturb the existence of other objects. In one embodiment of the present invention, there is no need to achieve all the objects. Other objects are apparent from and can be derived from the description of the specification, the drawings, the claims, and the like.

An embodiment of the present invention is a transistor including first to third oxide layers, an insulating layer, first to third electrodes, and a structure body. The first oxide layer is in contact with the second oxide layer. The second oxide layer is in contact with the third oxide layer. The first to third oxide layers each include a first region. The first regions overlap with one another. The first electrode is over the first regions with the insulating layer interposed therebetween. The structure body is positioned over the second oxide layer to cover a side surface of the first electrode. The second oxide layer overlaps with the first electrode in a second region, overlaps with the structure body in a third region, is in contact with the second electrode in a fourth region, and is in contact with the third electrode in a fifth region. The second oxide layer is an oxide semiconductor. The third to fifth regions each contain an element different from an element contained in the second region.

The element contained in the second region is, for example, tungsten, titanium, aluminum, or a rare gas element. The second oxide layer is preferably formed of a c-axis aligned crystalline oxide semiconductor (CAAC-OS). Note that CAAC-OS is described in detail in Embodiment 3. The second oxide layer preferably contains In and/or Zn. The first oxide layer and the third oxide layer preferably contain a metal element that is the same kind as at least one metal element contained in the second oxide layer.

Another embodiment of the present invention is a method for manufacturing a transistor including the following steps: a first step of forming a second oxide layer over a first oxide layer; a second step of processing the first and second oxide layers into an island shape; a third step of forming a third oxide layer to cover the second oxide layer; a fourth step of forming a first insulating layer to cover the third oxide layer; a fifth step of forming a first electrode over the first insulating layer; a sixth step of removing part of the third oxide layer and part of the first insulating layer using the first electrode as a mask to expose part of the second oxide layer; a seventh step of introducing elements to at least the part of the second oxide layer; an eighth step of forming a second insulating layer; a ninth step of processing the second insulating layer to form a structure body covering a side surface of the first electrode; a tenth step of forming a second electrode and a third electrode to be in contact with the exposed region of the second oxide layer; an eleventh step of forming a third insulating layer to cover the second electrode and the third electrode; a twelfth step of introducing oxygen to the third insulating layer when a fourth insulating layer is formed to cover the third insulating layer; and a thirteenth step of performing heat treatment after the twelfth step. The second oxide layer is an oxide semiconductor.

The twelfth step is preferably performed by a sputtering method. The structure body preferably contains silicon and oxygen.

Another embodiment of the present invention is an electronic device including the transistor or the semiconductor device and including an antenna, a battery, an operation switch, a microphone, or a speaker.

A miniaturized transistor can be provided. A transistor with low parasitic capacitance can be provided. A transistor with high frequency characteristics can be provided. A transistor with favorable electrical characteristics can be provided. A transistor with stable electrical characteristics can be provided. A transistor with low power consumption can be provided. A transistor with high reliability can be provided. A novel transistor can be provided. A semiconductor device including at least one of the transistors can be provided.

Note that the description of these effects does not disturb the existence of other effects. One embodiment of the present invention does not necessarily achieve all the effects listed above. Other effects are apparent from and can be derived from the description of the specification, the drawings, the claims, and the like.

BRIEF DESCRIPTION OF THE DRAWINGS

FIGS. 2A and 2B are a top view and a cross-sectional view illustrating a transistor of one embodiment of the present invention.

FIGS. 21A and 21B are a top view and a cross-sectional view illustrating a transistor of one embodiment of the present invention.

FIGS. 23A to 23D are Cs-corrected high-resolution TEM images of a plane of a CAAC-OS.

FIGS. 25A and 25B show electron diffraction patterns of a CAAC-OS.

FIGS. 45A1, 45A2, 45B1, and 45B2 illustrate examples of a pixel circuit.

FIGS. 47A and 47B illustrate examples of a display device.

DETAILED DESCRIPTION OF THE INVENTION

Figure 1A:
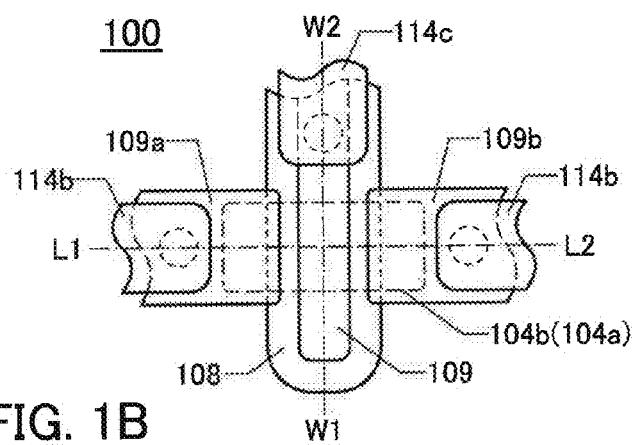
FIGS. 1A and 1B are a top view and a cross-sectional view illustrating a transistor of one embodiment of the present invention.

Embodiments are described in detail with reference to the drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated in some cases.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a layer, a resist mask, or the like might be unintentionally reduced in size by treatment such as etching, which is not illustrated in some cases for easy understanding.

In the drawings, some components might not be illustrated for easy understanding of the invention. In addition, some hidden lines and the like might not be shown.

Ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. A term with an ordinal number in this specification and the like might be provided with a different ordinal number in a claim. A term with an ordinal number in this specification and the like might not be provided with an ordinal number in a claim and the like.

In addition, in this specification and the like, a term such as an "electrode" or a "wiring" does not limit the function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, functions of a source and a drain might be switched depending on operation conditions, e.g., when a transistor having a different polarity is employed or the direction of current flow is changed in circuit operation. Therefore, it is difficult to define which is the source (or the drain). Thus, the terms "source" and "drain" can be used to denote the drain and the source, respectively.

In this specification and the like, an explicit description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used, there is a case in which no physical connection is made and a wiring is just extended in an actual circuit.

Note that the channel length refers to, for example, a distance between a source (source region or source electrode) and a drain (drain region or drain electrode) in a region where a semiconductor (or a portion where a current flows in a semiconductor when a transistor is on) and a gate electrode overlap with each other or a region where a channel is formed (also referred to as a "channel formation region") in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

The channel width refers to, for example, the length of a portion where a source and a drain face each other in a region where a semiconductor (or a portion where a current flows in a semiconductor when a transistor is on) and a gate electrode overlap with each other or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value, in a region where a channel is formed.

Note that depending on transistor structures, a channel width in a region where a channel is actually formed (also referred to as an "effective channel width") is different from a channel width shown in a top view of a transistor (also referred to as an "apparent channel width") in some cases. For example, in a transistor having a gate electrode covering a side surface of a semiconductor layer, an effective channel width is greater than an apparent channel width, and its influence cannot be ignored in some cases. For example, in a miniaturized transistor having a gate electrode covering a side surface of a semiconductor layer, the proportion of a channel region formed in the side surface of the semiconductor layer is increased in some cases. In that case, an effective channel width is greater than an apparent channel width.

In such a case, an effective channel width is difficult to measure in some cases. For example, estimation of an effective channel width from a design value requires an assumption that the shape of a semiconductor is known. Therefore, in the case where the shape of a semiconductor is not known accurately, it is difficult to measure an effective channel width accurately.

Therefore, in this specification, an apparent channel width is referred to as a "surrounded channel width (SCW)" in some cases. Furthermore, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by analyzing a cross-sectional TEM image and the like.

Note that in the case where field-effect mobility, a current value per channel width, and the like of a transistor are obtained by calculation, a surrounded channel width may be used for the calculation. In that case, the values may be different from those calculated using an effective channel width in some cases.

Note that impurities in a semiconductor refer to, for example, elements other than the main components of the semiconductor. For example, an element with a concentration of lower than 0.1 atomic % can be regarded as an impurity. When an impurity is contained, the density of states (DOS) in a semiconductor may be increased, the carrier mobility may be decreased, or the crystallinity may be decreased, for example. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components of the oxide semiconductor; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity that changes characteristics of the semiconductor include oxygen, Group 1 elements except hydrogen, Group 2 elements, Group 13 elements, and Group 15 elements.

In this specification, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. In addition, the term "perpendicular" or "orthogonal" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

In the specification and the like, the terms "identical", "the same", "equal", "uniform", and the like (including synonyms thereof) used in describing calculation values and actual measurement values allow for a margin of error of ±20% unless otherwise specified.

In this specification, in the case where an etching step is performed after a photolithography process, a resist mask formed in the photolithography process is removed after the etching step, unless otherwise specified.

In this specification and the like, a high power supply potential VDD (hereinafter also simply referred to as "VDD" or "H potential") is a power supply potential higher than a low power supply potential VSS. The low power supply potential VSS (hereinafter also simply referred to as "VSS" or "L potential") is a power supply potential lower than the high power supply potential VDD. In addition, a ground potential can be used as VDD or VSS. For example, in the case where a ground potential is used as VDD, VSS is lower than the ground potential, and in the case where a ground potential is used as VSS, VDD is higher than the ground potential.

Note that the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

In this specification, trigonal and rhombohedral crystal systems are included in a hexagonal crystal system.

Embodiment 1

In this embodiment, examples of a structure of a transistor 100 of one embodiment of the present invention are described with reference to drawings.

Figure 1B:
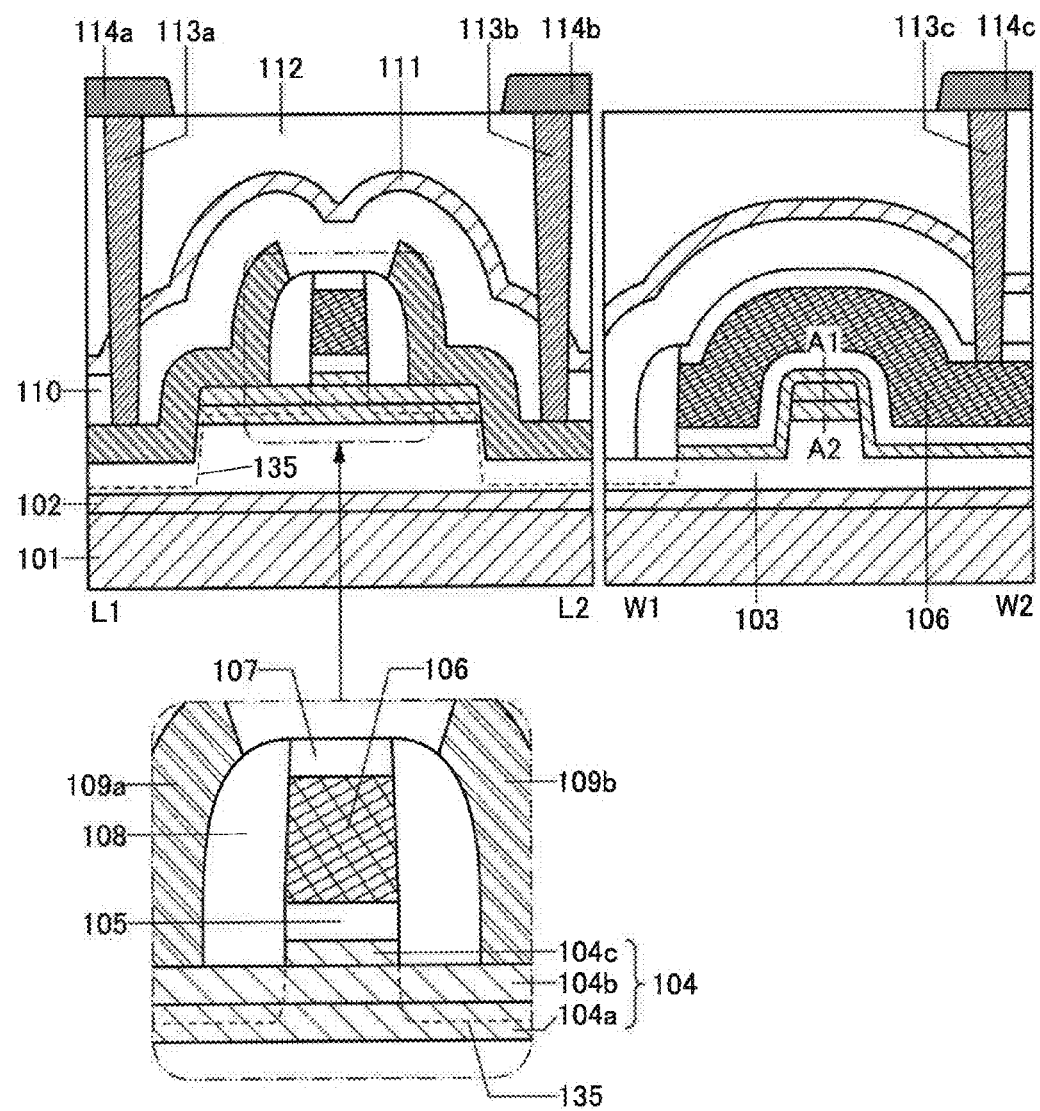

FIG. 1A illustrates a plan view of the transistor 100. FIG. 1B illustrates a cross-sectional view taken along dashed-dotted line L1-L2 and a cross-sectional view taken along dashed-dotted line W1-W2 in FIG. 1A. In FIG. 1B, the cross-sectional view along L1-L2 is taken in the channel length direction of the transistor 100 and the cross-sectional view along W1-W2 is taken in the channel width direction of the transistor 100.

The transistor 100 includes an oxide layer 104 (an oxide layer 104*a*, an oxide layer 104*b*, and an oxide layer 104*c*), an insulating layer 105, an electrode 106, an electrode 109*a*, an electrode 109*b*, and a structure body 108. The electrode 106 can function as a gate electrode. The insulating layer 105 can function as a gate insulating layer. The electrode 109*a* can function as one of a source electrode and a drain electrode. The electrode 109*b* can function as the other of the source electrode and the drain electrode. The transistor 100 is provided over a substrate 101 with an insulating layer 102 and an insulating layer 103 located therebetween.

In FIG. 1B, the insulating layer 102 is provided over the substrate 101. The insulating layer 103 is provided over the insulating layer 102. The insulating layer 103 has a projection. The oxide layers 104*a* and 104*b* that have island shapes are provided over the projection. The oxide layer 104*c* is provided over the oxide layer 104*b*. The insulating layer 105 is provided over the oxide layer 104*c*. The electrode 106 is provided over the oxide layer 104*b* with the oxide layer 104*c* and the insulating layer 105 provided therebetween. The structure body 108 is provided over the oxide layer 104*b* to be adjacent to side surfaces of the electrode 106.

The electrode 109*a* is provided over the oxide layer 104*b* to be in contact with part of the oxide layer 104*b*, and the electrode 109*b* is provided over the oxide layer 104*b* to be in contact with another part of the oxide layer 104*b*.

In the oxide layer 104, a metal element that is different from main components of the oxide layer 104 is contained in a region overlapping with the structure body 108 and a region overlapping with the electrodes 109a and 109b. The metal element may also be contained in each part of the insulating layer 105, the oxide layer 104, and the insulating layer 103. The regions containing the metal element are referred to as regions 135. The end portions of the regions 135 are indicated by dashed lines in FIG. 1B. In FIG. 1B, the regions 135 are formed above the dashed lines that indicate the end portions of the regions 135.

The regions 135 in the oxide layer 104 can serve as source and drain regions of the transistor 100. Thus, a region of the oxide layer 104 that is positioned between the regions 135 can serve as a channel formation region.

An insulating layer 107 is provided over the electrode 106. An insulating layer 110 is provided over the electrode 109a, the electrode 109b, the structure body 108, and the insulating layer 107. An insulating layer 111 is provided over the insulating layer 110. An insulating layer 112 is provided over the insulating layer 111.

An electrode 114a and an electrode 114b are provided over the insulating layer 112. The electrode 114a is electrically connected to the electrode 109a through a contact plug 113a in an opening provided in each part of the insulating layers 112, 111, and 110. The electrode 114b is electrically connected to the electrode 109b through a contact plug 113b in an opening provided in each part of the insulating layers 112, 111, and 110.

As illustrated in the cross-sectional view in the channel width direction of the transistor 100 of FIG. 1B, the electrode 106 covers the top surface and side surfaces of the oxide layer 104b. By the existence of the projection of the insulating layer 103, not only the top surface but also the side surfaces of the oxide layer 104b can be covered with the electrode 106. That is, the transistor 100 has a structure in which an electric field of the electrode 106 can electrically surround the oxide layer 104b (a structure of a transistor in which an electric field of a conductive film electrically surrounds a semiconductor is referred to as a surrounded channel (s-channel) structure). Therefore, a channel can be formed in the whole of the oxide layer 104b (bulk). In the s-channel structure, the drain current of the transistor (current that flows between the source and the drain of the transistor) is increased, so that a larger amount of on-state current (current that flows between the source and the drain when the transistor is on) can be obtained. Furthermore, the entire channel formation region of the oxide layer 104b can be depleted by the electric field of the electrode 106. Accordingly, the off-state current (current that flows between the source and the drain when the transistor is off) of the transistor with an s-channel structure can be further reduced. When the channel width is shortened, the effects of the s-channel structure, such as an increase in on-state current and a reduction in off-state current, can be enhanced.

[Oxide Layer 104]

The oxide layer 104 has a structure in which the oxide layer 104a, the oxide layer 104b, and the oxide layer 104c are stacked.

For the oxide layer 104, an oxide semiconductor containing, for example, indium (In) is preferably used. The oxide semiconductor has a high carrier mobility (electron mobility) when containing, for example, indium. In addition, the semiconductor preferably contains an element M.

The element M is preferably aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M The element M is an element having a high bonding energy with oxygen, for example. The element M is an element that can increase the energy gap of the oxide semiconductor, for example. Furthermore, an oxide semiconductor preferably contains zinc. When the oxide semiconductor contains zinc, the oxide semiconductor is easily crystallized in some cases.

Note that the oxide layer 104 is not limited to the oxide containing indium. The oxide layer 104 may be, for example, an oxide that does not contain indium and contains zinc, an oxide that does not contain indium and contains gallium, or an oxide that does not contain indium and contains tin, e.g., a zinc tin oxide, a gallium tin oxide, or a gallium oxide.

For the oxide layer 104, an oxide semiconductor with a wide energy gap may be used. For example, the energy gap of the oxide semiconductor used for the oxide layer 104 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide semiconductor can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. By using the PECVD method, a high-quality film can be formed at a relatively low temperature. By using a deposition method that does not use plasma for deposition, such as the MOCVD method, the ALD method, or the thermal CVD method, a film can be formed with few defects because damage is not easily caused on a surface on which the film is deposited.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors or semiconductor devices can be manufactured with improved productivity.

For example, in the case where an In—Ga—Zn—O film is formed by a thermal CVD method as the oxide layer 104, trimethylindium ($In(CH_3)_3$), trimethylgallium ($Ga(CH_3)_3$), and dimethylzinc ($Zn(CH_3)_2$) are used. Without limitation to the above combination, triethylgallium ($Ga(C_2H_5)_3$) can be used instead of trimethylgallium, and diethylzinc ($Zn(C_2H_5)_2$) can be used instead of dimethylzinc.

For example, in the case where an In—Ga—Zn—O film is formed as the oxide layer 104 by the ALD method, an $In(CH_3)_3$ gas and an $O_3$ gas are sequentially introduced a plurality of times to form an In—O layer, a $Ga(CH_3)_3$ gas and an $O_3$ gas are sequentially introduced a plurality of times to form a GaO layer, and then a $Zn(CH_3)_2$ gas and an $O_3$ gas are sequentially introduced a plurality of times to form a ZnO layer. Note that the order of these layers is not limited to this example. A mixed compound layer such as an In—Ga—O layer, an In—Zn—O layer, or a Ga—Zn—O layer may be formed by using these gases. Note that although an $H_2O$ gas that is obtained by bubbling water with an inert gas such as Ar may be used instead of an $O_3$ gas, it is preferable to use an $O_3$ gas, which does not contain H. Instead of an $In(CH_3)_3$ gas, an $In(C_2H_5)_3$ gas or tris(acetylacetonato)indium may be used. Note that tris(acetylacetonato)indium is also referred to as $In(acac)_3$. Instead of a $Ga(CH_3)_3$ gas, a $Ga(C_2H_5)_3$ gas or tris(acetylacetonato)gallium may be used. Note that tris(acetylacetonato)gallium is also referred to as $Ga(acac)_3$. Furthermore, a $Zn(CH_3)_2$ gas or zinc acetate may be used. However, the deposition gas is not limited to these.

In the case where the oxide layer is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor is formed by a sputtering method, the atomic ratio of In to M and Zn contained in the target may be 3:1:1, 3:1:2, 3:1:4, 1:1:0.5, 1:1:1, 1:1:2, 1:4:4, or 4:2:4.1, for example.

When the oxide semiconductor is formed by a sputtering method, an oxide semiconductor having an atomic ratio different from the atomic ratio of the target may be deposited. Especially for zinc, the atomic ratio of zinc in the deposited film is smaller than the atomic ratio of the target in some cases. Specifically, the film has an atomic ratio of zinc of 40 atomic % to 90 atomic % of the atomic ratio of zinc in the target.

The oxide layers 104a and 104c are preferably formed using a material including one or more kinds of metal elements, other than oxygen, included in the oxide layer 104b. With the use of such a material, interface states at interfaces between the oxide layers 104a and 104b and between the oxide layers 104c and 104b are less likely to be generated. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

The thicknesses of the oxide layers 104a and 104c are each greater than or equal to 3 nm and less than or equal to 100 nm, preferably greater than or equal to 3 nm and less than or equal to 50 nm. The thickness of the oxide layer 104b is greater than or equal to 3 nm and less than or equal to 200 nm, preferably greater than or equal to 3 nm and less than or equal to 100 nm, further preferably greater than or equal to 3 nm and less than or equal to 50 nm.

When the oxide layer 104b is an In-M-Zn oxide containing In, the element M, and Zn at an atomic ratio of $x_2:y_2:z_2$ and each of the oxide layers 104a and 104c is an In-M-Zn oxide containing In, M, and Zn at an atomic ratio of $x_1:y_1:z_1$, $y_1/x_1$ needs to be larger than $y_2/x_2$. Preferably, the oxide layers 104a, 104c, and 104b in which $y_1/x_1$ is 1.5 or more times as large as $y_2/x_2$ are selected. Still further preferably, the oxide layers 104a, 104c, and 104b in which $y_1/x_1$ is 2 or more times as large as $y_2/x_2$ are selected. Still further preferably, the oxide layers 104a, 104c, and 104b in which $y_1/x_1$ is 3 or more times as large as $y_2/x_2$ are selected. In the oxide layer 104b at this time, $y_1$ is preferably larger than or equal to $x_1$ because the transistor can have stable electrical characteristics. However, when $y_1$ is three or more times as large as $x_1$, the field-effect mobility of the transistor is reduced; accordingly, $y_1$ is preferably smaller than three times $x_1$. When the oxide layers 104a and 104c each have the above structure, each of the oxide layers 104a and 104c can be a layer in which oxygen vacancy is less likely to occur than in the oxide layer 104b.

In the case of using an In-M-Zn oxide as the oxide layer 104a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the oxide layer 104b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the oxide layer 104c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the oxide layer 104c and the oxide layer 104a may be formed using the same type of oxide.

For example, an In—Ga—Zn oxide that is formed using a target having an atomic ratio of In:Ga:Zn=1:3:2, 1:3:4, 1:3:6, 1:6:4, or 1:9:6 or an In—Ga oxide that is formed using a target having an atomic ratio of In:Ga=1:9 or 7:93 can be used for each of the oxide layers 104a and 104c containing In or Ga. Furthermore, an In—Ga—Zn oxide that is formed using a target having an atomic ratio of In:Ga:Zn=1:1:1 or 3:1:2 can be used for the oxide layer 104b. Note that the atomic ratio of each of the oxide layers 104a, 104b, and 104c may vary within a range of ±20% of the corresponding atomic ratio as an error.

For the oxide layer 104b, an oxide having an electron affinity higher than that of each of the oxide layers 104a and 104c is used. For example, for the oxide layer 104b, an oxide having an electron affinity higher than that of each of the oxide layers 104a and 104c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the oxide layer 104c preferably includes an indium gallium oxide. The gallium atomic ratio [Ga/(In+Ga)] is, for example, higher than or equal to 70%, preferably higher than or equal to 80%, more preferably higher than or equal to 90%.

Note that the oxide layer 104a and/or the oxide layer 104c may be gallium oxide. For example, when gallium oxide is used for the oxide layer 104c, a leakage current generated between an electrode 105a and the electrode 109 or between an electrode 105b and the electrode 109 can be reduced. In other words, the off-state current of the transistor 100 can be reduced.

The oxide layers 104a and 104c each have a smaller electron affinity than the oxide layer 104b and thus is close to an insulator than the oxide layer 104b. Thus, when a gate voltage is applied, a channel is most likely to be formed in the oxide layer 104b among the oxide layers 104a, 104b, and 104c.

In order to give stable electrical characteristics to a transistor in which an oxide semiconductor layer is used as a semiconductor layer where a channel is formed (also referred to as "OS transistor"), it is preferable that impurities and oxygen vacancies in the oxide semiconductor layer be reduced to highly purify the oxide semiconductor layer so that the oxide layer 104b can be regarded as an intrinsic or substantially intrinsic oxide semiconductor layer. Furthermore, it is preferable that at least the channel formation region of the oxide layer 104b be regarded as an intrinsic or substantially intrinsic oxide semiconductor layer.

At least for the oxide layer 104b in the oxide layer 104, CAAC-OS is preferably used.

In at least an oxide semiconductor layer used for the oxide layer 104b, a region that is not CAAC (also referred to as an atomic void (AV)) is preferably less than 20% of the oxide semiconductor layer.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor layer where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor layer, an increase in S value due to miniaturization is less likely to occur.

Moreover, since the dielectric constant in the a-axis direction and the b-axis direction of an CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics such as a decrease in threshold voltage is caused. The more transistor is miniaturized, the more deterioration in electrical characteristics caused by the phenomena is likely to occur.

[Energy Band Structure of Oxide Semiconductor Layer]

Figure 3A:
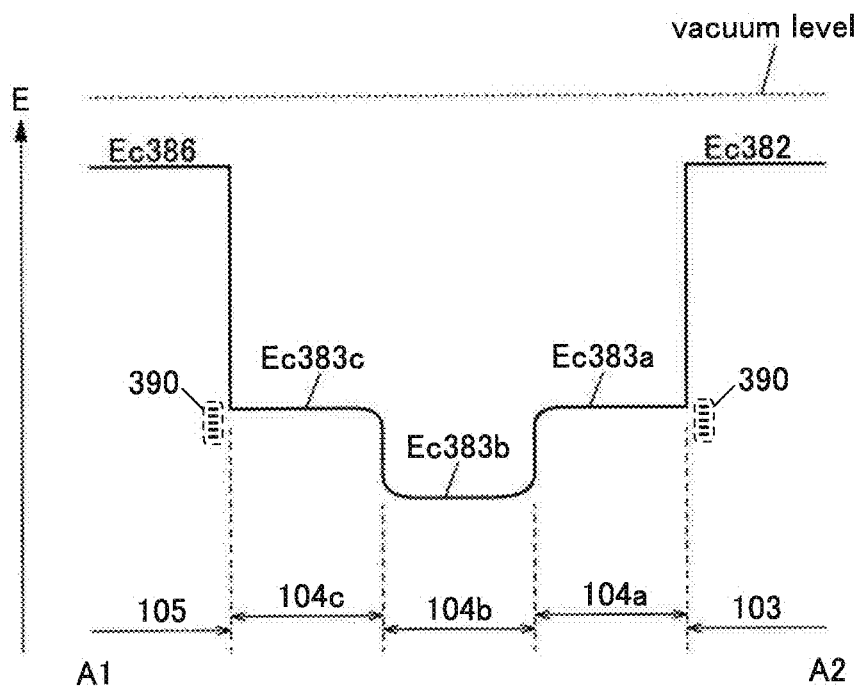
FIGS. 3A and 3B show energy band structures.

A function and an effect of the oxide layer 104 consisting of the oxide layers 104a, 104b, and 104c are described using an energy band structure diagram of FIG. 3A. FIG. 3A illustrates the energy band structure of a portion along dashed dotted line A1-A2 in FIG. 1B. In other words, FIG. 3A illustrates the energy band structure of a channel formation region of the transistor 100.

In FIG. 3A, Ec382, Ec383a, Ec383b, Ec383c, and Ec386 indicate the energy of the conduction band minimum of the insulating layer 103, the oxide layer 104a, the oxide layer 104b, the oxide layer 104c, and the insulating layer 105, respectively.

Here, an electron affinity corresponds to a value obtained by subtracting an energy gap from a difference in energy between the vacuum level and the valence band maximum (the difference is also referred to as "ionization potential"). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulating layers 103 and 105 are insulators, Ec382 and Ec386 are closer to the vacuum level than (each have a smaller electron affinity than) Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Here, a mixed region of the oxide layers 104a and 104b might exist between the oxide layers 104a and 104b. A mixed region of the oxide layers 104b and 104c might exist between the oxide layers 104b and 104c. The mixed region has a low density of interface states. For that reason, the stack including the oxide layers 104a, 104b, and 104c has a band structure where energy at each interface and in the vicinity of the interface is changed continuously (continuous junction).

At this time, electrons move mainly in the oxide layer 104b, not in the oxide layers 104a and 104c. As described above, when the interface state density at the interface between the oxide layers 104a and 104b and the interface state density at the interface between the oxide layers 104b and 104c are decreased, electron movement in the oxide layer 104b is less likely to be inhibited and the on-sate current of the transistor 100 can be increased.

Although trap states 390 due to impurities or defects might be formed at or near the interface between the oxide layer 104a and the insulating layer 103 and at or near the interface between the oxide layer 104c and the insulating layer 105, the oxide layer 104b can be separated from the trap states owing to the existence of the oxide layers 104a and 104c.

In the case where the transistor 100 has an s-channel structure, a channel is formed in the whole of the oxide layer 104b. Therefore, as the oxide layer 104b has a larger thickness, a channel region becomes larger. In other words, the thicker the oxide layer 104b is, the larger the on-state current of the transistor 100 is. For example, the oxide layer 104b has a region with a thickness of greater than or equal to 20 nm, preferably greater than or equal to 40 nm, more preferably greater than or equal to 60 nm, still more preferably greater than or equal to 100 nm. Note that the oxide layer 104b has a region with a thickness of, for example, less than or equal to 300 nm, preferably less than or equal to 200 nm, more preferably less than or equal to 150 nm, otherwise the productivity of a semiconductor device including the transistor 100 might be decreased.

Moreover, the thickness of the oxide layer 104c is preferably as small as possible to increase the on-state current of the transistor 100. For example, the oxide layer 104c has a region with a thickness of less than 10 nm, preferably less than or equal to 5 nm, more preferably less than or equal to 3 nm. Meanwhile, the oxide layer 104c has a function of blocking entry of elements other than oxygen (such as hydrogen and silicon) included in the adjacent insulator into the oxide layer 104b where a channel is formed. For this reason, it is preferable that the oxide layer 104c have a certain thickness. For example, the oxide layer 104c may have a region with a thickness of greater than or equal to 0.3 nm, preferably greater than or equal to 1 nm, more preferably greater than or equal to 2 nm. The oxide layer 104c preferably has an oxygen blocking property to suppress outward diffusion of oxygen released from the insulating layer 103 and the like.

To improve reliability, preferably, the thickness of the oxide layer 104a is large and the thickness of the oxide layer 104c is small. For example, the oxide layer 104a has a region with a thickness of greater than or equal to 10 nm, preferably greater than or equal to 20 nm, more preferably greater than or equal to 40 nm, still more preferably greater than or equal to 60 nm. When the thickness of the oxide layer 104a is made large, the distance from an interface between the adjacent insulator and the oxide layer 104a to the oxide layer 104b in which a channel is formed can be large. However, to prevent the productivity of the semiconductor device including the transistor 100 from being decreased, the oxide layer 104a has a region with a thickness of, for example, less than or equal to 200 nm, preferably less than or equal to 120 nm, more preferably less than or equal to 80 nm.

Note that silicon contained in the oxide semiconductor might serve as a carrier trap or a carrier generation source. Therefore, the silicon concentration of the oxide layer 104b is preferably as low as possible. For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ that is measured by secondary ion mass spectrometry (SIMS) is provided between the oxide layers 104b and 104a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ that is measured by SIMS is provided between the oxide layers 104b and 104c.

It is preferable to reduce the concentration of hydrogen in the oxide layers 104a and 104c in order to reduce the concentration of hydrogen in the oxide layer 104b. The oxide layers 104a and 104c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the oxide layers 104a and 104c in order to reduce the concentration of nitrogen in the oxide layer 104b. The oxide layers 104a and 104c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the oxide layer 104b is preferably as low as possible. For example, the oxide layer 104b preferably has a region in which the copper concentration is lower than or equal to $1\times10^{19}$ atoms/cm$^3$, lower than or equal to $5\times10^{18}$ atoms/cm$^3$, or lower than or equal to $1\times10^{18}$ atoms/cm$^3$.

The above three-layer structure is an example. For example, a two-layer structure without the oxide layer 104a or the oxide layer 104c may be employed. A four-layer structure in which any one of the semiconductors described as examples of the oxide layer 104a, the oxide layer 104b, and the oxide layer 104c is provided under or over the oxide layer 104a or under or over the oxide layer 104c may be employed. An n-layer structure (n is an integer of 5 or more) in which any one of the semiconductors described as examples of the oxide layer 104a, the oxide layer 104b, and the oxide layer 104c is provided at two or more of the following positions: over the oxide layer 104a, under the oxide layer 104a, over the oxide layer 104c, and under the oxide layer 104c may be employed.

In the transistor 100 described in this embodiment, in the channel width direction, the top surface and side surfaces of the oxide layer 104b are in contact with the oxide layer 104c, and the bottom surface of the oxide layer 104b is in contact with the oxide layer 104a (see FIG. 1B). Surrounding the oxide layer 104b with the oxide layers 104a and 104c in this manner can further reduce the influence of the trap states.

The band gap of each of the oxide layers 104a and 104c is preferably wider than that of the oxide layer 104b.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor layer in which a channel is formed has an extremely low off-state current. Specifically, the off-state current per micrometer in channel width at room temperature (25° C.) and at a source-drain voltage of 3.5 V can be lower than $1 \times 10^{-20}$ A, lower than $1 \times 10^{-22}$ A, or lower than $1 \times 10^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device with low power consumption can be provided.

Modification Example 1

FIGS. 2A and 2B illustrate a transistor 150 in which the oxide layer 104 includes the oxide layers 104b and 104c but does not include the oxide layer 104a. FIG. 2B illustrates a cross-sectional view taken along dashed-dotted line L1-L2 and a cross-sectional view taken along dashed-dotted line W1-W2 in FIG. 2A. The transistor 150 has the same structure as the transistor 100 except for the components of the oxide layer 104.

Figure 3B:
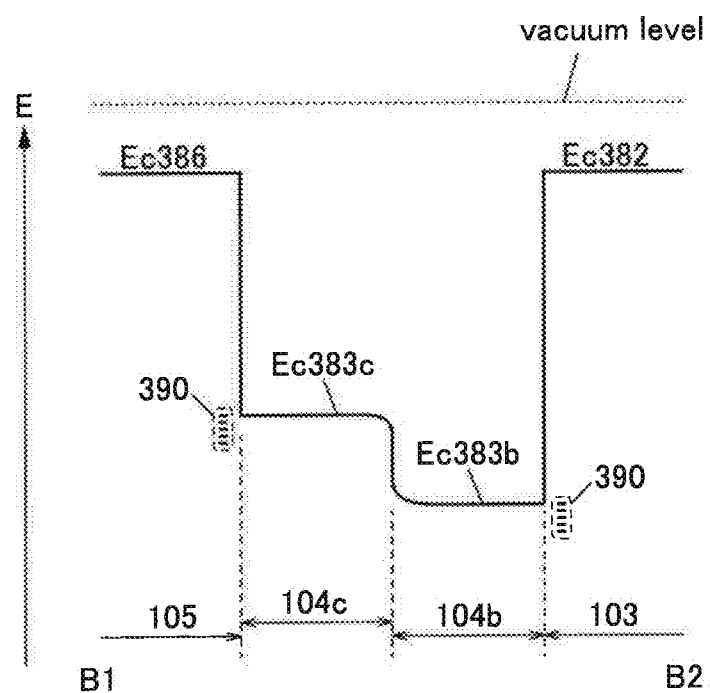

FIG. 3B illustrates the energy band structure of a portion along dashed dotted line B1-B2 in FIG. 2B. In other words, FIG. 3B illustrates the energy band structure of a channel formation region of the transistor 150. Since the oxide layer 104a is not provided, the transistor 150 is easily affected by the trap states 390 but can have higher field-effect mobility than a transistor including only the oxide layer 104b and not including the oxide layer 104c.

Modification Example 2

Figure 4A:
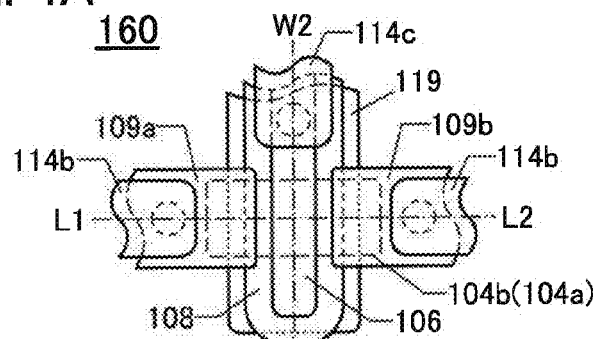
FIGS. 4A to 4C are a top view and cross-sectional views illustrating a transistor of one embodiment of the present invention.
Figure 4B:
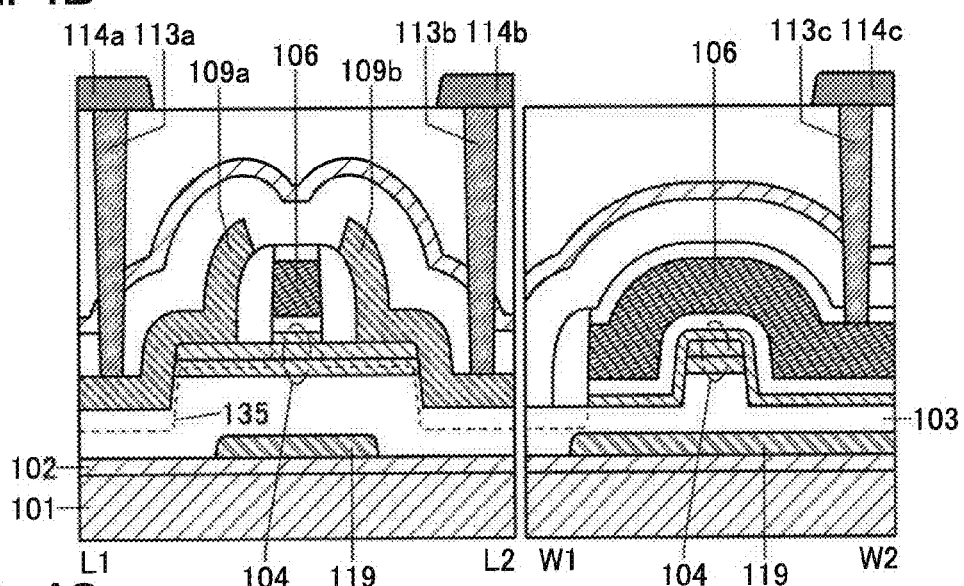
Figure 4C:
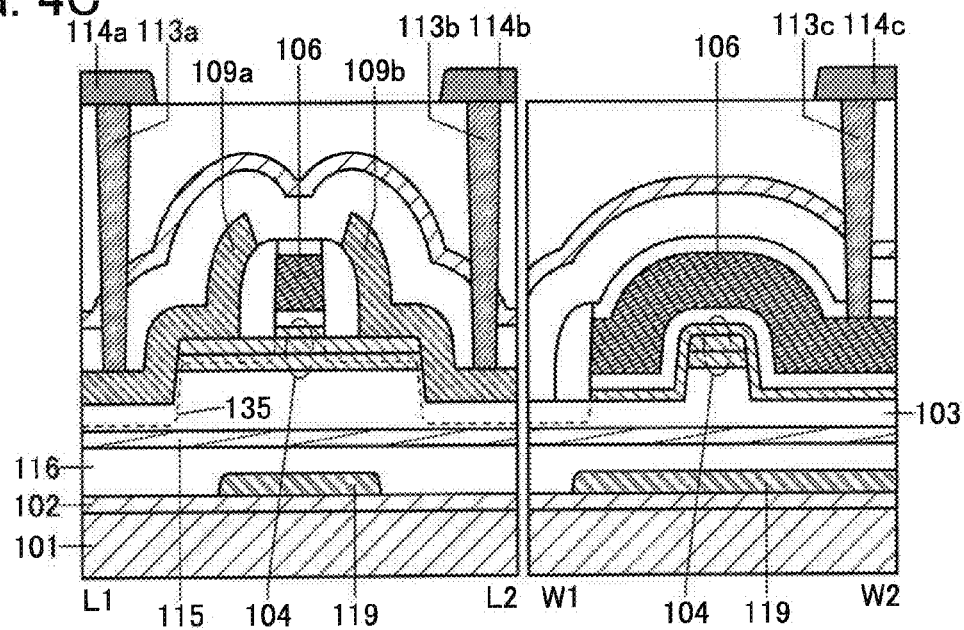

A transistor 160 illustrated in FIGS. 4A to 4C differs from the transistor 100 in that it includes an electrode 119 that functions as a back gate electrode between the insulating layers 102 and 103. FIG. 4A illustrates a plan view of the transistor 160. FIG. 4B illustrates a cross-sectional view taken along dashed-dotted line L1-L2 and a cross-sectional view taken along dashed-dotted line W1-W2 in FIG. 4A. The electrode 119 can be formed using a material and a method that are similar to those of the electrode 105a.

In general, the back gate electrode is formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a ground potential (GND potential) or a predetermined potential. By changing the potential of the back gate electrode independently of the potential of the gate electrode, the threshold voltage of the transistor can be changed.

The electrodes 106 and 119 can each function as a gate electrode. Thus, the insulating layers 103 and 105 can each function as a gate insulating layer.

In the case where one of the electrodes 106 and 119 is referred to as a "gate electrode", the other is referred to as a "back gate electrode". For example, in the transistor 160, in the case where the electrode 106 is referred to as a "gate electrode", the electrode 119 is referred to as a "back gate electrode". In the case where the electrode 119 is used as a "gate electrode", the transistor 160 is a form of bottom-gate transistor. Alternatively, one of the electrodes 106 and 119 may be referred to as a "first gate electrode", and the other may be referred to as a "second gate electrode".

By providing the electrodes 106 and 119 so that the oxide layer 104 is located therebetween, and by setting the potentials of the electrodes 106 and 119 to be the same, a region of the oxide layer 104 through which carriers flow is enlarged in the film thickness direction; thus, the number of transferred carriers is increased. As a result, the on-state current and the field-effect mobility of the transistor 160 are increased.

Therefore, the transistor 160 has large on-state current for its area. That is, the area occupied by the transistor 160 can be small for required on-state current. Therefore, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrodes 106 and 119 each have a function of blocking an electric field from an outside, charges of charged particles and the like generated over the electrode 106 and under the electrode 119 do not influence the channel formation region of the oxide layer 104. Thus, degradation due to a stress test (e.g., a negative gate bias temperature (−GBT) stress test in which negative charges are applied to a gate) can be reduced. In addition, the electrodes 106 and 119 can block an electric field generated from the drain electrode so as not to affect the semiconductor layer. Thus, changes in the rising voltage of on-state current due to changes in drain voltage can be suppressed. Note that this effect is significant when a potential is applied to the electrodes 106 and 119.

The BT stress test is one kind of accelerated test and can evaluate, in a short time, change in characteristics (a change over time) of transistors, which is caused by long-term use. In particular, the amount of change in threshold voltage of a transistor in the BT stress test is an important indicator when examining the reliability of the transistor. If the amount of change in the threshold voltage in the BT stress test is small, the transistor has high reliability.

By providing the electrodes 106 and 119 and setting the potentials of the electrodes 106 and 119 to be the same, the amount of change in the threshold voltage is reduced. Accordingly, variation in electrical characteristics among a plurality of transistors is also reduced.

The transistor including the back gate electrode has a smaller amount of change in threshold voltage in a +GBT stress test in which positive charges are applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Therefore, photodegradation of the semiconductor layer can be prevented and deterioration in electrical characteristics of the transistor, such as a shift of the threshold voltage, can be prevented.

For example, as illustrated in FIG. 4C, an insulating layer 116 may be formed over the electrode 119, an insulating layer 115 may be formed over the insulating layer 116, and the insulating layer 103 may be formed over the insulating layer 115. The insulating layers 116 and 115 can be formed using a material and a method that are similar to those of the insulating layer 103.

Note that when the insulating layer 115 is formed using hafnium oxide, aluminum oxide, tantalum oxide, aluminum silicate, or the like, the insulating layer 115 can function as a charge trap layer. The threshold voltage of the transistor can be changed by injecting electrons into the insulating layer 115. For example, the injection of electrons into the insulating layer 115 can be performed with the use of the tunnel effect. By applying a positive voltage to the electrode 119, tunnel electrons can be injected into the insulating layer 115.

Modification Example 3

Figure 5A:
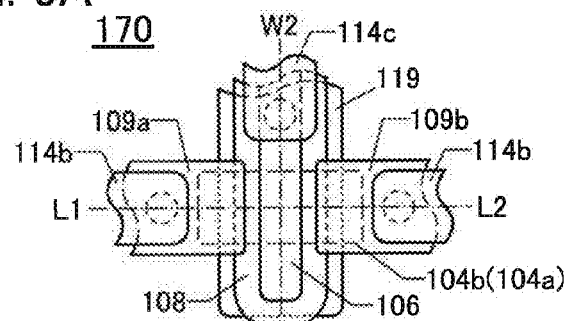
FIGS. 5A to 5C are a top view and cross-sectional views illustrating a transistor of one embodiment of the present invention.
Figure 5B:
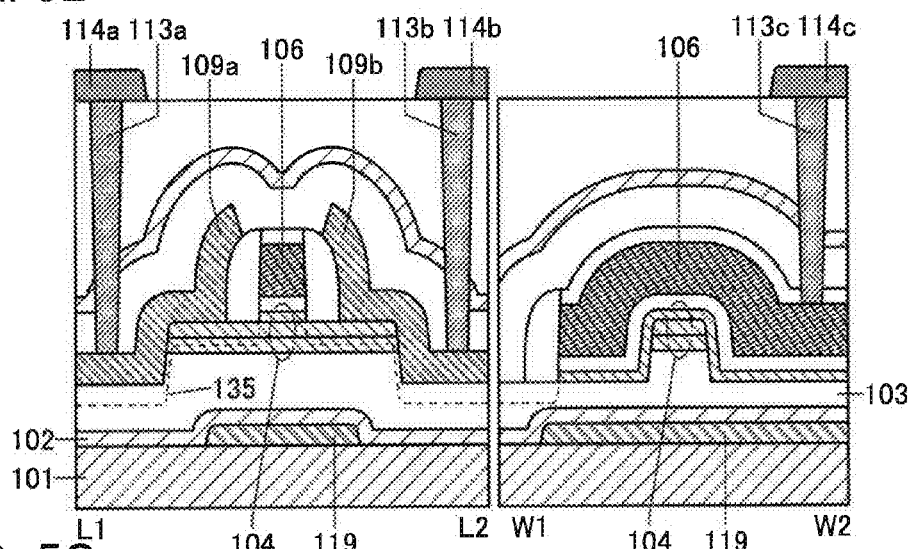
Figure 5C:
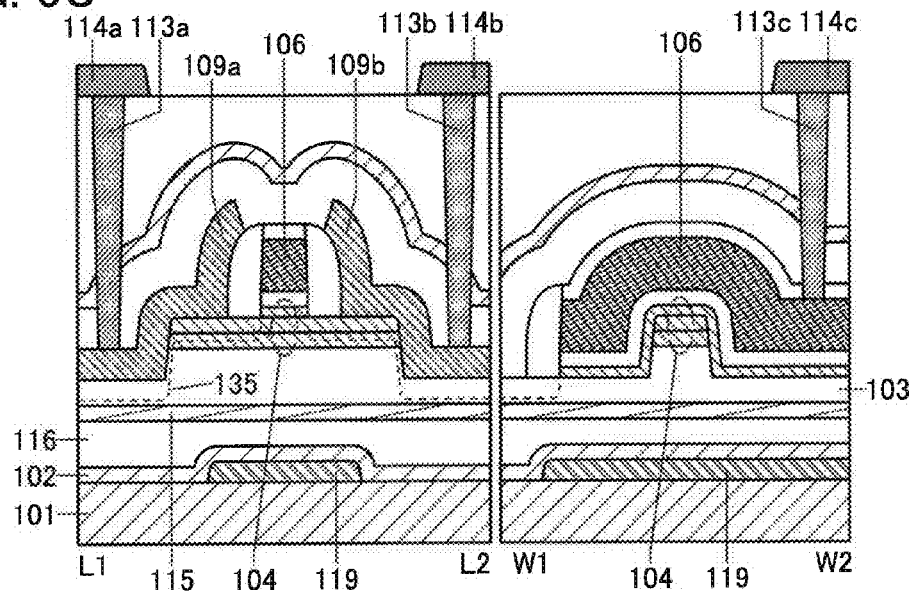

The electrode 119 may be provided between the substrate 101 and the insulating layer 102, as in a transistor 170 illustrated in FIGS. 5A to 5C. FIG. 5A illustrates a plan view of the transistor 170. FIG. 5B illustrates a cross-sectional view taken along dashed-dotted line L1-L2 and a cross-sectional view taken along dashed-dotted line W1-W2 in FIG. 5A.

When the electrode 119 is provided between the substrate 101 and the insulating layer 102, the insulating layer 102 can also serve as a gate insulating layer.

Furthermore, for example, as illustrated in FIG. 5C, the insulating layers 102 and 116 may be formed over the electrode 119, the insulating layer 115 may be formed over the insulating layer 116, and the insulating layer 103 may be the insulating layer 115.

Modification Example 4

Figure 6A:
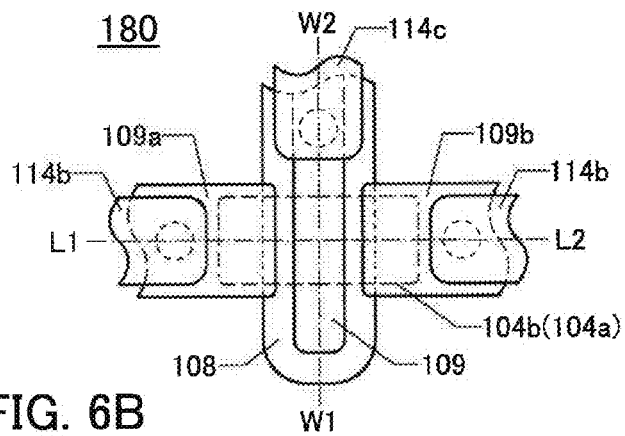
FIGS. 6A and 6B are a top view and a cross-sectional view illustrating a transistor of one embodiment of the present invention.
Figure 6B:
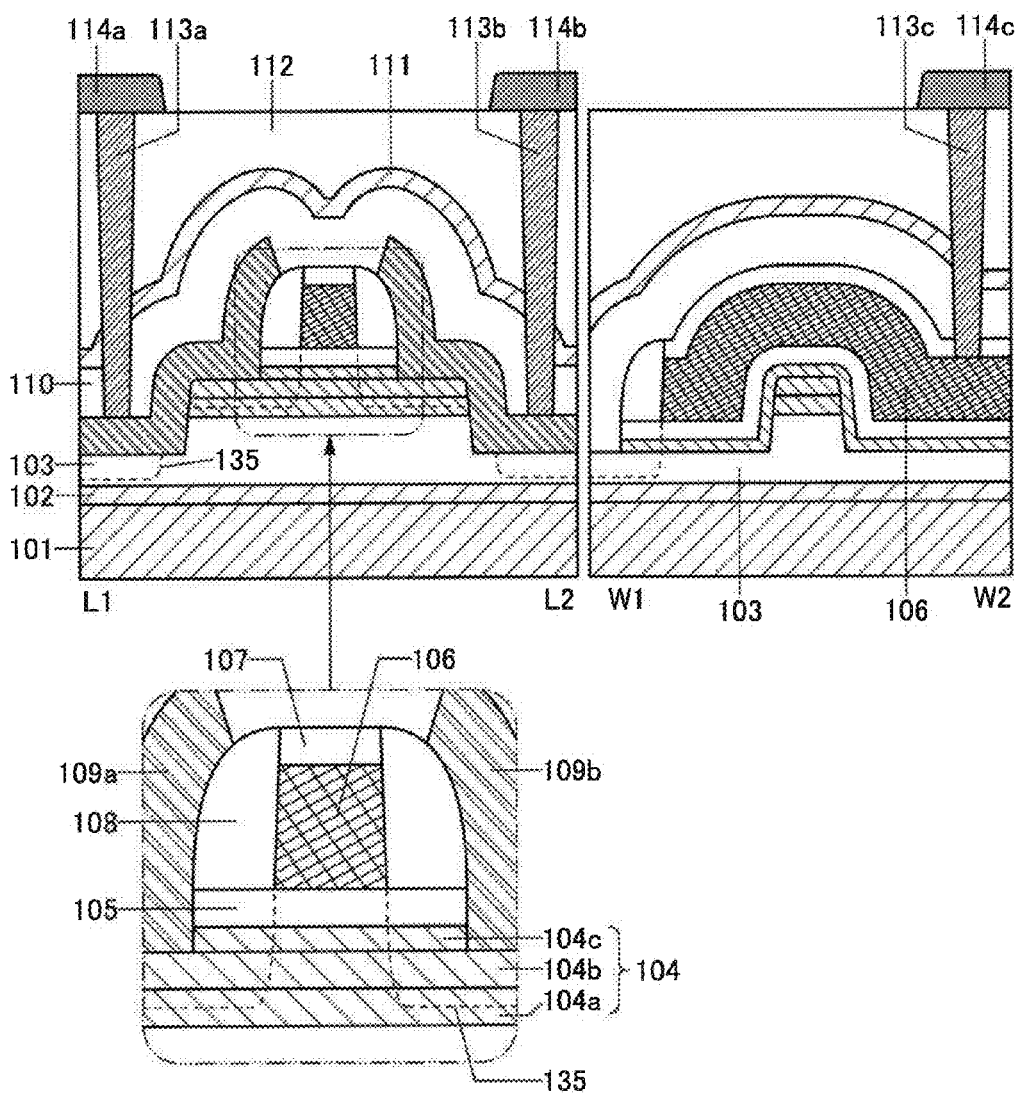

As illustrated in a transistor 180 of FIGS. 6A and 6B, the insulating layer 105 and the oxide layer 104c may be provided not only in a region overlapping with the electrode 106 but also in a region overlapping with the structure body 108. FIG. 6A is a plan view of the transistor 180. FIG. 6B is a cross-sectional view taken along the dashed-dotted line L1-L2 and the dashed-dotted line W 1-W2 in FIG. 6A. Furthermore, the electrode 119 that can serve as a back gate electrode may be provided below the oxide layer 104 with an insulating layer or insulating layers provided therebetween.

Modification Example 5

Figure 7A:
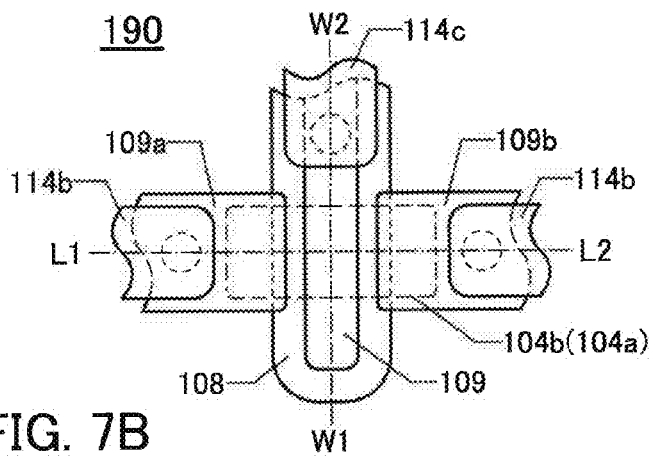
FIGS. 7A and 7B are a top view and a cross-sectional view illustrating a transistor of one embodiment of the present invention.
Figure 7B:
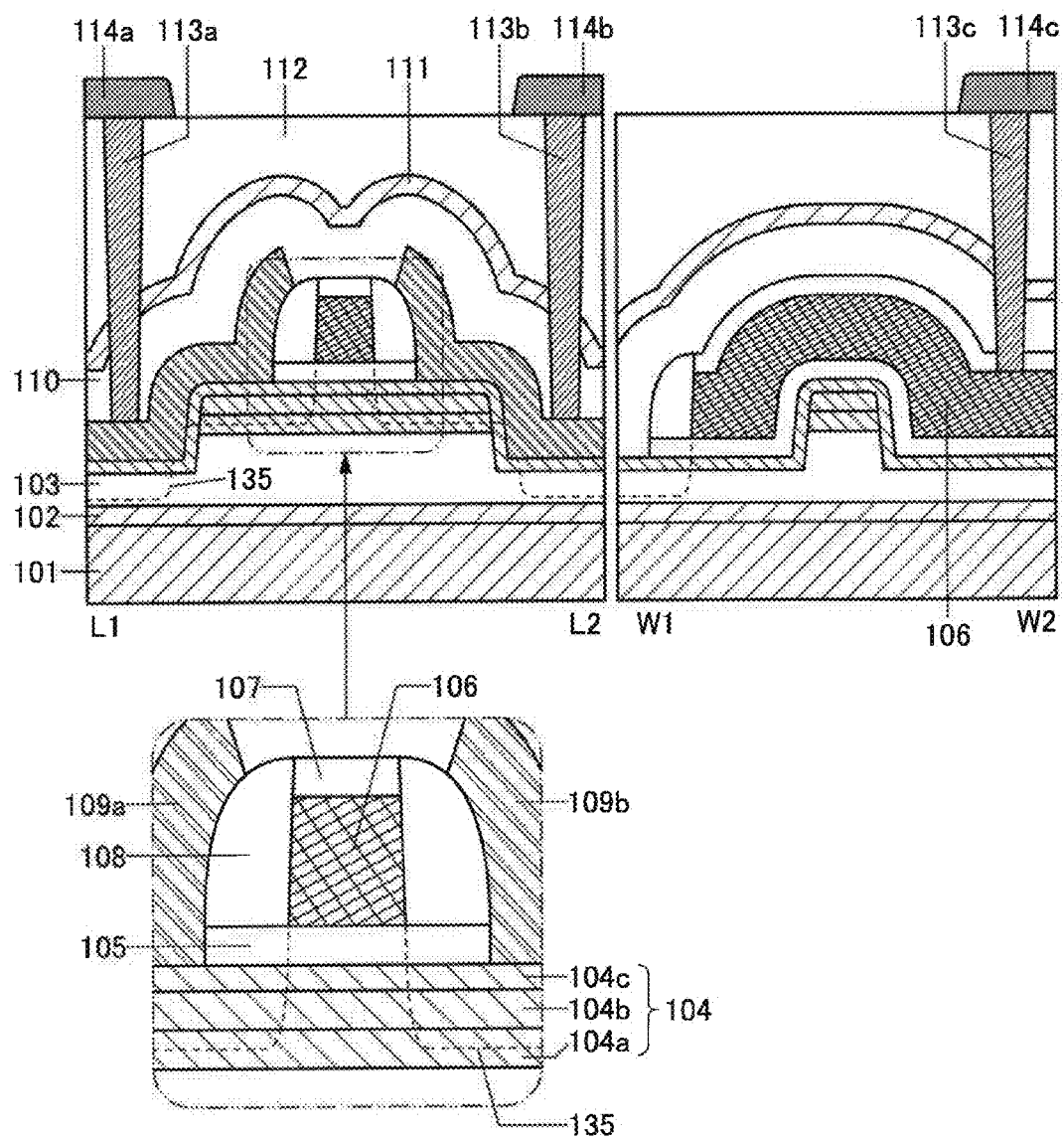

As illustrated in a transistor 190 of FIGS. 7A and 7B, a region of the insulating layer 105 that does not overlap with the electrode 106 or the structure body 108 may be etched to expose the oxide layer 104c, and the oxide layer 104c may remain over the entire transistor 190. FIG. 7A is a plan view of the transistor 190. FIG. 7B is a cross-sectional view taken along the dashed-dotted line L1-L2 and the dashed-dotted line W1-W2 in FIG. 7A. Furthermore, the electrode 119 that can serve as a back gate electrode may be provided below the oxide layer 104 with an insulating layer provided therebetween.

Modification Example 6

Figure 8A:
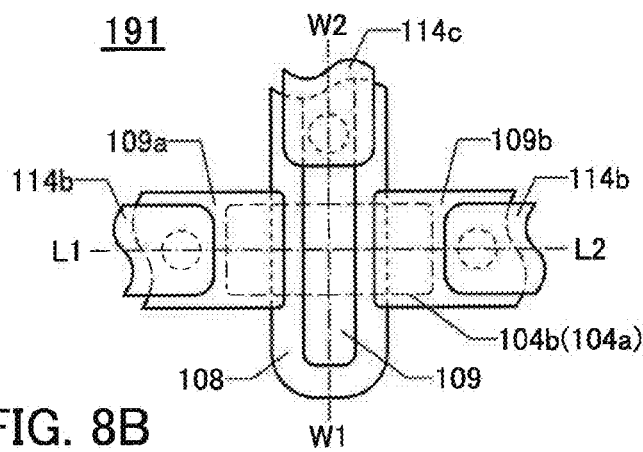
FIGS. 8A and 8B are a top view and a cross-sectional view illustrating a transistor of one embodiment of the present invention.
Figure 8B:
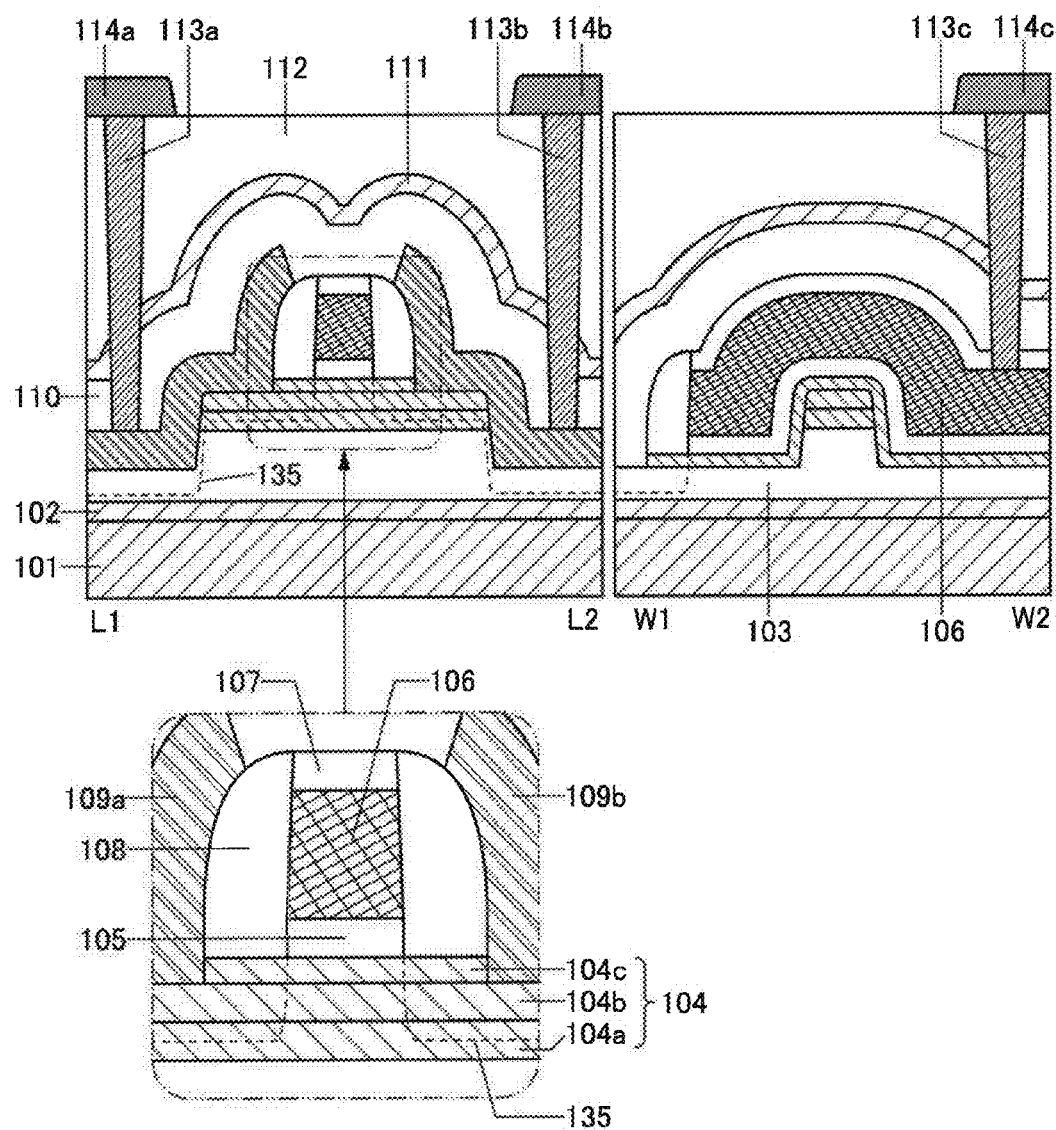

As illustrated in a transistor 191 of FIGS. 8A and 8B, a region of the insulating layer 105 that overlaps with the structure body 108 may be removed, so that the structure body 108 is in contact with the oxide layer 104c. FIG. 8A is a plan view of the transistor 191. FIG. 8B is a cross-sectional view taken along the dashed-dotted line L1-L2 and the dashed-dotted line W1-W2 in FIG. 8A. Furthermore, the electrode 119 that can serve as a back gate electrode may be provided below the oxide layer 104 with an insulating layer provided therebetween.

Modification Example 7

Figure 9A:
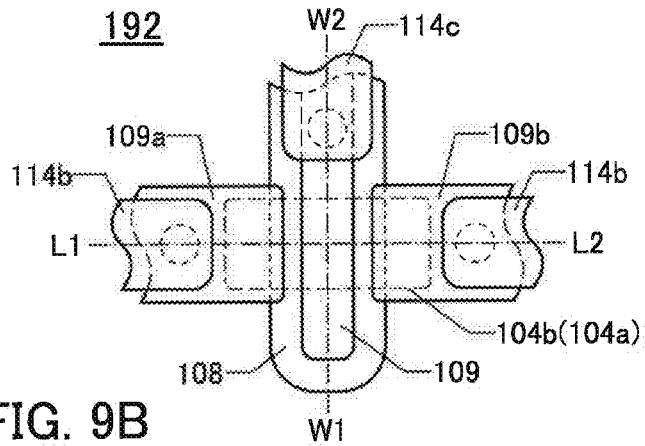
FIGS. 9A and 9B are a top view and a cross-sectional view illustrating a transistor of one embodiment of the present invention.
Figure 9B:
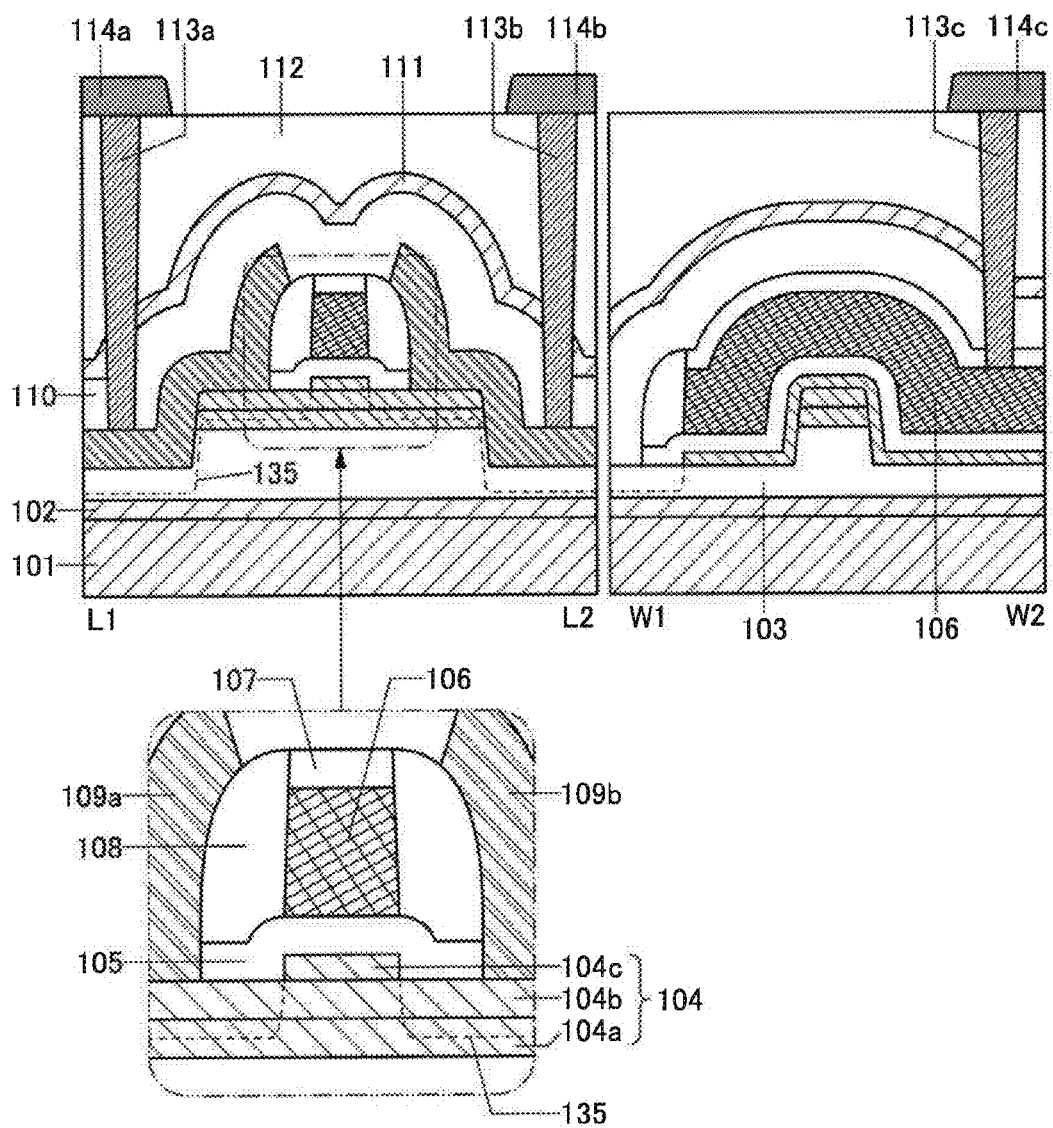

As illustrated in a transistor 192 of FIGS. 9A and 9B, the oxide layer 104c overlapping with the electrode 106 may be covered with the insulating layer 105. FIG. 9A is a plan view of the transistor 192. FIG. 9B is a cross-sectional view taken along the dashed-dotted line L1-L2 and the dashed-dotted line W1-W2 in FIG. 9A. Furthermore, the electrode 119 that can serve as a back gate electrode may be provided below the oxide layer 104 with an insulating layer provided therebetween.

Modification Example 8

Figure 10A:
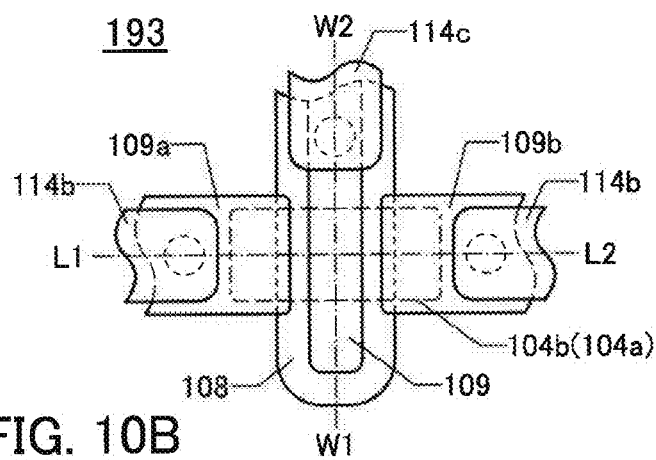
FIGS. 10A and 10B are a top view and a cross-sectional view illustrating a transistor of one embodiment of the present invention.
Figure 10B:
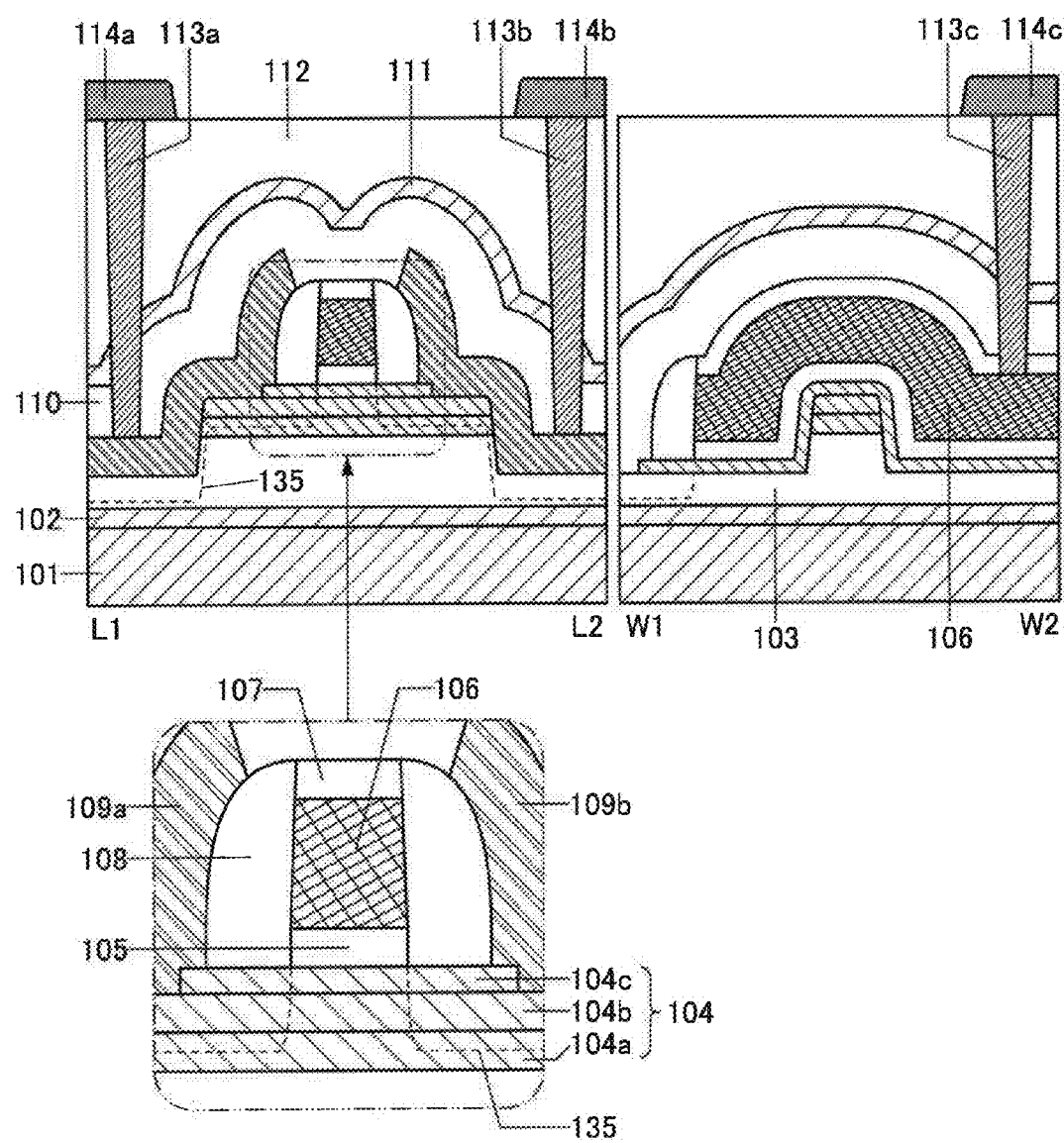

As illustrated in a transistor 193 of FIGS. 10A and 10B, the oxide layer 104c may extend beyond an end portion of the structure body 108. FIG. 10A is a plan view of the transistor 193. FIG. 10B is a cross-sectional view taken along the dashed-dotted line L1-L2 and the dashed-dotted line W1-W2 in FIG. 10A. Furthermore, the electrode 119 that can serve as a back gate electrode may be provided below the oxide layer 104 with an insulating layer provided therebetween.

Modification Example 9

Figure 11A:
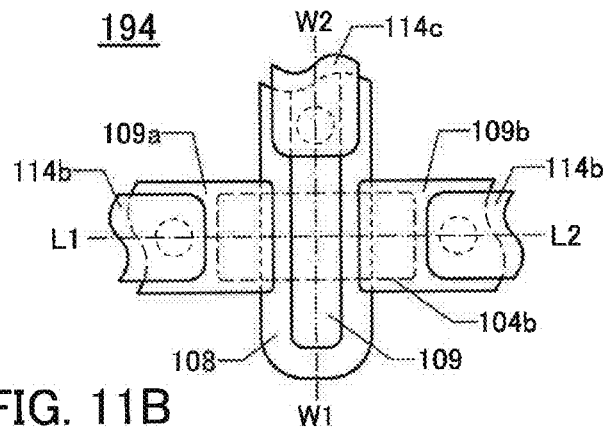
FIGS. 11A and 11B are a top view and a cross-sectional view illustrating a transistor of one embodiment of the present invention.
Figure 11B:
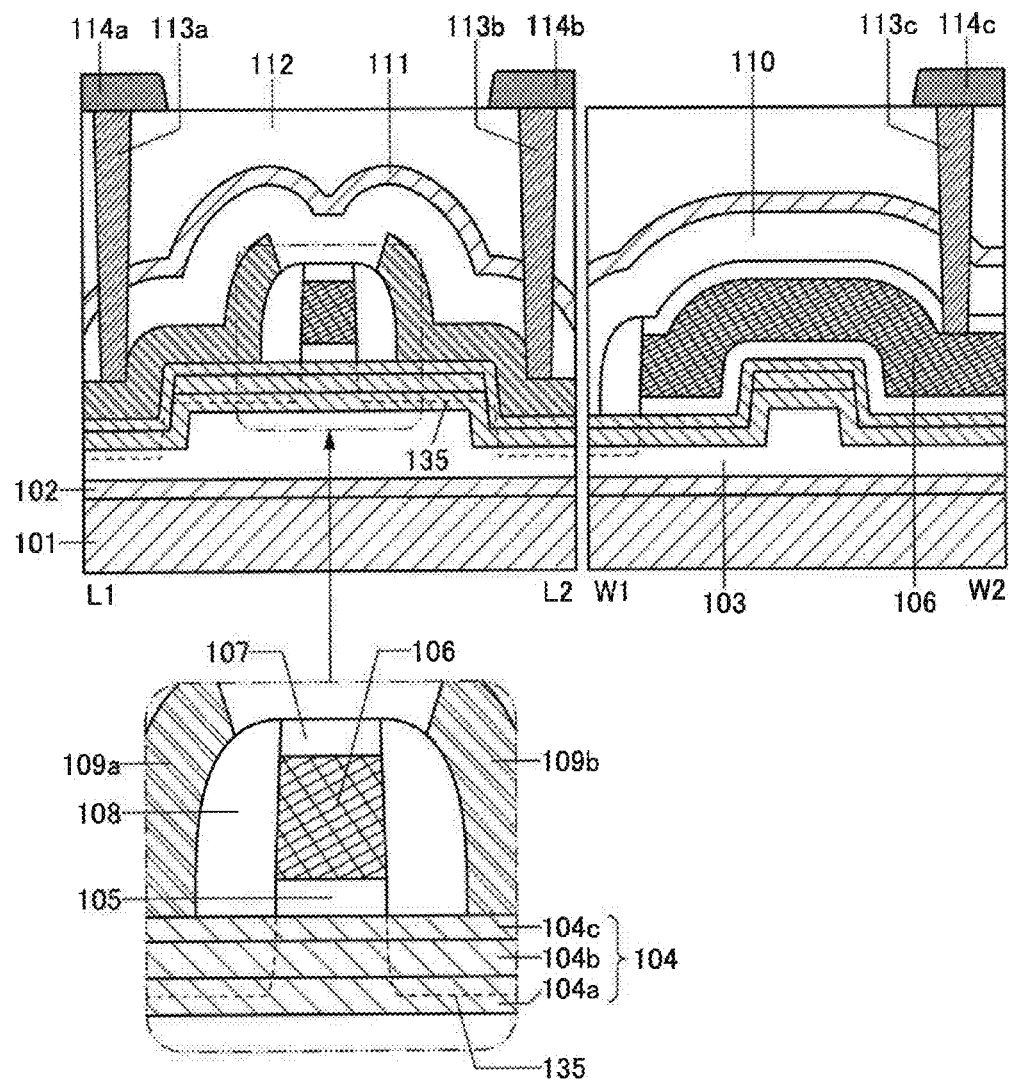

As illustrated in a transistor 194 of FIGS. 11A and 11B, the oxide layer 104a and the oxide layer 104c may extend beyond an end portion of the structure body 108. FIG. 11A is a plan view of the transistor 194. FIG. 11B is a cross-sectional view taken along the dashed-dotted line L1-L2 and the dashed-dotted line W1-W2 in FIG. 11A.

Figure 12A:
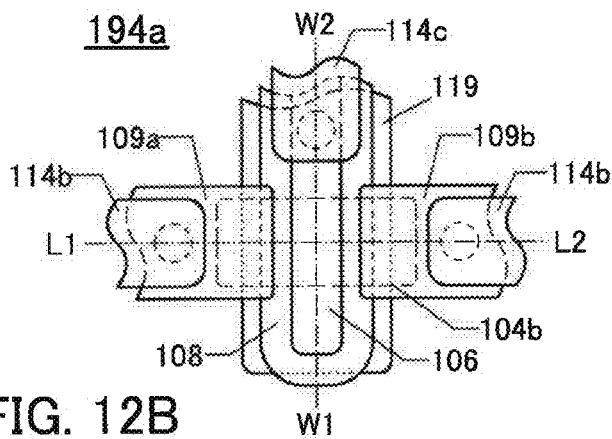
FIGS. 12A and 12B are a top view and a cross-sectional view illustrating a transistor of one embodiment of the present invention.
Figure 12B:
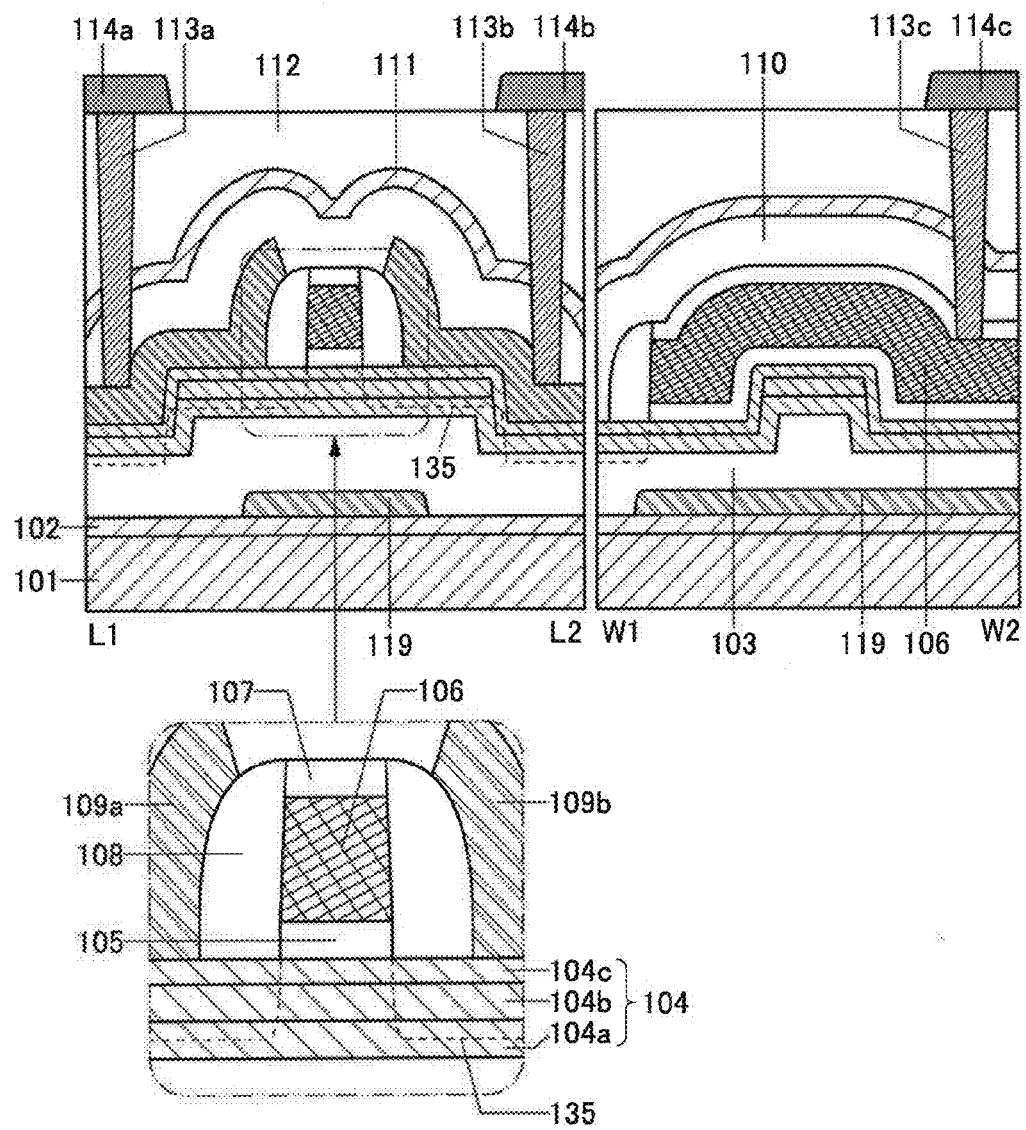

Furthermore, the electrode 119 that can serve as a back gate electrode may be provided below the oxide layer 104 in the transistor 194 as illustrated in a transistor 194a of FIGS. 12A and 12B. The electrode 119 may be provided over the substrate 101 or the insulating layer 102.

Modification Example 10

Figure 13A:
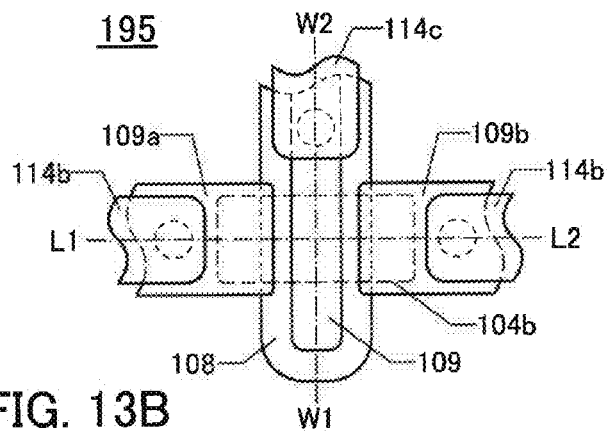
FIGS. 13A and 13B are a top view and a cross-sectional view illustrating a transistor of one embodiment of the present invention.
Figure 13B:
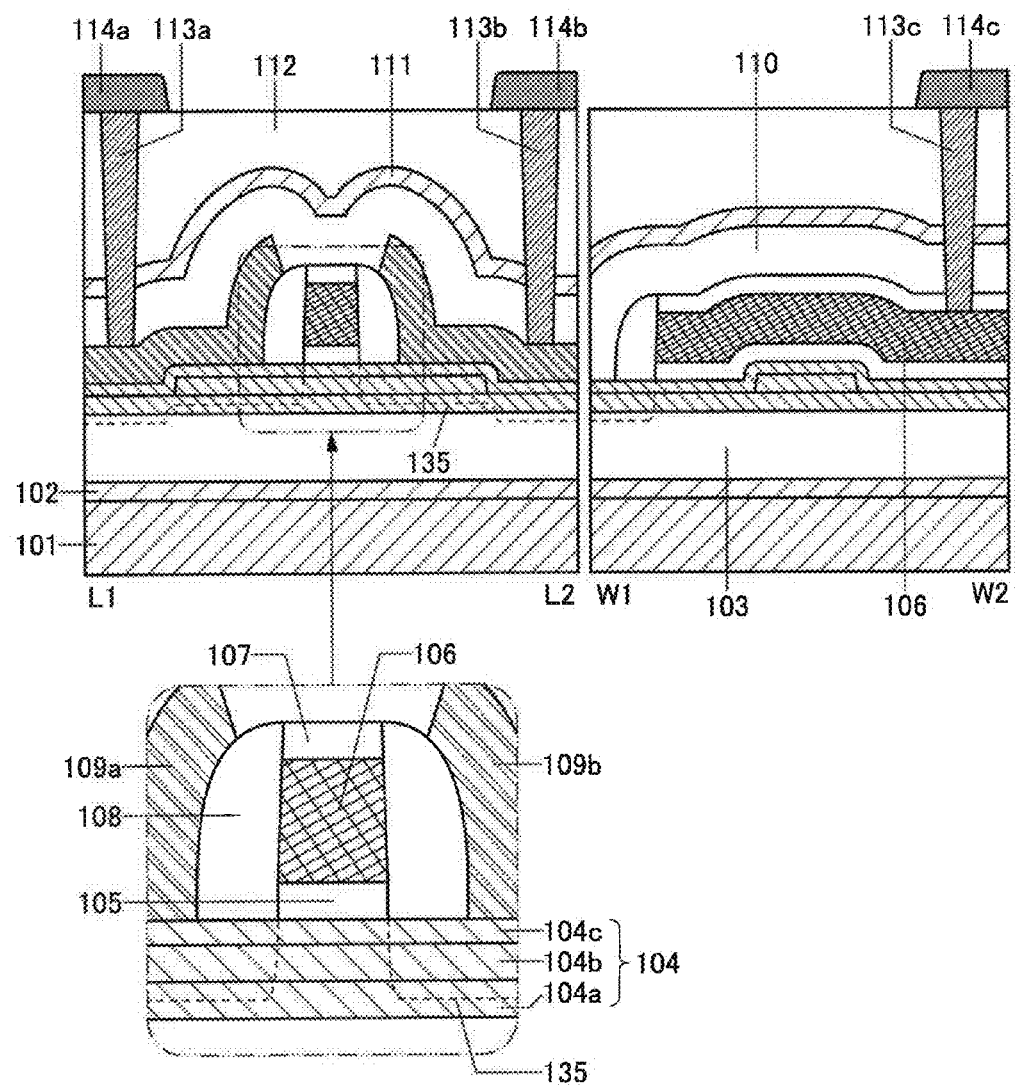

As illustrated in a transistor 195 of FIGS. 13A and 13B, the oxide layers 104a and 104c may extend beyond an end portion of the structure body 108 without a projection of the insulating layer 103. FIG. 13A is a plan view of the transistor 194. FIG. 13B is a cross-sectional view taken along the dashed-dotted line L1-L2 and the dashed-dotted line W1-W2 in FIG. 13A. Furthermore, the electrode 119 that can serve as a back gate electrode may be provided below the oxide layer 104 with an insulating layer provided therebetween.

Figure 14A:
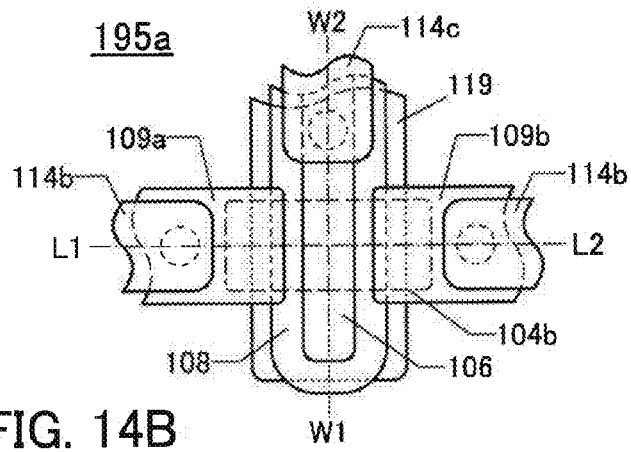
FIGS. 14A and 14B are a top view and a cross-sectional view illustrating a transistor of one embodiment of the present invention.
Figure 14B:
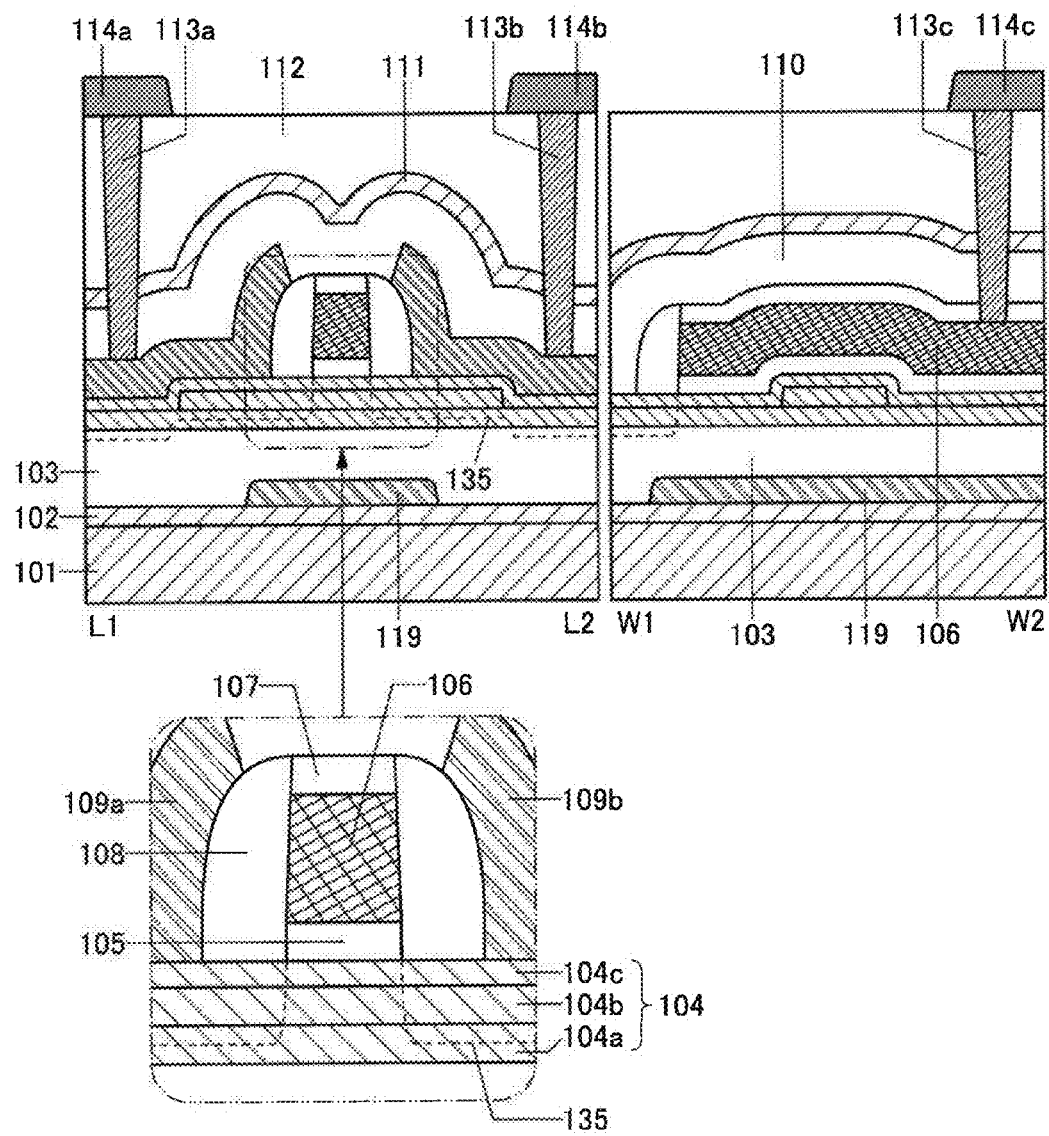

Furthermore, the electrode 119 that can serve as a back gate electrode may be provided below the oxide layer 104 in the transistor 195 as illustrated in a transistor 195a of FIGS. 14A and 14B. The electrode 119 may be provided over the substrate 101 or the insulating layer 102.

In this embodiment, one embodiment of the present invention has been described. Other embodiments of the present invention are described in the other embodiments. Note that one embodiment of the present invention is not limited to these embodiments. That is, since various embodiments of the present invention are disclosed in this embodiment and the other embodiments, one embodiment of the present invention is not limited to a specific embodiment. For example, an example in which a channel formation region, source and drain regions, and the like of a transistor such as the transistor 100 include an oxide semiconductor is described as one embodiment of the present invention; however, one embodiment of the present invention is not limited to this example. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in an appropriate combination with any of the structures described in the other embodiments.

Embodiment 2

In this embodiment, an example of a manufacturing method of the transistor 100 is described with reference to drawings. The cross sections L1-L2 in FIGS. 15A to 15D, FIGS. 16A to 16C, FIGS. 17A to 17C, FIGS. 18A to 18C, FIG. 19, and FIGS. 20A and 20B each correspond to the cross section taken along the dashed-dotted line L1-L2 in FIG. 1A. The cross sections W1-W2 in FIGS. 15A to 15D, FIGS. 16A to 16C, FIGS. 17A to 17C, FIGS. 18A to 18C, FIG. 19, and FIGS. 20A and 20B each correspond to the cross section taken along the dashed-dotted line W1-W2 in FIG. 1A.

Figure 15A:
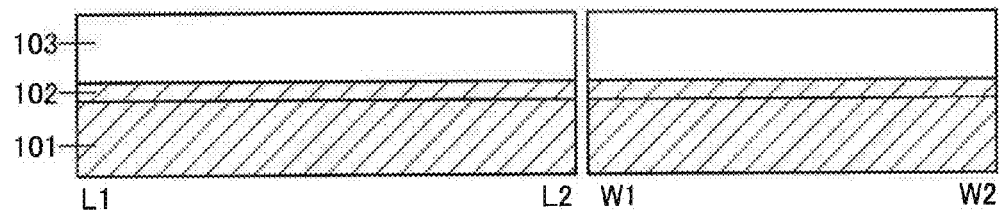
FIGS. 15A to 15D illustrate an example of a method for manufacturing a transistor of one embodiment of the present invention.

First, the insulating layer 102 is formed over the substrate 101, and the insulating layer 103 is formed over the insulating layer 102 (see FIG. 15A).

There is no particular limitation on a material used as the substrate 101 as long as the material has heat resistance high enough to withstand at least heat treatment performed later. For example, a glass substrate of barium borosilicate glass, aluminosilicate glass, or the like, a ceramic substrate, a quartz substrate, a sapphire substrate, or the like can be used.

A single crystal semiconductor substrate or a polycrystalline semiconductor substrate made of silicon, silicon carbide, or the like or a compound semiconductor substrate made of silicon germanium or the like may be used as the substrate 101. Alternatively, an SOI substrate, a semiconductor substrate on which a semiconductor element such as a strained transistor or a FIN-type transistor is provided, or the like can also be used. Alternatively, gallium arsenide, aluminum gallium arsenide, indium gallium arsenide, gallium nitride, indium phosphide, silicon germanium, or the like that can be used for a high-electron-mobility transistor (HEMT) may be used. The substrate 101 is not limited to a simple supporting substrate, and may be a substrate where a device such as a transistor is formed; in this case, at least one of the gate, the source, and the drain of the transistor 100 may be electrically connected to the device.

Note that a flexible substrate may also be used as the substrate 101. In the case where a flexible substrate is used, the transistor, a capacitor, or the like may be directly formed over the flexible substrate; or the transistor, the capacitor, or the like may be formed over a manufacturing substrate and then separated from the manufacturing substrate and transferred onto the flexible substrate. To separate and transfer the transistor, the capacitor, or the like from the manufacturing substrate to the flexible substrate, a separation layer may be provided between the manufacturing substrate and the transistor, the capacitor, or the like.

For the flexible substrate, for example, metal, an alloy, resin, glass, or fiber thereof can be used. The flexible substrate used as the substrate 101 preferably has a lower coefficient of linear expansion because deformation due to an environment is suppressed. The flexible substrate used as the substrate 101 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and an acrylic-based resin. In particular, aramid is preferably used for the flexible substrate because of its low coefficient of linear expansion.

The insulating layer 102 can be formed with a single layer or a stack of layers of one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. Alternatively, a material in which two or more materials selected from an oxide material, a nitride material, an oxynitride material, and a nitride oxide material are mixed may be used.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

It is particularly preferable that the insulating layer 102 be formed using an insulating material that is relatively impermeable to impurities. The insulating layer 102 may each be formed to have, for example, a single-layer structure or a stacked-layer structure including an insulating material containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Examples of such an insulating material that is relatively impermeable to impurities include aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, tantalum oxide, and silicon nitride. The insulating layer 102 may be formed using indium tin zinc oxide (In—Sn—Zn oxide) having an excellent insulating property or the like.

When the insulating material that is relatively impermeable to impurities is used for the insulating layer 102, impurity diffusion from the substrate 101 side can be suppressed, and the reliability of the transistor can be improved. When the insulating material that is relatively impermeable to impurities is used for the insulating layer 110, impurity diffusion from the insulating layer 111 side can be suppressed, and the reliability of the transistor can be improved.

Note that a plurality of stacked insulating layers formed with these materials may be used as each of the insulating layer 102. The formation method of the insulating layer 102 is not particularly limited, and a sputtering method, a CVD method, an MBE method, a PLD method, an ALD method, a spin coating method, or the like can be used. The thickness of each of the insulating layers 102 and 110 is greater than or equal to 10 nm and less than or equal to 500 nm, preferably greater than or equal to 50 nm and less than or equal to 300 nm.

For example, in the case where an aluminum oxide film is formed as the insulating layer 102 by a thermal CVD method, two kinds of gases, e.g., $H_2O$ as an oxidizer and a source material gas that is obtained by vaporizing a solvent and liquid containing an aluminum precursor compound (e.g., trimethylaluminum (TMA)) are used. Note that the chemical formula of TMA is $Al(CH_3)_3$. Examples of another material liquid include tris(dimethylamide)aluminum, tri-isobutylaluminum, and aluminum tris(2,2,6,6-tetramethyl-3,5-heptanedionate).

The insulating layer 103 can be formed using a material and a method that are similar to those of the insulating layer 102. The hydrogen concentration in the insulating layer 103 is preferably low in order to prevent an increase in the hydrogen concentration in the oxide layer 104. Specifically, the hydrogen concentration in the insulating layer 103, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. Furthermore, the nitrogen concentration in the insulating layer 103 is preferably low in order to prevent an increase in the nitrogen concentration in the oxide semiconductor. Specifically, the nitrogen concentration in the insulating layer 103, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The insulating layer 103 are each preferably formed using an insulating layer from which oxygen is released by heating (also referred to as an "insulating layer containing excess oxygen"). Specifically, it is preferable to use an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis.

The insulating layer containing excess oxygen can be formed by performing treatment for adding oxygen to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification, the treatment for adding oxygen is also referred to as "oxygen doping treatment".

The thickness of the insulating layer 103 may be greater than or equal to 10 nm and less than or equal to 500 nm, and is preferably greater than or equal to 50 nm and less than or equal to 300 nm.

In this embodiment, a glass substrate is used as the substrate 101. Aluminum oxide is used for the insulating layer 102. Silicon oxynitride containing excess oxygen is used for the insulating layer 103.

Figure 15B:
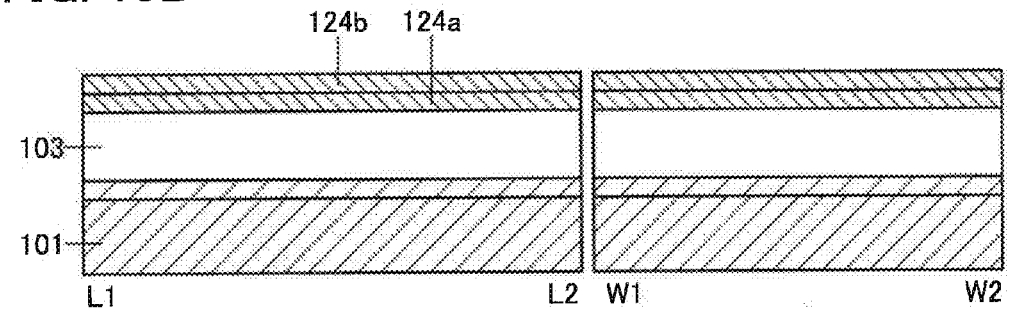
Figure 15C:
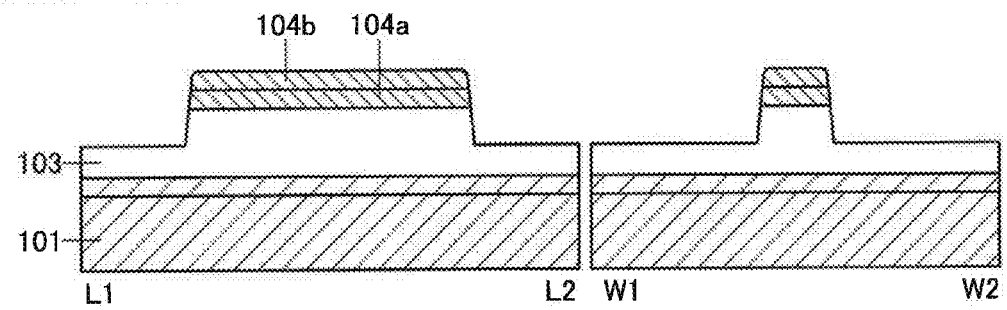
Figure 15D:
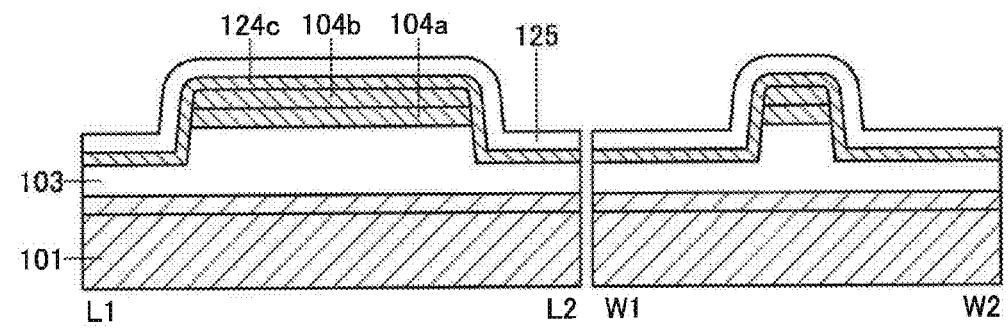

Next, an oxide layer 124a and an oxide layer 124b are formed over the insulating layer 103 (see FIG. 15B). First, the oxide layer 124a is formed over the insulating layer 103, and then, the oxide layer 124b is formed over the oxide layer 124a.

In this embodiment, as the oxide layer 124a, a CAAC-OS containing In, Ga, and Zn is formed by a sputtering method using a target with an atomic ratio of In:Ga:Zn=1:3:4. As the oxide layer 124b, a CAAC-OS containing In, Ga, and Zn is formed using a target with an atomic ratio of In: Ga:Zn=1:1:1. Note that after the oxide layer 124a is formed, oxygen doping treatment may be performed. After the oxide layer 124b is formed, oxygen doping treatment may be performed.

Next, heat treatment is preferably performed to reduce impurities such as moisture and hydrogen contained in the oxide layers 124a and 124b and to purify the oxide layers 124a and 124b.

For example, the oxide layers 124a and 124b are subjected to heat treatment in a reduced-pressure atmosphere, an inert gas atmosphere of nitrogen, a rare gas, or the like, an oxidizing gas atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidizing gas atmosphere refers to an atmosphere containing an oxidizing gas such as oxygen, ozone, or nitrogen oxide at 10 ppm or higher. The inert gas atmosphere refers to an atmosphere that contains the oxidizing gas at lower than 10 ppm and is filled with nitrogen or a rare gas.

By the heat treatment, at the same time as the release of the impurities, oxygen contained in the insulating layer 103 is diffused to the oxide layers 124a and 124b and oxygen vacancies in the oxide layers 124a and 124b can be reduced. Note that the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate for desorbed oxygen. The heat treatment may be performed at any time after the oxide layers 124a and 124b are formed. For example, the heat treatment may be performed after the formation of the oxide layers 104a and 104b. For another example, the heat treatment may be performed after the formation of the oxide layer 104c that is performed later.

There is no particular limitation on a heat treatment apparatus used for the heat treatment, and the apparatus may be provided with a device for heating an object to be processed by heat conduction or heat radiation from a heating element such as a resistance heating element. For example, an electric furnace, or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

The heat treatment may be performed at a temperature higher than or equal to 250° C. and lower than or equal to 650° C., preferably higher than or equal to 300° C. and lower than or equal to 500° C. The treatment time is shorter than or equal to 24 hours. Heat treatment for over 24 hours is not preferable because the productivity is reduced.

The oxygen doping treatment may be performed after the formation of the oxide layer 124a. The oxygen doping treatment may be performed after the formation of the oxide layer 124b. The oxygen doping treatment may be performed after the formation of the insulating layer 103.

Next, a resist mask is formed over the oxide layer 124b (not illustrated). The resist mask can be formed by a photolithography method, a printing method, an inkjet method, or the like as appropriate. The resist mask may be formed by a printing method, an inkjet method, or the like, in which case manufacturing costs can be reduced because a photomask is not used.

The formation of the resist mask by a photolithography method is performed in such a manner that a photosensitive resist is irradiated with light through a photomask and a portion of the resist that has been exposed to light (or has not been exposed to light) is removed using a developing solution. Examples of light with which the photosensitive resist is irradiated include KrF excimer laser light, ArF excimer laser light, extreme ultraviolet (EUV) light, and the like. Alternatively, a liquid immersion technique may be employed in which light exposure is performed with a portion between a substrate and a projection lens filled with liquid (e.g., water). An electron beam or an ion beam may be used instead of the above-mentioned light. Note that a photomask is not necessary in the case of using an electron beam or an ion beam. Note that a dry etching method such as ashing or a wet etching method using a dedicated stripper or the like can be used for removal of the resist mask. Both the dry etching method and the wet etching method may be used.

With the use of the resist mask as a mask, each part of the oxide layers 124b and 124a is selectively removed. At this time, the insulating layer 103 might be partly removed, thereby having a projection. Note that the removal (etching) of the oxide layers 124b and 124a may be conducted by a dry etching method, a wet etching method, or both of them. In this manner, the island-shaped oxide layers 104a and 104b are formed (see FIG. 15C).

In the case of etching the conductive layer, the semiconductor layers, and the insulating layers by a dry etching method, a gas containing a halogen element can be used as an etching gas. As an example of the gas containing a halogen element, a chlorine-based gas such as chlorine ($Cl_2$), boron trichloride ($BCl_3$), silicon tetrachloride ($SiCl_4$), or carbon tetrachloride ($CCl_4$)); a fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); or oxygen can be used as appropriate. In addition, an inert gas may be added to an etching gas to be used. As the etching gas used for etching of an oxide semiconductor, a mixed gas of an inert gas and a hydrocarbon-based gas such as methane ($CH_4$), ethane ($C_2H_6$), propane ($C_3H_8$), or butane ($C_4H_{10}$) may be used.

As the dry etching method, a parallel-plate-type reactive ion etching (RIE) method, an inductively coupled plasma (ICP) etching method, a dual frequency capacitively coupled plasma (DF-CCP) etching method, or the like can be used. In order to etch the layer into a desired shape, the etching condition (for example, the amount of electric power applied to a coil-shaped electrode, the amount of electric power applied to an electrode on a substrate side, the temperature of the electrode on the substrate side, or the like) may be adjusted as appropriate.

Next, an oxide layer 124c is formed over the oxide layer 104a, the oxide layer 104b, and the insulating layer 103. An insulating layer 125 is formed over the oxide layer 124c (see FIG. 15D). The oxide layer 124c can be formed using a material and a method that are similar to those of the oxide layer 124a. The insulating layer 125 can be formed using a material and a method similar to those of the insulating layer 103. The insulating layer 125 preferably has a thickness of more than or equal to 1 nm and less than or equal to 50 nm, further preferably more than or equal to 3 nm and less than or equal to 30 nm, still further preferably more than or equal to 5 nm and less than or equal to 10 nm. After the formation of the oxide layer 124c, oxygen doping treatment may be performed. After the formation of the insulating layer 125, oxygen doping treatment may be performed. Furthermore, after the formation of the insulating layer 125, heat treatment may be performed. In this embodiment, a silicon oxide layer is formed as the insulating layer 125.

Figure 16A:
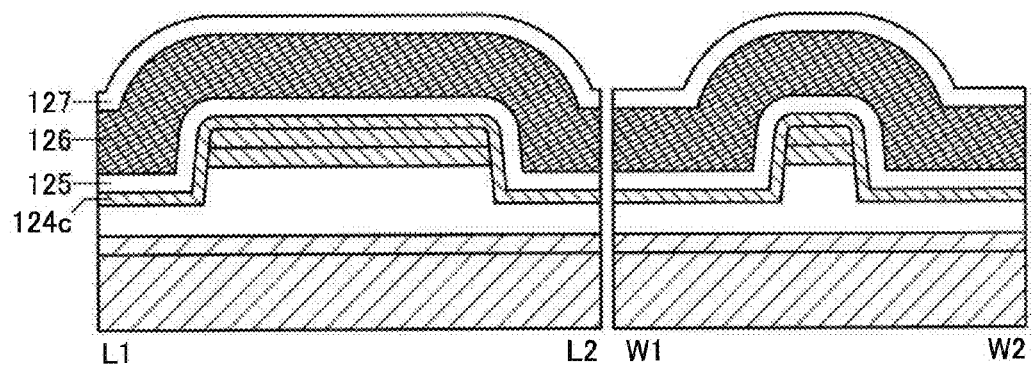
FIGS. 16A to 16C illustrate an example of a method for manufacturing a transistor of one embodiment of the present invention.

Next, a conductive layer 126 is formed over the insulating layer 125 (see FIG. 16A). As a conductive material for forming the conductive layer 126, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, and the like can be used. Alternatively, a semiconductor having a high electric conductivity typified by polycrystalline silicon including an impurity element such as phosphorus, or silicide such as nickel silicide may be used. A plurality of stacked conductive layers formed with these materials may be used as the conductive layer 126.

The conductive layer 126 can also be formed using a conductive material containing oxygen, such as indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added, or a conductive material containing nitrogen, such as titanium nitride or tantalum nitride. It is also possible to use a stacked-layer structure formed using a material containing the above metal element and conductive material containing oxygen. It is also possible to use a stacked-layer structure formed using a material containing the above metal element and conductive material containing nitrogen. It is also possible to use a stacked-layer structure formed using a material containing the above metal element, conductive material containing oxygen, and conductive material containing nitrogen.

There is no particular limitation on a formation method of the conductive layer 126, and a variety of formation methods such as an evaporation method, a CVD method, and a sputtering method can be employed. The conductive layer 126 preferably has a thickness of more than or equal to 10 nm and less than or equal to 500 nm, further preferably more than or equal to 20 nm and less than or equal to 300 nm, still further preferably more than or equal to 30 nm and less than or equal to 200 nm. In this embodiment, a stack including titanium nitride and tungsten is used as the conductive layer 126. Specifically, a 150-nm-thick tungsten film is formed over a 10-nm-thick titanium nitride film.

Next, an insulating layer 127 is formed over the conductive layer 126 (see FIG. 16A). The insulating layer 127 can be formed using a material and a method similar to those of the insulating layer 125. The insulating layer 127 preferably has a thickness of more than or equal to 5 nm and less than or equal to 100 nm, and further preferably more than or equal to 10 nm and less than or equal to 50 nm.

Figure 16B:
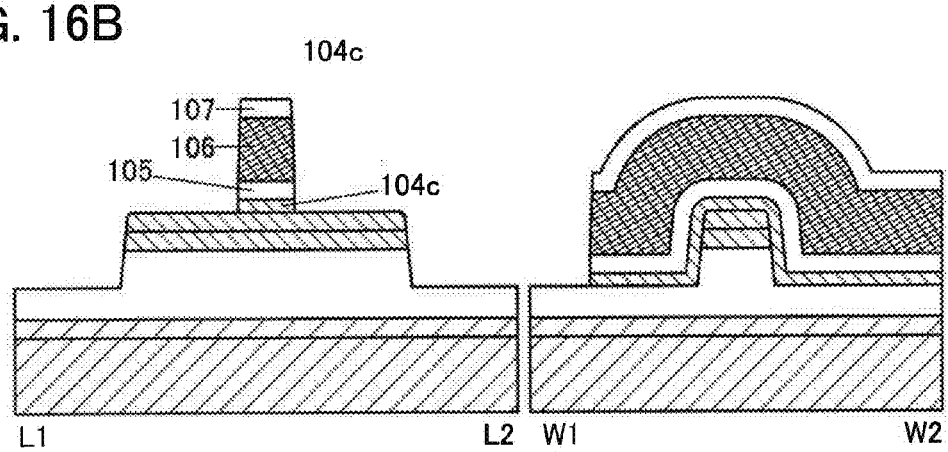

Then, a resist mask (not illustrated) is formed over the insulating layer 127 by a photolithography method or the like, and each part of the insulating layer 127, the conductive layer 126, the insulating layer 125, and the oxide layer 124c is selectively etched, so that the insulating layer 107, the electrode 106, the insulating layer 105, and the oxide layer 104*c* are formed (see FIG. 16B). After that, the resist mask is removed. The etching of the insulating layer 127, the conductive layer 126, the insulating layer 125, and the oxide layer 124*c* may be performed by a dry etching method, a wet etching method, or both of them.

Figure 16C:
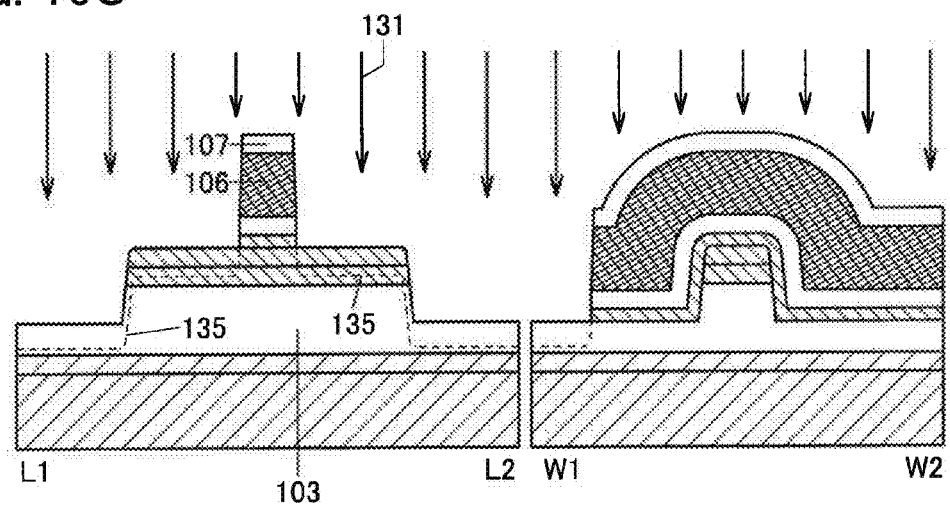

Then, a dopant 131 is introduced using the electrode 106 and the insulating layer 107 as a mask (see FIG. 16C). The dopant 131 is indicated by the arrows in FIG. 16C. The dopant 131 may be introduced by ion implantation, plasma doping, plasma treatment, or the like. End portions of the regions 135 to which the dopant 131 is introduced are indicated by dashed lines in FIG. 16C. The depth of the regions 135 to which the dopant 131 is introduced and the concentration of the metal element contained in the regions 135 can be determined depending on the treatment method or the treatment conditions.

One or more of the following metal elements can be used as the dopant 131: aluminum, sulfur, titanium, magnesium, tungsten, arsenic, antimony, vanadium, and the like. Elements other than the above elements may be used as the dopant 131. The dose of the dopant 131 is greater than or equal to $1\times10^{12}$ ions/cm$^2$ and less than or equal to $1\times10^{16}$ ions/cm$^2$, preferably greater than or equal to $1\times10^{13}$ ions/cm$^2$ and less than or equal to $1\times10^{15}$ ions/cm$^2$. The accelerating voltage of the dopant 131 is greater than or equal to 5 kV and less than or equal to 50 kV, preferably greater than or equal to 10 kV and less than or equal to 30 kV. In this embodiment, tungsten is used as the dopant 131. When the dopant 131 is introduced using the electrode 106 and the insulating layer 107 as a mask, the regions 135 can be formed to be adjacent to a channel formation region in a self-aligned manner.

When the dopant 131 is introduced to the oxide layer 104, oxygen vacancy (also referred to as "$V_O$") is generated. When a metal element is used as the dopant 131, oxygen contained in the oxide layer 104 and the introduced dopant 131 are bonded to form a metal oxide. Thus, $V_O$ is increased in the regions of the oxide layer 104 to which the dopant 131 is introduced (the regions 135).

When $V_O$ and hydrogen (H) are bonded to form $V_OH$, the carrier density of the region is increased to lower the resistivity of the region. Furthermore, heat treatment may be performed thereon after the introduction of the dopant 131. The heat treatment is performed at a temperature higher than or equal to 200° C. and lower than or equal to 500° C., preferably higher than or equal to 300° C. and lower than or equal to 450° C., and further preferably higher than or equal to 350° C. and lower than or equal to 400° C. Because of the heat treatment, $V_OH$ is likely to be formed.

A rare gas element such as helium, neon, argon, krypton, xenon, or radon may be used as the dopant 131.

When a metal element is used as the dopant 131, the element preferably has a high conductivity after the element is oxidized. For example, an oxide of a metal element used as the dopant 131 is preferably a metal oxide that can be regarded as a conductor or a semiconductor.

The regions 135 of the oxide layer 104 can each serve as a conductor or an n-type semiconductor. The regions 135 of the oxide layer 104 have a higher carrier density and a lower resistivity than a region of the oxide layer 104 that overlaps with the electrode 106 (the channel formation region). Thus, in some cases, the regions 135 of the oxide layer 104 have a lower resistance than the region of the oxide layer 104 that overlaps with the electrode 106 (the channel formation region).

In this embodiment, tungsten is used as the dopant 131. The dopant 131 is introduced to part of the oxide layer 104 by an ion implantation method. By the introduction of tungsten, a region containing tungsten oxide is formed in the oxide layer 104.

Figure 17A:
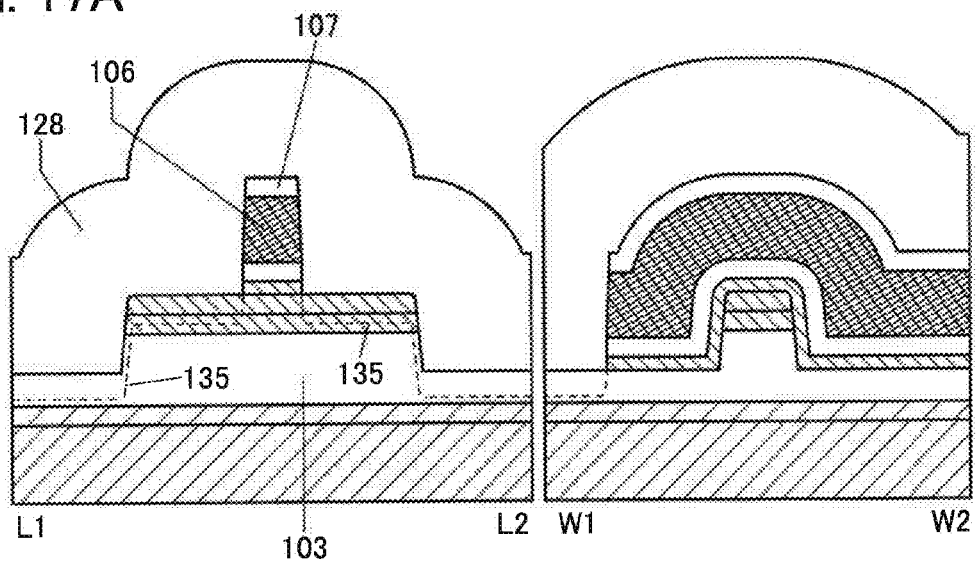
FIGS. 17A to 17C illustrate an example of a method for manufacturing a transistor of one embodiment of the present invention.

Next, an insulating layer 128 is formed (see FIG. 17A). The insulating layer 128 can be formed using a material and a method that are similar to those of the insulating layer 125. The thickness of the insulating layer 128 is preferably greater than the total thickness of the oxide layer 104*c*, the insulating layer 105, the electrode 106, and the insulating layer 107.

In this embodiment, a silicon oxide layer is formed by a CVD method as the insulating layer 128.

Figure 17B:
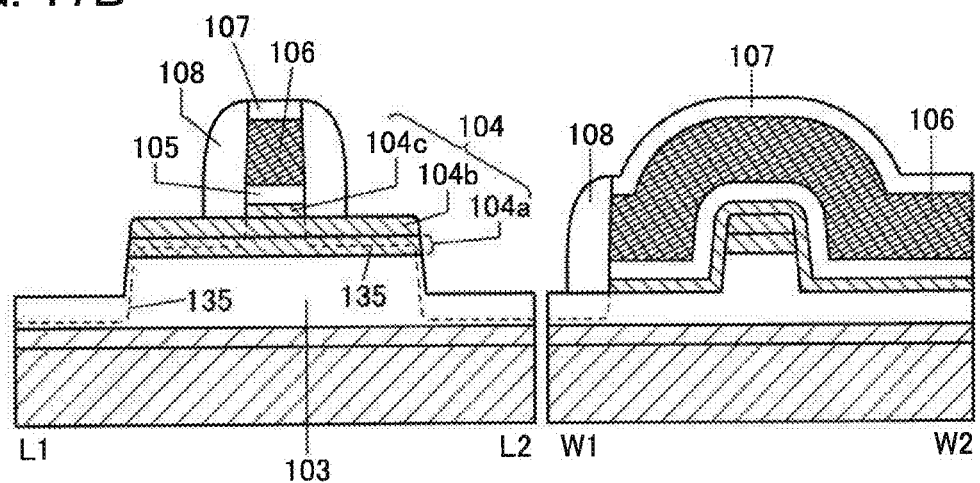

Next, the insulating layer 128 is etched by an anisotropic dry etching method to form the structure body 108 to be adjacent to the side surfaces of the electrode 106 (see FIG. 17B). Part of the oxide layer 104*b* is exposed when the structure body 108 is formed.

At this time, part of the exposed oxide layer 104*b* is etched and the oxide layer 104*b* having a projection is formed in some cases. The transistor 100 including the oxide layer 104*b* having a projection is illustrated in FIGS. 21A and 21B. FIG. 21A is a plan view of the transistor 100. FIG. 21B is a cross-sectional view taken along the dashed-dotted line L1-L2 and the dashed-dotted line W1-W2 in FIG. 21A.

Figure 17C:
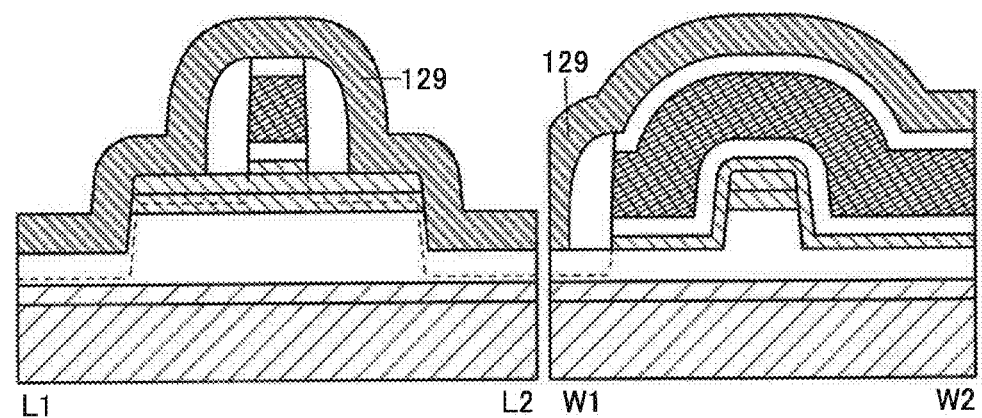

Next, a conductive layer 129 is formed (see FIG. 17C). The conductive layer 129 can be formed using a material and a method that are similar to those of the conductive layer 126 (the electrode 106). The conductive layer 129 preferably has a thickness of more than or equal to 5 nm and less than or equal to 500 nm, further preferably more than or equal to 10 nm and less than or equal to 200 nm, still further preferably more than or equal to 15 nm and less than or equal to 100 nm. In this embodiment, a 20-nm-thick tungsten layer is used as the conductive layer 129.

Figure 18A:
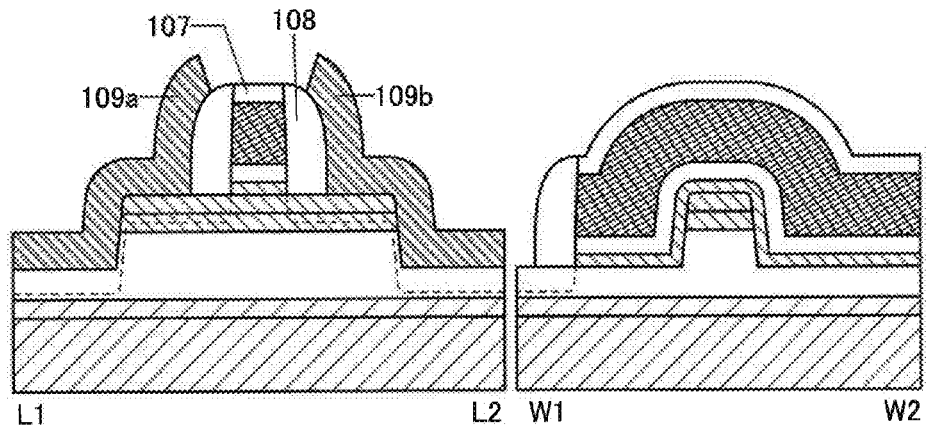
FIGS. 18A to 18C illustrate an example of a method for manufacturing a transistor of one embodiment of the present invention.

Then, part of the conductive layer 129 is selectively etched by a photolithography method or the like, so that the electrodes 109*a* and 109*b* are formed (see FIG. 18A). Note that the insulating layer 107 provided over the electrode 106 can protect the electrode 106 so that the electrode 106 is not removed when the part of the conductive layer 129 is removed.

When the electrodes 109*a* and 109*b* are formed using a material that is capable of extracting oxygen from the oxide layer 104, such as tungsten or titanium, $V_O$ in the oxide layer 104 that is in contact with the electrodes 109*a* and 109*b* is increased. Thus, in portions of the regions 135 of the oxide layer 104 that are in contact with the electrodes 109*a* and 109*b*, the carrier density is increased and the resistivity is lowered. When $V_O$ and hydrogen are bonded to form $V_OH$, the carrier density of the region is further increased and the resistivity of the region is further lowered.

Thus, in the oxide layer 104, regions in contact with the electrodes 109*a* and 109*b* have a higher carrier density than a region overlapping with the structure body 108 in some cases. In addition, in the oxide layer 104, the regions in contact with the electrodes 109*a* and 109*b* have a lower resistivity than the region overlapping with the structure body 108 in some cases. Moreover, in the oxide layer 104, the regions in contact with the electrodes 109*a* and 109*b* have a lower resistance than the region overlapping with the structure body 108 in some cases.

Figure 18B:
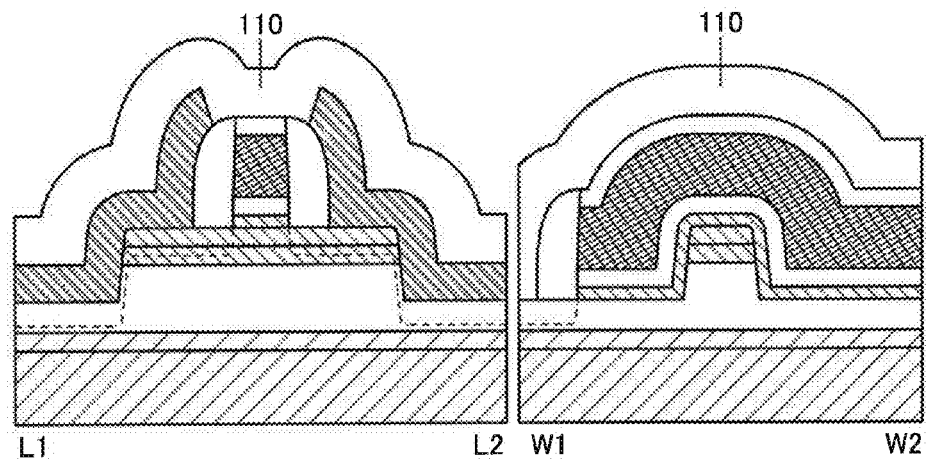

Next, the insulating layer 110 is formed (see FIG. 18B). The insulating layer 110 can be formed using a material and a method that are similar to those of the insulating layer 127

(the insulating layer 107). In this embodiment, a silicon oxide layer is formed by a CVD method as the insulating layer 110.

Figure 18C:
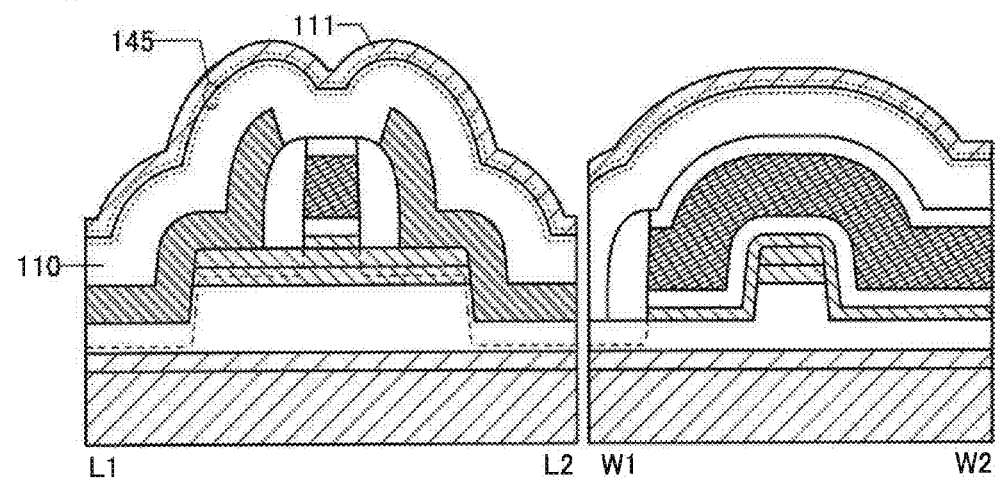
Figure 19:
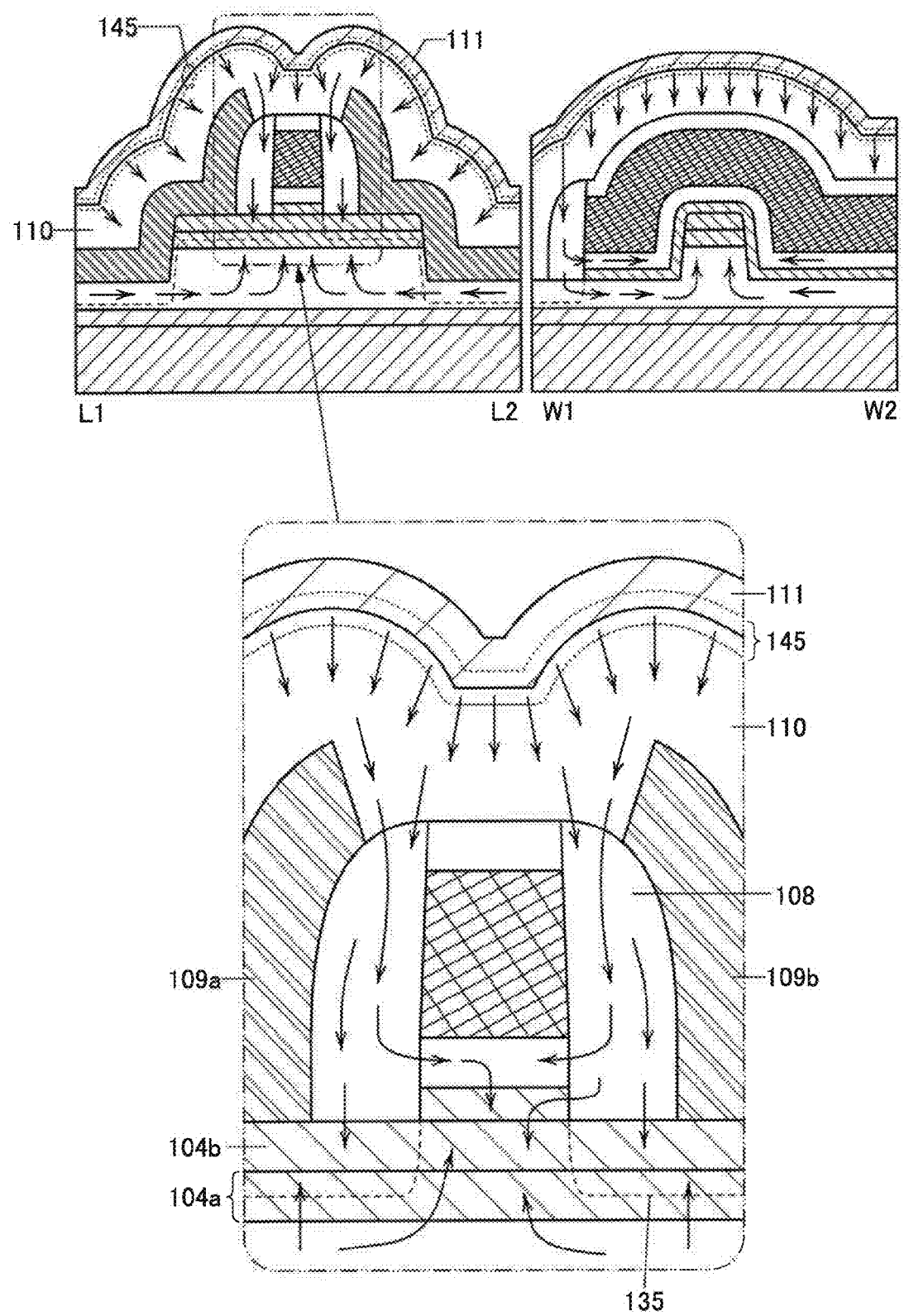
FIG. 19 illustrates an example of a method for manufacturing a transistor of one embodiment of the present invention.

Next, the insulating layer 111 is formed over the insulating layer 110 (see FIG. 18C). The insulating layer 111 can be formed using a material and a method that are similar to those of the insulating layer 127 (the insulating layer 107). Note that the insulating layer 111 is preferably formed using an insulating material through which impurities do not easily pass. In this embodiment, an aluminum oxide layer is formed by a sputtering method as the insulating layer 111. As the sputtering gas, a gas containing oxygen is used. By forming the insulating layer 111 by a sputtering method, a mixed layer of the insulating layer 111 and a surface over which the insulating layer 111 is formed is formed at and near the interface between the insulating layer 111 and the surface over which the insulating layer 111 is formed. Specifically, a mixed layer 145 is formed at and near the interface between the insulating layer 111 and the insulating layer 110.

Furthermore, the mixed layer 145 contains part of the sputtering gas. In this embodiment, a gas containing oxygen is used as the sputtering gas; therefore, the mixed layer 145 contains oxygen. Thus, the mixed layer 145 contains excess oxygen.

Next, heat treatment is performed. The heat treatment is performed at a temperature higher than or equal to 200° C. and lower than or equal to 500° C., preferably higher than or equal to 300° C. and lower than or equal to 450° C., and further preferably higher than or equal to 350° C. and lower than or equal to 400° C. The temperature of this heat treatment is set to lower than or equal to the temperature of the heat treatment performed after the introduction of the dopant 131.

By the heat treatment, the excess oxygen contained in the mixed layer 145 is diffused to the oxide layers 104a, 104b, and 104c through the insulating layer 110, the structure body 108, or the like. When a material that is less likely to transmit oxygen is used for the insulating layers 111 and 102, the excess oxygen contained in the mixed layer 145 is effectively diffused to the oxide layer 104b through the insulating layer 110, the structure body 108, or the like. A state of diffusion of the excess oxygen contained in the mixed layer 145 is shown by the arrows in FIG. 19.

Next, the insulating layer 112 is formed over the insulating layer 111. The insulating layer 112 can be formed using a material and a method similar to those of the insulating layer 110. In addition, the insulating layer 112 can be formed using an organic material having heat resistance, such as a polyimide, an acrylic-based resin, a benzocyclobutene-based resin, a polyamide, or an epoxy-based resin. Other than such organic materials, it is possible to use a low-dielectric constant material (a low-k material), a siloxane-based resin, PSG (phosphosilicate glass), BPSG (borophosphosilicate glass), or the like. Note that the planarization layer 112 may be formed by stacking a plurality of insulating layers formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. The organic group may include a fluoro group.

There is no particular limitation on the method for forming the insulating layer 112, and any of the following methods that depend on a material thereof can be used: a sputtering method; an SOG method; spin coating; dipping; spray coating; a droplet discharging method (e.g., an ink-jet method); a printing method (e.g., screen printing, or offset printing); or the like. When the baking step of the insulating layer 112 also serves as heat treatment for another layer, a transistor can be manufactured efficiently.

Furthermore, the surface of the insulating layer 112 may be subjected to chemical mechanical polishing (CMP) treatment (hereinafter also referred to as CMP treatment). By the CMP treatment, unevenness of the surface can be reduced, and coverage with an insulating layer or a conductive layer formed later can be increased.

Figure 20A:
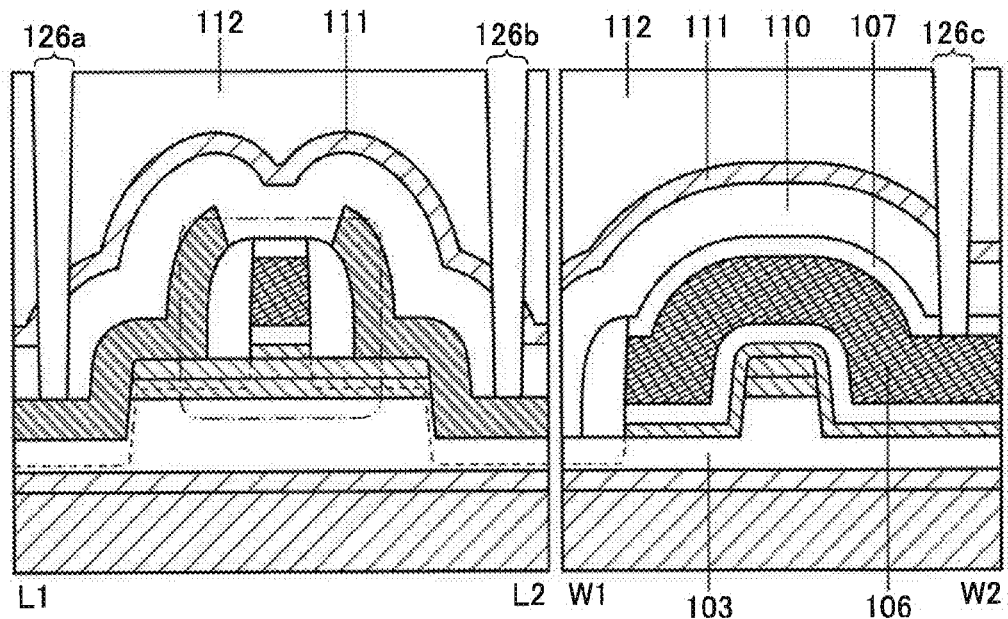
FIGS. 20A and 20B illustrate an example of a method for manufacturing a transistor of one embodiment of the present invention.
Figure 20B:
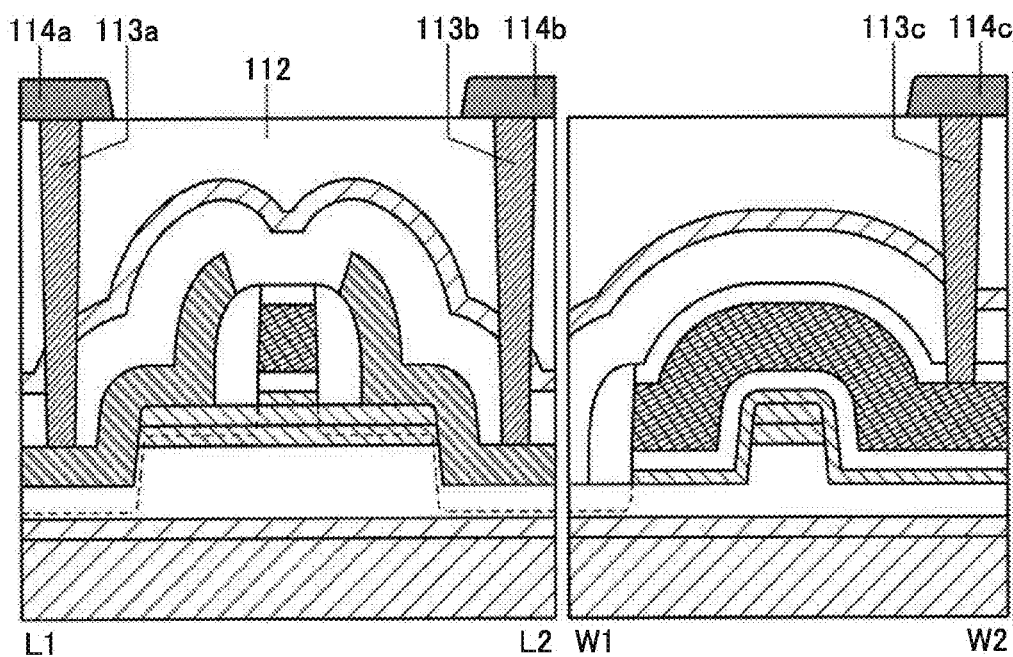

Next, each part of the insulating layers 112, 111, 110, and 107 is selectively removed by a photolithography method or the like to form an opening 126a overlapping with part of the electrode 109a, an opening 126b overlapping with part of the electrode 109b, and an opening 126c overlapping with part of the electrode 106 (see FIG. 20A). The parts of the insulating layers 112, 111, 110, and 107 may be removed (etched) by a dry etching method and/or a wet etching method. When an anisotropic dry etching method is used, an opening with a high aspect ratio can be formed.

Note that parts of the electrodes 109a, 109b, and 106 are removed in forming the openings 126a, 126b, and 126c, whereby depressions are formed in the electrodes 109a, 109b, and 106 in some cases (see FIG. 21B).

Next, the contact plug 113a, the contact plug 113b, and a contact plug 113c are formed in the opening 126a, the opening 126b, and the opening 126c, respectively. For the contact plugs 113a, 113b, and 113c, for example, a conductive material with high embeddability, such as tungsten or polysilicon, can be used. Although not illustrated, the side surface and the bottom surface of the material can be covered with a barrier layer (a diffusion prevention layer) such as a titanium layer, a titanium nitride layer, or a stack of these layers. In this case, the barrier layer may be regarded as part of the electrode.

Then, a conductive layer is formed over the insulating layer 112. Part of the conductive layer is selectively etched by a photolithography method or the like. The electrode 114a overlapping with the contact plug 113a, the electrode 114b overlapping with the contact plug 113b, and an electrode 114c overlapping with the contact plug 113c are formed (see FIG. 20B). The conductive layer can be formed using a material and a method that are similar to those of the conductive layer 129.

This embodiment can be implemented in an appropriate combination with any of the structures described in the other embodiments.

Embodiment 3

An oxide semiconductor is classified into a single crystal oxide semiconductor and a non-single-crystal oxide semiconductor. Examples of a non-single-crystal oxide semiconductor include a CAAC-OS, a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

[CAAC-OS]

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 22A:
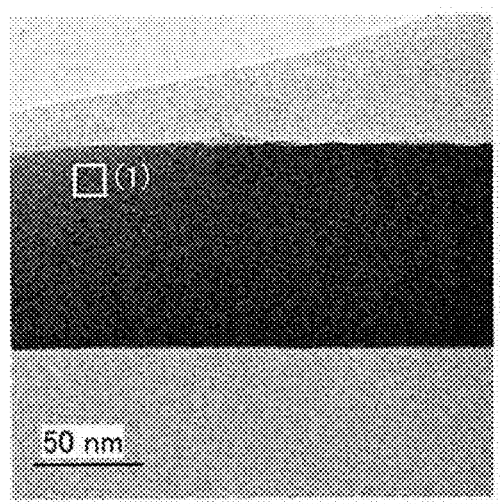
FIGS. 22A to 22D are Cs-corrected high-resolution TEM images of a cross section of a CAAC-OS and a cross-sectional schematic view of a CAAC-OS.

A CAAC-OS observed with TEM is described below. FIG. 22A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 22B:
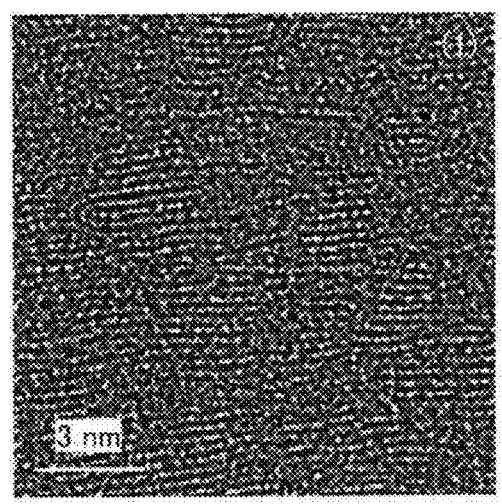

FIG. 22B is an enlarged Cs-corrected high-resolution TEM image of a region (1) in FIG. 22A. FIG. 22B shows that metal atoms are arranged in a layered manner in a pellet. Each metal atom layer has a configuration reflecting unevenness of a surface over which a CAAC-OS film is formed (hereinafter, the surface is also referred to as a formation surface) or a top surface of the CAAC-OS film, and is arranged parallel to the formation surface or the top surface of the CAAC-OS film.

Figure 22C:
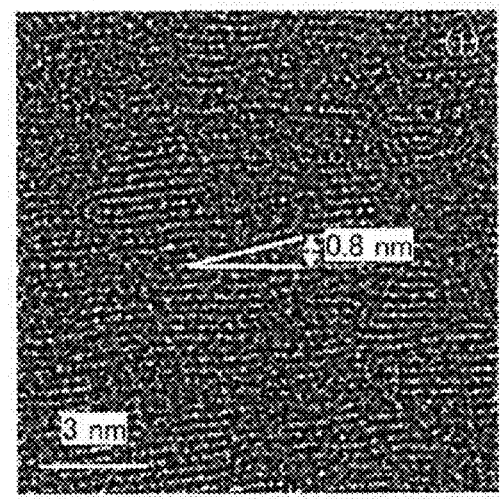

As shown in FIG. 22B, the CAAC-OS has a characteristic atomic arrangement. The characteristic atomic arrangement is denoted by an auxiliary line in FIG. 22C. FIGS. 22B and 22C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 22D:
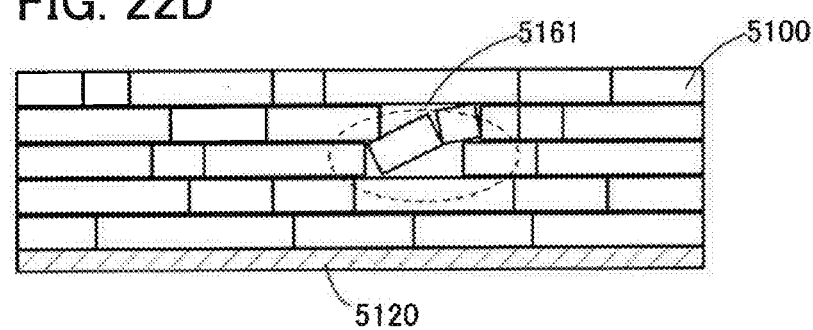

Here, according to the Cs-corrected high-resolution TEM images, the schematic arrangement of pellets 5100 of a CAAC-OS over a substrate 5120 is illustrated by such a structure in which bricks or blocks are stacked (see FIG. 22D). The part in which the pellets are tilted as observed in FIG. 22C corresponds to a region 5161 shown in FIG. 22D.

FIG. 23A shows a Cs-corrected high-resolution TEM image of a plane of the CAAC-OS observed from a direction substantially perpendicular to the sample surface. FIGS. 23B, 23C, and 23D are enlarged Cs-corrected high-resolution TEM images of regions (1), (2), and (3) in FIG. 23A, respectively. FIGS. 23B, 23C, and 23D indicate that metal atoms are arranged in a triangular, quadrangular, or hexagonal configuration in a pellet. However, there is no regularity of arrangement of metal atoms between different pellets.

Figure 24A:
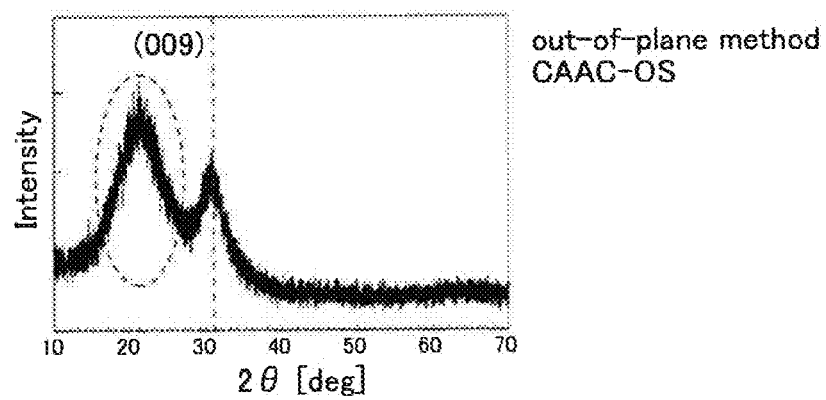
FIGS. 24A to 24C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle ($2\theta$) of around 31° as shown in FIG. 24A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when $2\theta$ is around 36°, in addition to the peak at $2\theta$ of around 31°. The peak at $2\theta$ of around 36° indicates that a crystal having no c-axis alignment is included in part of the CAAC-OS. It is preferable that in the CAAC-OS analyzed by an out-of-plane method, a peak appear when $2\theta$ is around 31° and that a peak not appear when $2\theta$ is around 36°.

Figure 24B:
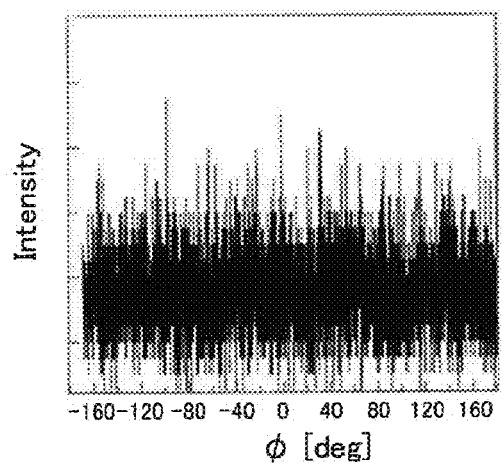
Figure 24C:
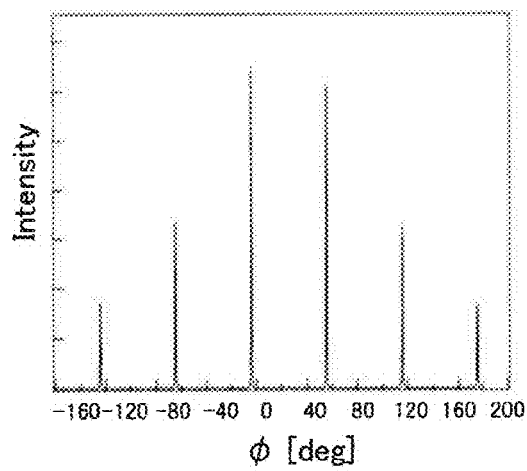

On the other hand, in structural analysis of the CAAC-OS by an in-plane method in which an X-ray beam is incident on a sample in a direction substantially perpendicular to the c-axis, a peak appears when $2\theta$ is around 56°. This peak is attributed to the (110) plane of the $InGaZnO_4$ crystal. In the case of the CAAC-OS, when analysis ($\varphi$ scan) is performed with $2\theta$ fixed at around 56° and with the sample rotated using a normal vector of the sample surface as an axis ($\varphi$ axis), as shown in FIG. 24B, a peak is not clearly observed. In contrast, in the case of a single crystal oxide semiconductor of $InGaZnO_4$, when 4) scan is performed with $2\theta$ fixed at around 56°, as shown in FIG. 24C, six peaks that are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 25A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 25B shows a diffraction pattern obtained in such a manner that an electron beam with a probe diameter of 300 nm is incident on the same sample in a direction perpendicular to the sample surface. As shown in FIG. 25B, a ring-like diffraction pattern is observed. Thus, the electron diffraction also indicates that the a-axes and b-axes of the pellets included in the CAAC-OS do not have regular alignment. The first ring in FIG. 25B is considered to be derived from the (010) plane, the (100) plane, and the like of the $InGaZnO_4$ crystal. The second ring in FIG. 25B is considered to be derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, oxygen vacancies in the oxide semiconductor serve as carrier traps or serve as carrier generation sources when hydrogen is captured therein.

The CAAC-OS having small amounts of impurities and oxygen vacancies is an oxide semiconductor with low carrier density. Specifically, an oxide semiconductor with a carrier density of lower than $8\times10^{11}/cm^3$, preferably lower than $1\times10^{11}/cm^3$, further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

[nc-OS]

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak that shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

[a-like OS]

An a-like OS has a structure between those of the nc-OS and the amorphous oxide semiconductor. In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 26:
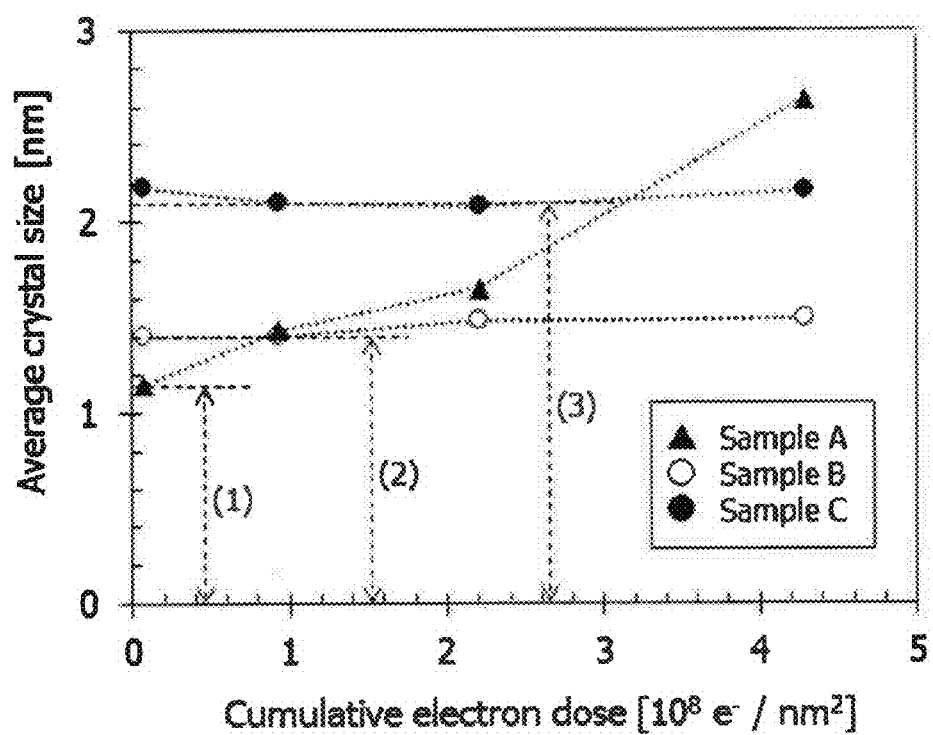
FIG. 26 shows a change of crystal parts of an In—Ga—Zn oxide owing to electron irradiation.

FIG. 26 shows change in the average size of crystal parts (at 22 points to 45 points) in each sample. Note that the crystal part size corresponds to the length of a lattice fringe. FIG. 26 indicates that the crystal part size in the a-like OS increases with an increase in the cumulative electron dose. Specifically, as shown by (1) in FIG. 26, a crystal part of approximately 1.2 nm (also referred to as an initial nucleus) at the start of TEM observation grows to a size of approximately 2.6 nm at a cumulative electron dose of $4.2\times10^8$ e$^-$/nm$^2$. In contrast, the crystal part size in the nc-OS and the CAAC-OS shows little change from the start of electron irradiation to a cumulative electron dose of $4.2\times10^8$ e$^-$/nm$^2$. Specifically, as shown by (2) and (3) in FIG. 26, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, an nc-OS, and a CAAC-OS, for example.

This embodiment can be implemented in an appropriate combination with any of the structures described in the other embodiments.

Embodiment 4

In this embodiment, an example of a semiconductor device including any of the transistors disclosed in this specification and the like is described.

Figure 27A:
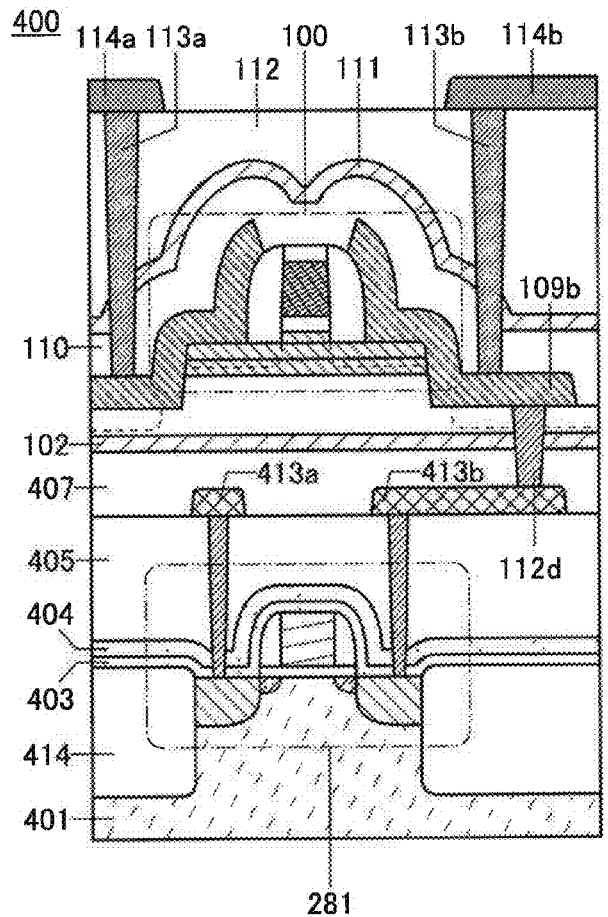
FIGS. 27A to 27C are cross-sectional views illustrating a transistor of one embodiment of the present invention.
Figure 27B:
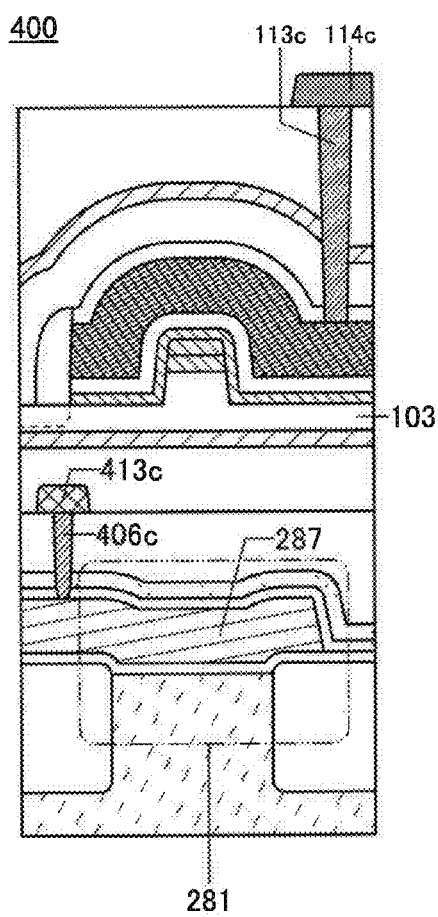
Figure 27C:
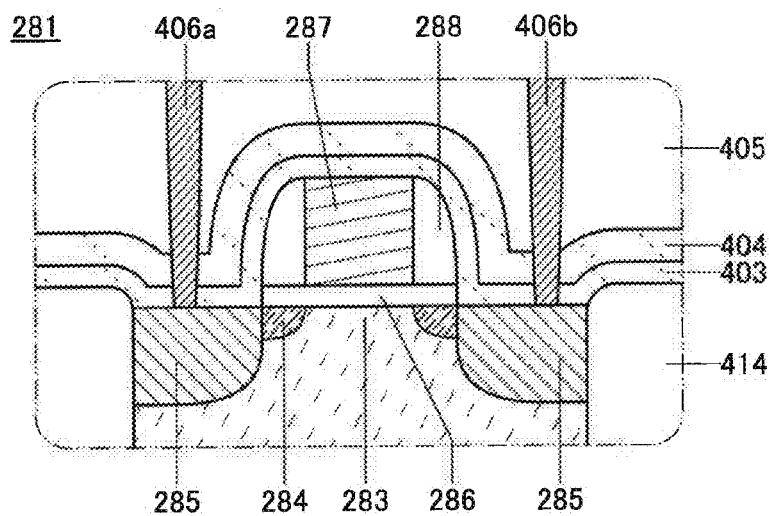

FIGS. 27A to 27C are cross-sectional views of a semiconductor device 400. The semiconductor device 400 includes the transistor 100 and a transistor 281. Note that the transistor 100 can be replaced with any of the other transistors described in the above embodiment. FIG. 27A is a cross-sectional view of the transistor 100 and the transistor 281 in the channel length direction, and FIG. 27B is a cross-sectional view thereof in the channel width direction. FIG. 27C is an enlarged view of the transistor 281 in FIG. 27A.

In the semiconductor device 400, an n-type semiconductor is used for a substrate 401. The transistor 281 includes a channel formation region 283, high-concentration p-type impurity regions 285, an insulating layer 286, an electrode 287, and a structure body 288. In regions overlapping with the structure body 288 with the insulating layer 286 located therebetween, low-concentration p-type impurity regions 284 are provided. The insulating layer 286 can function as a gate insulating layer. The electrode 287 can function as a gate electrode. The channel formation region 283 of the transistor 281 is formed in part of the substrate 401.

The low-concentration p-type impurity regions 284 can be formed in such a manner that impurity elements are added with the use of the electrode 287 as a mask after the formation of the electrode 287 and before the formation of the structure body 288. In other words, the low-concentration p-type impurity regions 284 can be formed in a self-aligned manner. After the structure body 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 414. The element isolation layer can be formed by a local oxidation of silicon (LOCOS) method, a shallow trench isolation (STI) method, or the like.

The transistor 281 can function as a p-channel transistor. An insulating layer 403 is formed over the transistor 281, and an insulating layer 404 is formed over the insulating layer 403. The insulating layers 403 and 404 can be formed using a material and a method that are similar to those of the insulating layer 111. Note that the insulating layers 403 and 404 are preferably formed using an insulating material that has a function of preventing diffusion of impurities such as oxygen, hydrogen, water, alkali metal, and alkaline earth metal. Note that one of the insulating layers 403 and 404 may be omitted or another insulating layer may be stacked thereover.

The semiconductor device 400 includes an insulating layer 405 having a flat surface over the insulating layer 404. The insulating layer 405 can be formed using a material and a method that are similar to those of the insulating layer 112. A surface of the insulating layer 405 may be subjected to CMP treatment.

An electrode 413a, an electrode 413b, and an electrode 413c are formed over the insulating layer 405. The electrodes 413a, 413b, and 413c can be formed using a material and a method that are similar to those of the electrode 109a.

The electrode 413a is electrically connected to one of the high-concentration p-type impurity regions 285 through a contact plug 406a. The electrode 413b is electrically connected to the other of the high-concentration p-type impurity regions 285 through a contact plug 406b. The electrode 413c is electrically connected to the electrode 287 through a contact plug 406c.

An insulating layer 407 is formed so as to cover the electrodes 413a, 413b, and 413c. The insulating layer 407 can be formed using a material and a method that are similar to those of the insulating layer 405. A surface of the insulating layer 407 may be subjected to CMP treatment.

The insulating layer 102 is formed over the insulating layer 407. Components over the insulating layer 407 can be understood with reference to the above embodiment. Thus, detailed description thereof is omitted in this embodiment. The electrode 109b is electrically connected to the electrode 413b through a contact plug 112d.

Modification Example 1

Figure 28A:
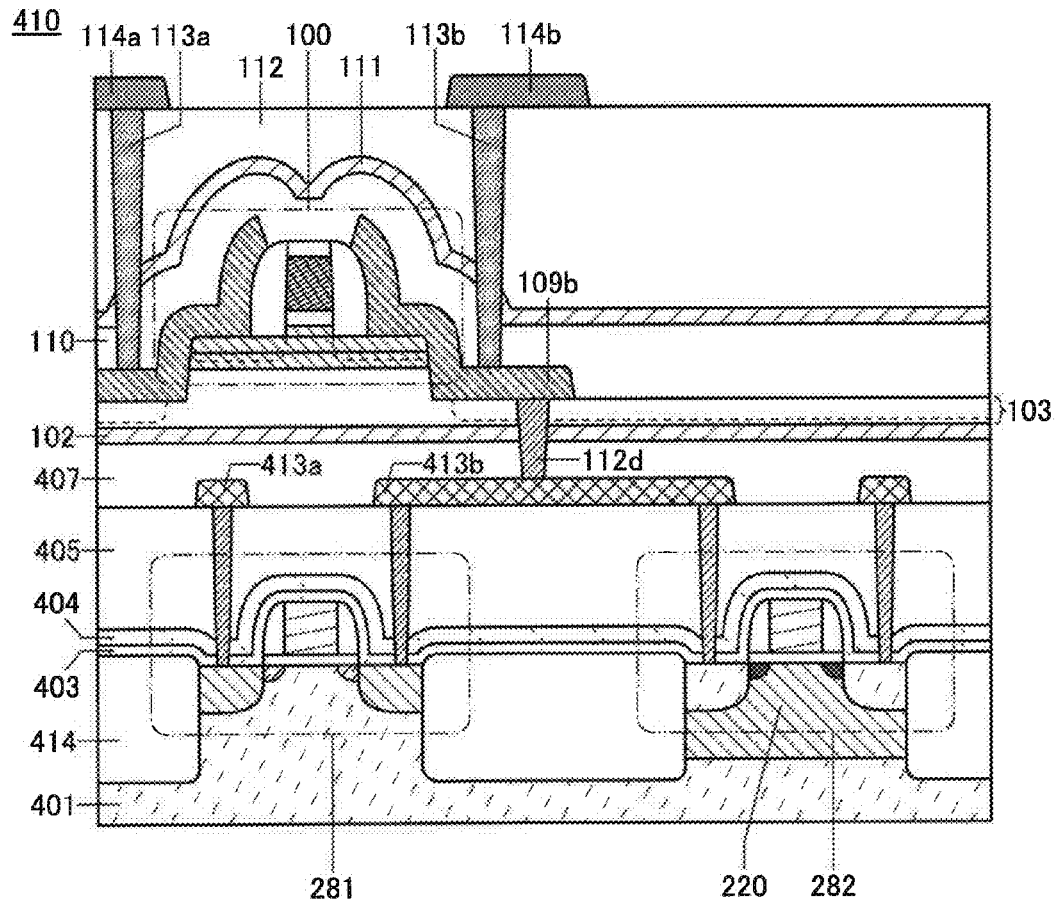
FIGS. 28A and 28B are cross-sectional views illustrating a transistor of one embodiment of the present invention.
Figure 28B:
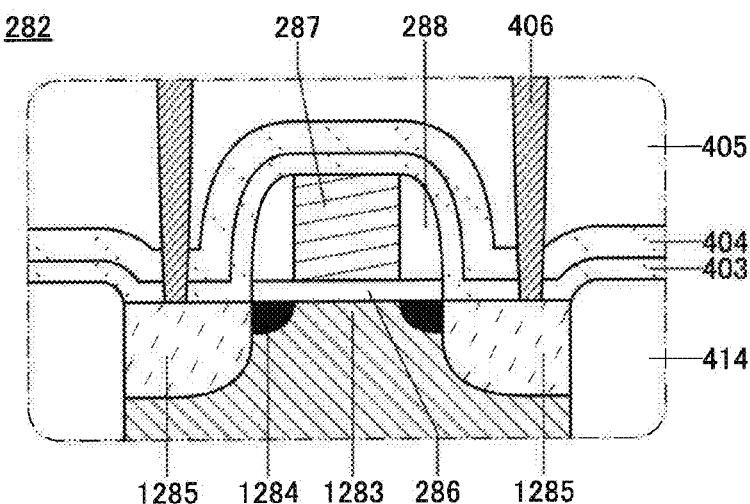

An n-channel transistor may be provided on the substrate 401. FIGS. 28A and 28B are cross-sectional views of a semiconductor device 410. The semiconductor device 410 includes an n-channel transistor 282 in addition to the components of the semiconductor device 400. FIG. 28A is a cross-sectional view of the transistors 100, 281, and 282 in the channel length direction, and FIG. 28B is an enlarged view of the transistor 282.

In the transistor 282, a channel formation region 1283 is formed in a well 220. The transistor 282 includes the channel formation region 1283, high-concentration n-type impurity regions 1285, an insulating layer 286, an electrode 287, and a structure body 288. In regions overlapping with the structure body 288 with the insulating layer 286 located therebetween, low-concentration n-type impurity regions 1284 are provided.

The low-concentration n-type impurity regions 1284 can be formed in such a manner that impurity elements are added with the use of the electrode 287 as a mask after the formation of the electrode 287 and before the formation of the structure body 288. In other words, the low-concentration n-type impurity regions 1284 can be formed in a self-aligned manner. After the structure body 288 is formed, the high-concentration n-type impurity regions 1285 are formed. Note that the low-concentration n-type impurity regions 1284 have the same conductivity type as the high-concentration n-type impurity regions 1285, and have a lower concentration of the impurity imparting the conductivity type than the high-concentration n-type impurity regions 1285. The low-concentration n-type impurity regions 1284 are not necessarily provided depending on circumstances.

Modification Example 2

Figure 29:
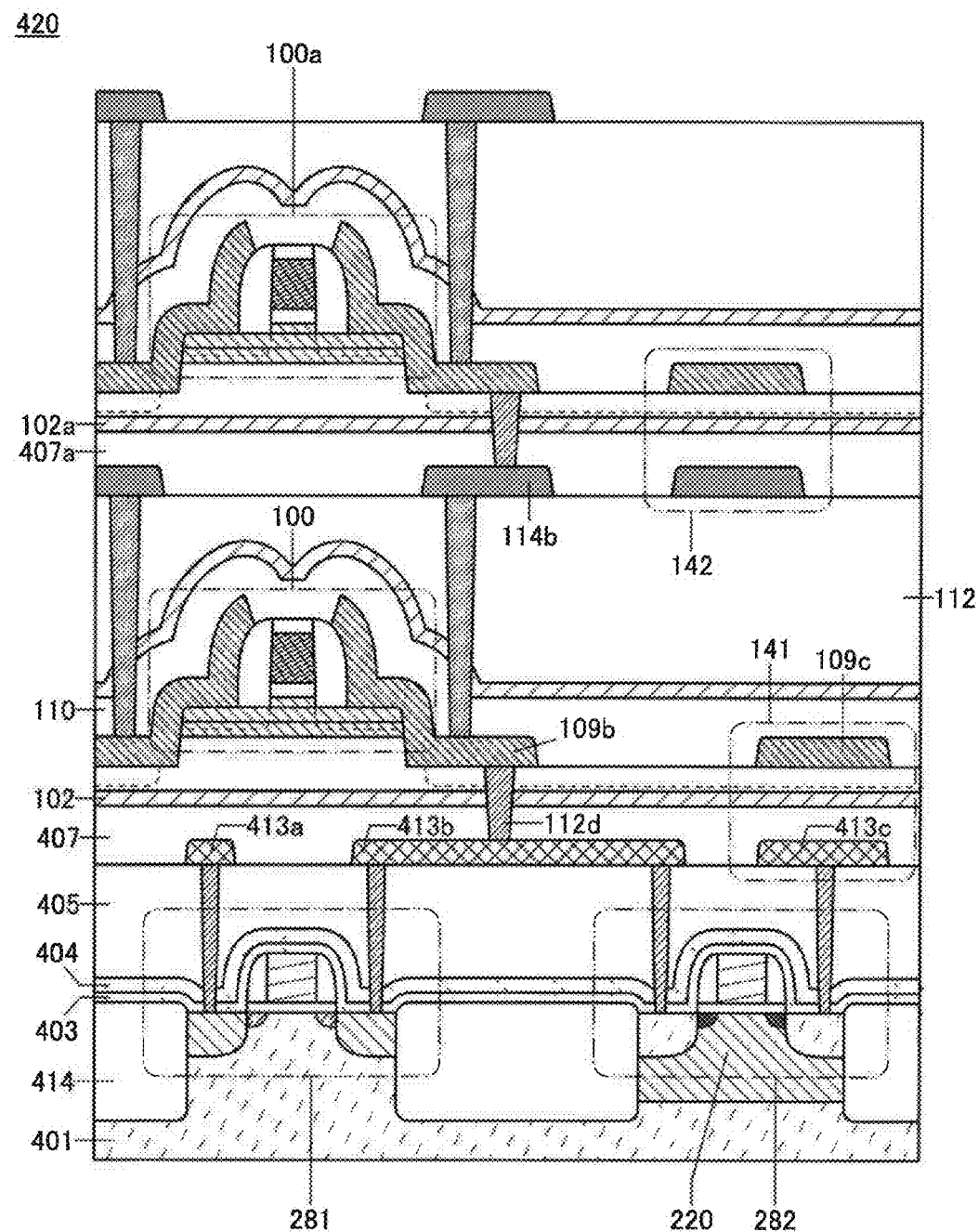
FIG. 29 is a cross-sectional view illustrating a semiconductor device according to one embodiment of the present invention.

Another transistor 100 may be provided over the transistor 100. FIG. 29 is a cross-sectional view of a semiconductor device 420. The semiconductor device 420 includes a transistor 100a having the same structure as the transistor 100 over the semiconductor device 410. The transistor 100a is provided over the insulating layer 112 with an insulating layer 407a and an insulating layer 102a provided therebetween. The insulating layer 407a can be formed using a material and a method that are similar to those of the insulating layer 407. The insulating layer 102a can be formed using a material and a method that are similar to those of the insulating layer 102. The transistor 100a can be manufactured by the same method as the transistor 100.

The semiconductor device 420 includes a capacitor 141 and a capacitor 142. The electrode 413c, which is one electrode of the capacitor 141, can be formed in the same layer as the electrodes 413a and 413b by using part of the conductive layer for forming the electrodes 413a and 413b. An electrode 109c, which is the other electrode of the capacitor 141, can be formed in the same layer as the electrodes 109a and 109b by using part of the conductive layer for forming the electrodes 109a and 109b. The insulating layers between the electrodes 109c and 413c can serve as a dielectric layer of the capacitor 141.

Modification Example 2

Figure 30A:
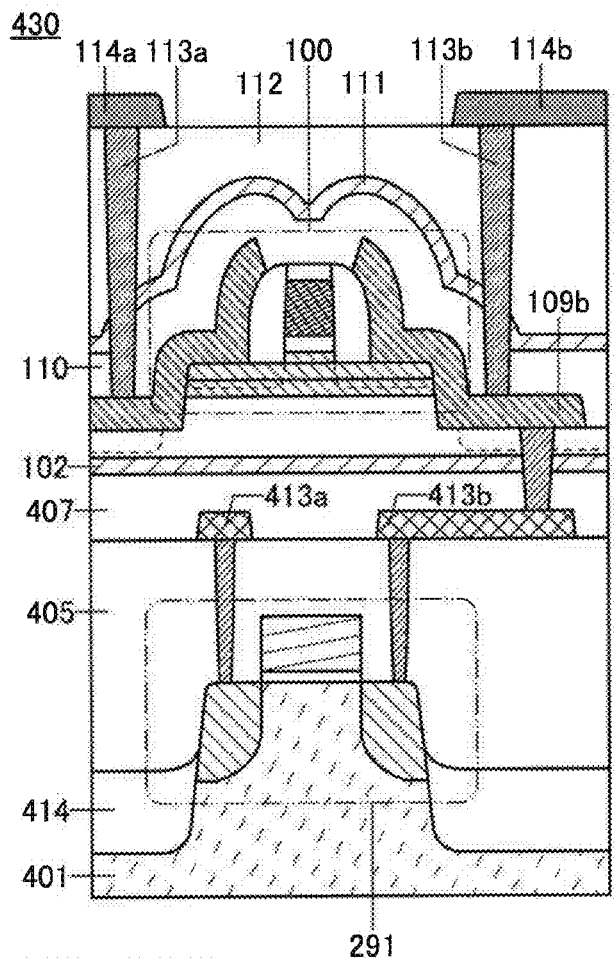
FIGS. 30A to 30C are cross-sectional views illustrating a transistor of one embodiment of the present invention.
Figure 30B:
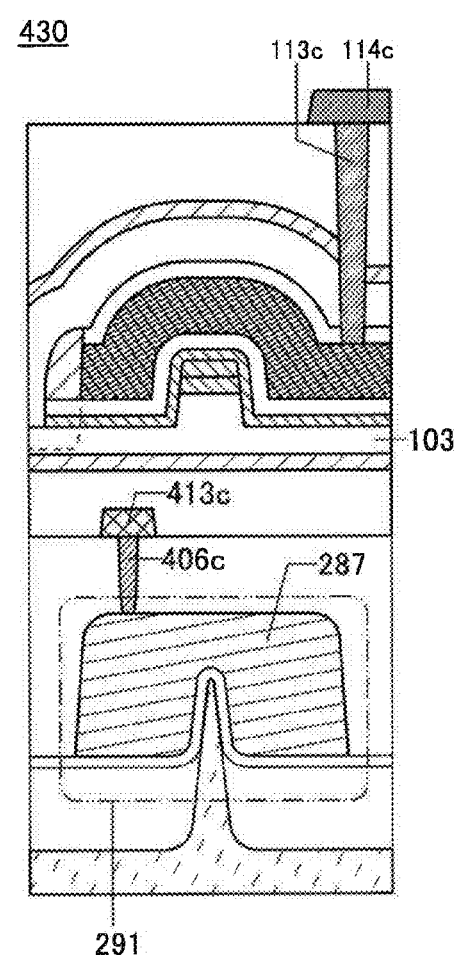
Figure 30C:
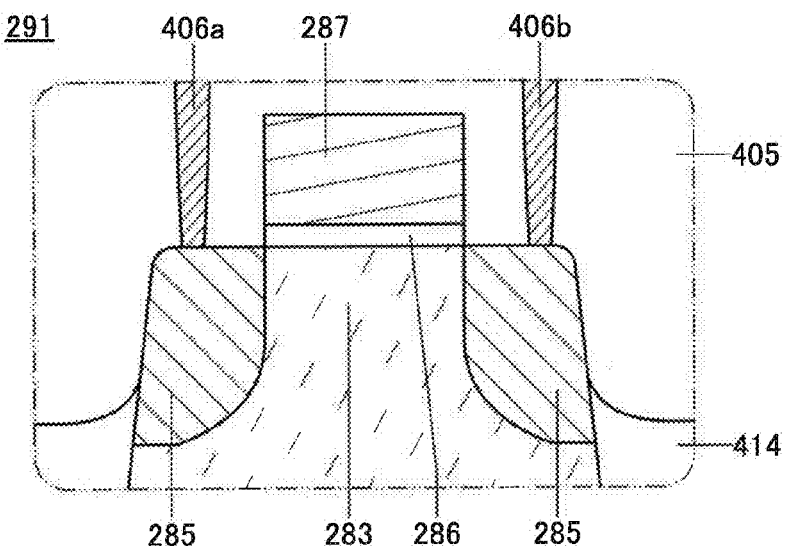

FIGS. 30A to 30C are cross-sectional views of a semiconductor device 430. The semiconductor device 430 has a structure obtained by replacing the transistor 281 of the semiconductor device 400 with a FIN-type transistor 291. The effective channel width is increased in the FIN-type transistor, whereby the on-state characteristics of the transistor can be improved. In addition, since contribution of the electric field of the gate electrode to the channel formation region can be increased, the off-state characteristics of the transistor can be improved.

[Semiconductor Circuit]

The transistors disclosed in this specification and the like can be used in a variety of semiconductor circuits, e.g., logic circuits such as an OR circuit, an AND circuit, a NAND circuit, and a NOR circuit, an inverter circuit, a buffer circuit, a shift register circuit, a flip-flop circuit, an encoder circuit, a decoder circuit, an amplifier circuit, an analog switch circuit, an integrator circuit, a differentiation circuit, a memory element, and the like.

In this embodiment, examples of CMOS circuits that can be used for the peripheral circuit and the pixel circuit, or the like are described with reference to FIGS. 31A to 31C. In the circuit diagrams and the like that are referred to in this specification and the like, "OS" is given beside the circuit symbol of a transistor in which an OS transistor is preferably used.

Figure 31A:
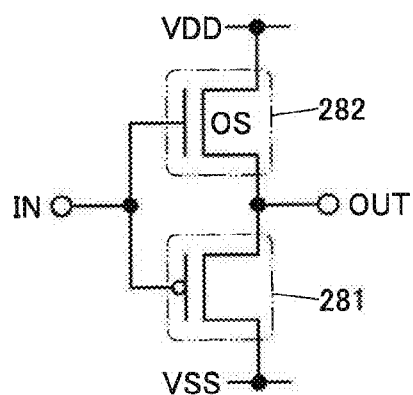
FIGS. 31A to 31C are circuit diagrams of a semiconductor device of one embodiment of the present invention.

The CMOS circuit illustrated in FIG. 31A has a configuration of an inverter circuit in which the p-channel transistor 281 and the n-channel transistor 282 are connected to each other in series and in which gates of the transistors are connected to each other.

Figure 31B:
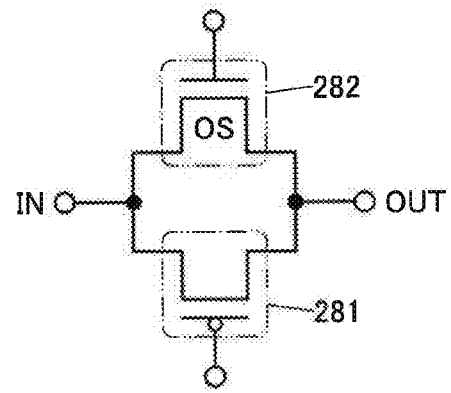

The CMOS circuit illustrated in FIG. 31B has a configuration of an analog switch circuit in which the p-channel transistor 281 and the n-channel transistor 282 are connected to each other in parallel.

Figure 31C:
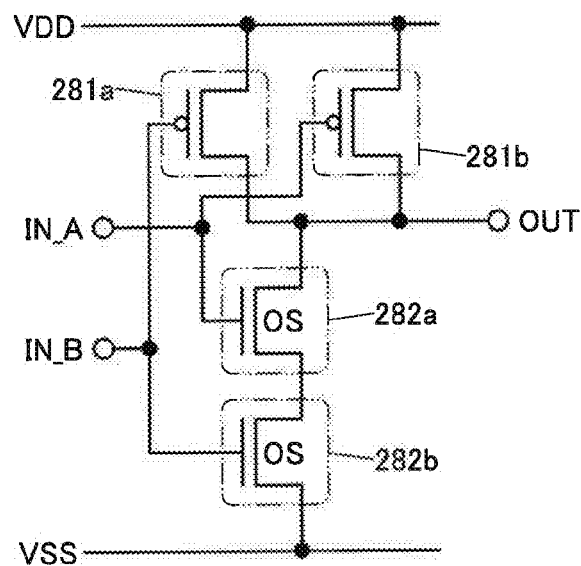

The CMOS circuit illustrated in FIG. 31C has a configuration of a NAND circuit including a transistor 281a, a transistor 281b, a transistor 282a, and a transistor 282b. A potential output from the NAND circuit changes depending on the combination of potentials input to an input terminal IN_A and an input terminal IN_B.

[Memory Device]

Figure 32A:
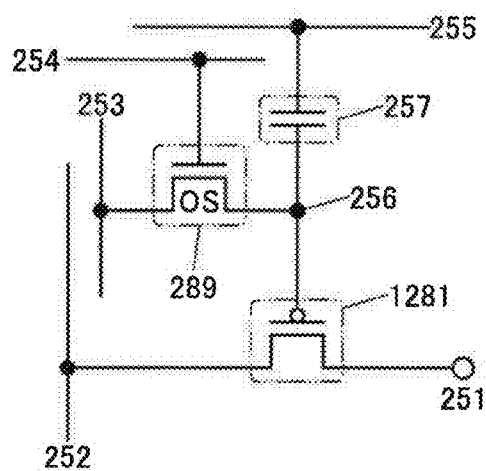
FIGS. 32A and 32B are circuit diagrams of a semiconductor device of one embodiment of the present invention.

The circuit illustrated in FIG. 32A has a configuration of a memory device in which one of a source and a drain of a transistor 289 is connected to a gate of a transistor 1281 and one electrode of a capacitor 257. The circuit illustrated in FIG. 32B has a configuration of a memory device in which one of the source and the drain of the transistor 289 is connected to one electrode of the capacitor 257.

Figure 32B:
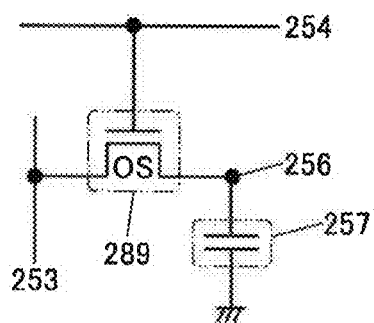

In each of the circuits illustrated in FIGS. 32A and 32B, charge injected from the other of the source and the drain of the transistor 289 can be stored at a node 256. The transistor 289 is an OS transistor, which enables charge to be stored at the node 256 for a long period.

Although the transistor 1281 is a p-channel transistor in FIG. 32A, the transistor 1281 may be an n-channel transistor. For example, the transistor 281 or the transistor 282 may be used as the transistor 1281. An OS transistor may also be used as the transistor 1281.

The semiconductor devices (memory devices) illustrated in FIGS. 32A and 32B are described here in detail.

The semiconductor device illustrated in FIG. 32A includes the transistor 1281 using a first semiconductor, the transistor 289 using a second semiconductor, and the capacitor 257.

The transistor 289 is one of the OS transistors disclosed in the above embodiment. Since the off-state current of the transistor 289 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 32A, a wiring 251 is electrically connected to one of a source and a drain of the transistor 1281, and a wiring 252 is electrically connected to the other of the source and the drain of the transistor 1281. A wiring 253 is electrically connected to the other of the source and the drain of the transistor 289. A wiring 254 is electrically connected to a gate of the transistor 289. The gate of the transistor 1281, the one of the source and the drain of the transistor 289, and the one electrode of the capacitor 257 are electrically connected to the node 256. A wiring 255 is electrically connected to the other electrode of the capacitor 257.

The semiconductor device in FIG. 32A has a feature that the charge supplied to the node 256 can be retained, and thus enables writing, retaining, and reading of data as follows.

[Writing and Retaining Operations]

Writing and retaining of data are described. First, the potential of the wiring 254 is set to a potential at which the transistor 289 is on. Accordingly, the potential of the wiring 253 is supplied to the node 256. That is, a predetermined charge is supplied to the node 256 (writing). Here, one of two kinds of charges providing different potential levels (hereinafter referred to as a "low-level charge" and a "high-level charge") is supplied. After that, the potential of the wiring 254 is set to a potential at which the transistor 289 is off. Thus, the charge is retained at the node 256.

Note that the high-level charge is a charge for supplying a higher potential to the node 256 than the low-level charge. In the case where the transistor 1281 is a p-channel transistor, each of the high-level and low-level charges is a charge for supplying a potential higher than the threshold voltage of the transistor. In the case where the transistor 1281 is an n-channel transistor, each of the high-level and low-level charges is a charge for supplying a potential lower than the threshold voltage of the transistor. In other words, each of the high-level and low-level charges is a charge for supplying a potential at which the transistor is off.

Since the off-state current of the transistor 289 is extremely low, the charge of the node 256 is retained for a long time.

[Reading Operation]

Next, reading of data is described. A reading potential $V_R$ is supplied to the wiring 255 while a predetermined potential (a constant potential) different from the potential of the wiring 252 is supplied to the wiring 251, whereby data retained at the node 256 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 255 in a period during which data is not read is set to a potential higher than $V_H$ in the case where the transistor 1281 is a p-channel transistor, and is set to a potential lower than $V_L$ in the case where the transistor 1281 is an n-channel transistor.

For example, in the case where the transistor 1281 is a p-channel transistor, $V_R$ is −2 V when $V_{th}$ of the transistor 1281 is −2 V, $V_H$ is 1 V, and $V_L$ is −1 V. When the potential written to the node 256 is $V_H$ and $V_R$ is applied to the wiring 255, $V_R+V_H$, i.e., −1 V, is applied to the gate of the transistor 1281. Since −1 V is higher than $V_{th}$, the transistor 1281 is not turned on. Thus, the potential of the wiring 252 is not changed. When the potential written to the node 256 is $V_L$ and $V_R$ is applied to the wiring 255, $V_R+V_L$, i.e., −3 V, is applied to the gate of the transistor 1281. Since −3 V is lower than $V_{th}$, the transistor 1281 is turned on. Thus, the potential of the wiring 252 is changed.

In the case where the transistor 1281 is an n-channel transistor, $V_R$ is 2 V when $V_{th}$ of the transistor 1281 is 2 V, $V_H$ is 1 V, and $V_L$ is −1 V. When the potential written to the node 256 is $V_H$ and $V_R$ is applied to the wiring 255, $V_R+V_H$, i.e., 3 V, is applied to the gate of the transistor 1281. Since 3 V is higher than $V_{th}$, the transistor 1281 is turned on. Thus, the potential of the wiring 252 is changed. When the potential written to the node 256 is $V_L$ and $V_R$ is applied to the wiring 255, $V_R+V_L$, i.e., 1 V, is applied to the gate of the transistor 1281. Since 1 V is lower than $V_{th}$, the transistor 1281 is not turned on. Thus, the potential of the wiring 252 is not changed.

By determining the potential of the wiring 252, data retained at the node 256 can be read.

The semiconductor device in FIG. 32B is different from the semiconductor device in FIG. 32A in that the transistor 1281 is not provided. Also in this case, data can be written and retained in a manner similar to that of the semiconductor device in FIG. 32A.

Reading of data in the semiconductor device in FIG. 32B is described. When a potential at which the transistor 289 is turned on is supplied to the wiring 254, the wiring 253 that is in a floating state and the capacitor 257 are brought into conduction, and the charge is redistributed between the wiring 253 and the capacitor 257. As a result, the potential of the wiring 253 is changed. The amount of change in the potential of the wiring 253 varies depending on the potential of the node 256 (or the charge accumulated in the node 256).

For example, the potential of the wiring 253 after the charge redistribution is $(C_B \times V_{B0}+C \times V)/(C_B+C)$, where V is the potential of the node 256, C is the capacitance of the capacitor 257, $C_B$ is the capacitance component of the wiring 253, and $V_{B0}$ is the potential of the wiring 253 before the charge redistribution. Thus, it can be found that, assuming that the memory cell is in either of two states in which the potential of the node 256 is $V_1$ and $V_0$ ($V_1 > V_0$), the potential of the wiring 253 in the case of retaining the potential $V_1$ ($=(C_B \times V_{B0}+C \times V_1)/(C_B+C)$) is higher than the potential of the wiring 253 in the case of retaining the potential $V_0$ ($=(C_B \times V_{B0}+C \times V_0)/(C_B+C)$).

Then, by comparing the potential of the wiring 253 with a predetermined potential, data can be read.

When including a transistor using an oxide semiconductor and having an extremely low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

[CPU]

Figure 33:
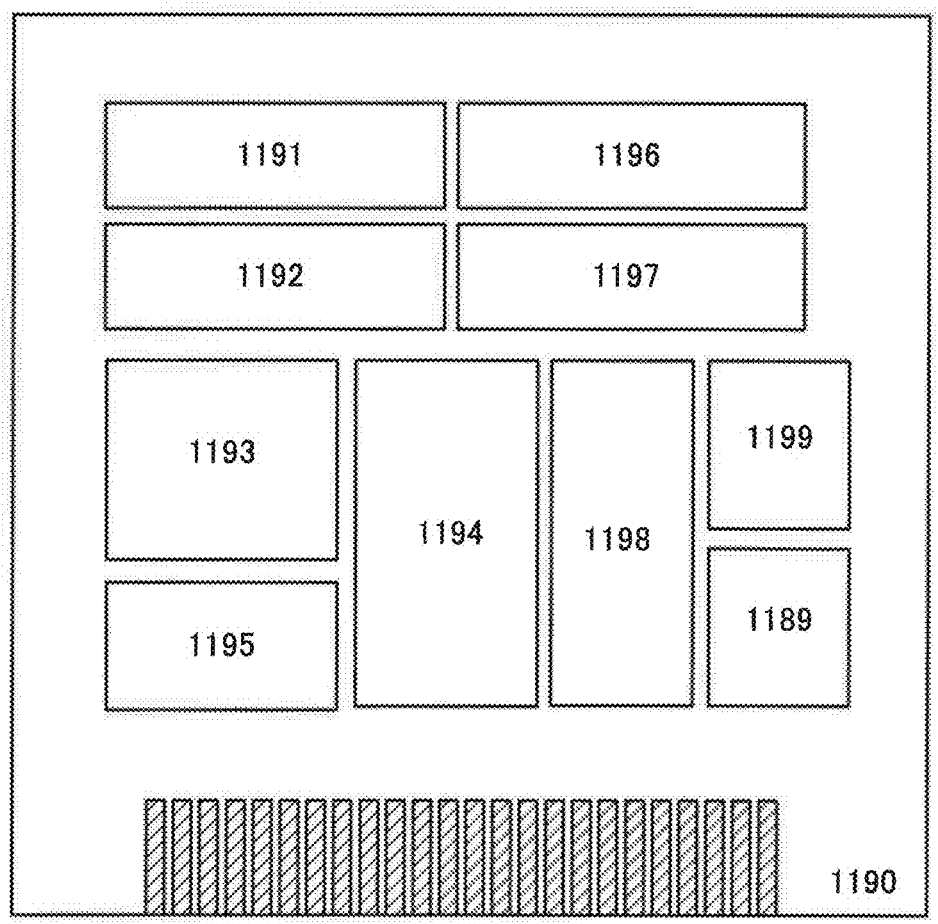
FIG. 33 is a block diagram illustrating a CPU configuration example.

In this embodiment, a CPU is described as an example of a semiconductor device including any of the above-described transistors. FIG. 33 is a block diagram illustrating a configuration example of a CPU including any of the above-described transistors as a component.

The CPU illustrated in FIG. 33 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 33 is just an example in which the configuration is simplified, and an actual CPU may have a variety of configurations depending on the application. For example, the CPU may have the following configuration: a structure including the CPU illustrated in FIG. 33 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 33, a memory cell is provided in the register 1196. For the memory cell of the register 1196, any of the above-described transistors, the above-described memory device, or the like can be used.

In the CPU illustrated in FIG. 33, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to a memory element in the register 1196. When data retaining by the capacitor is selected, the data is rewritten in the capacitor, and supply of power supply voltage to the memory cell in the register 1196 can be stopped.

Figure 34:
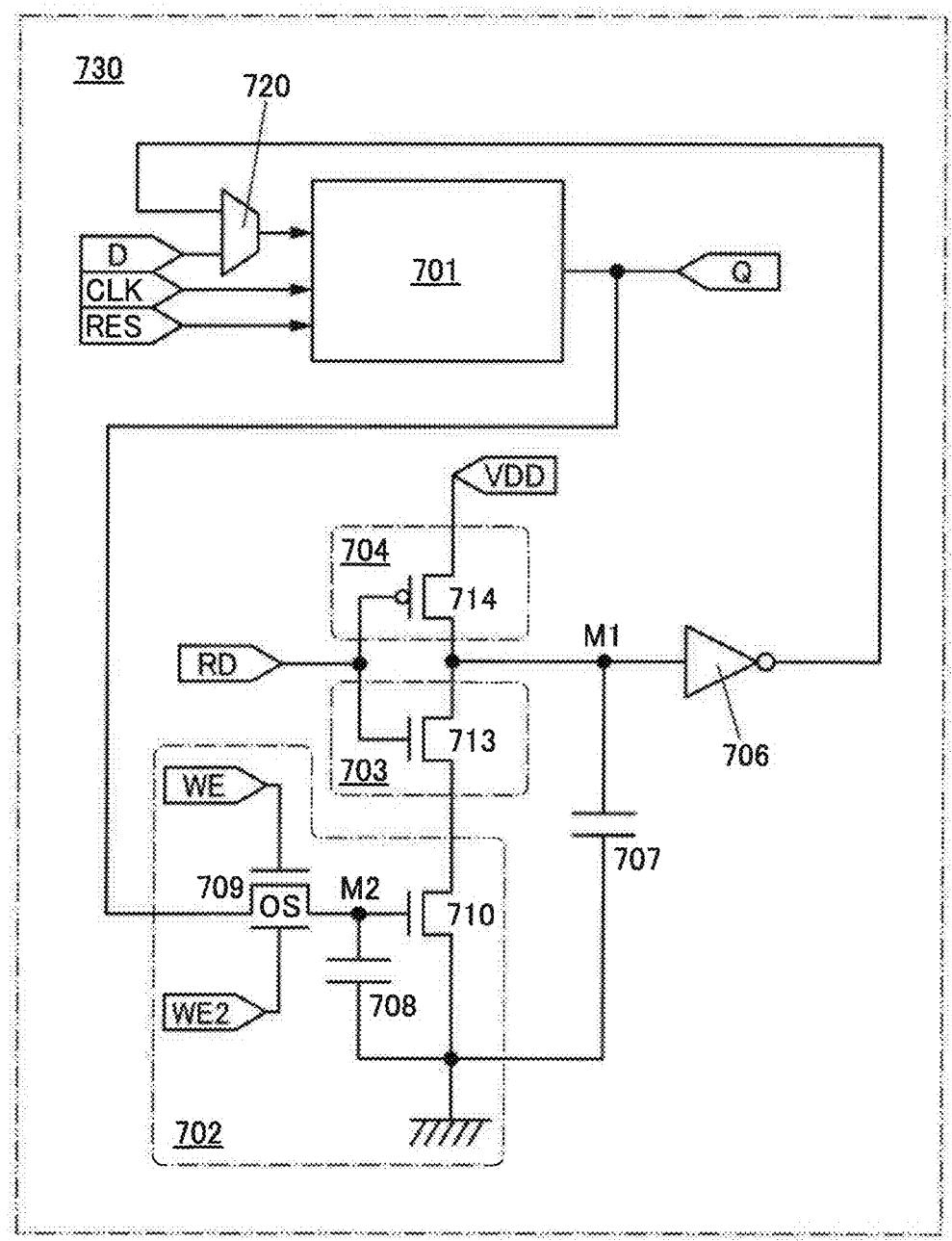
FIG. 34 is a circuit diagram illustrating an example of a memory element.

FIG. 34 is an example of a circuit diagram of a memory element that can be used as the register 1196. A memory element 730 includes a circuit 701 in which stored data is volatile when power supply is stopped, a circuit 702 in which stored data is nonvolatile even when power supply is stopped, a switch 703, a switch 704, a logic element 706, a capacitor 707, and a circuit 720 having a selecting function. The circuit 702 includes a capacitor 708, a transistor 709, and a transistor 710. Note that the memory element 730 may further include another element such as a diode, a resistor, or an inductor, as needed.

Here, the above-described memory device can be used as the circuit 702. When supply of a power supply voltage to the memory element 730 is stopped, a ground potential (0 V) or a potential at which the transistor 709 in the circuit 702 is turned off continues to be input to a gate of the transistor 709. For example, the gate of the transistor 709 is grounded through a load such as a resistor.

Shown here is an example in which the switch 703 is a transistor 713 having one conductivity type (e.g., an n-channel transistor) and the switch 704 is a transistor 714 having a conductivity type opposite to the one conductivity type (e.g., a p-channel transistor). A first terminal of the switch 703 corresponds to one of a source and a drain of the transistor 713, a second terminal of the switch 703 corresponds to the other of the source and the drain of the transistor 713, and conduction or non-conduction between the first terminal and the second terminal of the switch 703 (i.e., the on/off state of the transistor 713) is selected by a control signal RD input to a gate of the transistor 713. A first terminal of the switch 704 corresponds to one of a source and a drain of the transistor 714, a second terminal of the switch 704 corresponds to the other of the source and the drain of the transistor 714, and conduction or non-conduction between the first terminal and the second terminal of the switch 704 (i.e., the on/off state of the transistor 714) is selected by the control signal RD input to a gate of the transistor 714.

One of a source and a drain of the transistor 709 is electrically connected to one of a pair of electrodes of the capacitor 708 and a gate of the transistor 710. Here, the connection portion is referred to as a node M2. One of a source and a drain of the transistor 710 is electrically connected to a wiring that can supply a low power supply potential (e.g., a GND line), and the other thereof is electrically connected to the first terminal of the switch 703 (the one of the source and the drain of the transistor 713). The second terminal of the switch 703 (the other of the source and the drain of the transistor 713) is electrically connected to the first terminal of the switch 704 (the one of the source and the drain of the transistor 714). The second terminal of the switch 704 (the other of the source and the drain of the transistor 714) is electrically connected to a wiring that can supply a power supply potential VDD. The second terminal of the switch 703 (the other of the source and the drain of the transistor 713), the first terminal of the switch 704 (the one of the source and the drain of the transistor 714), an input terminal of the logic element 706, and one of a pair of electrodes of the capacitor 707 are electrically connected to each other. Here, the connection portion is referred to as a node M1. The other of the pair of electrodes of the capacitor 707 can be supplied with a constant potential. For example, the other of the pair of electrodes of the capacitor 707 can be supplied with a low power supply potential (e.g., GND) or a high power supply potential (e.g., VDD). The other of the pair of electrodes of the capacitor 707 is electrically connected to the wiring that can supply a low power supply potential (e.g., a GND line). The other of the pair of electrodes of the capacitor 708 can be supplied with a constant potential. For example, the other of the pair of electrodes of the capacitor 708 can be supplied with a low power supply potential (e.g., GND) or a high power supply potential (e.g., VDD). The other of the pair of electrodes of the capacitor 708 is electrically connected to the wiring that can supply a low power supply potential (e.g., a GND line).

The capacitors 707 and 708 are not necessarily provided as long as the parasitic capacitance of the transistor, the wiring, or the like is actively utilized.

A control signal WE is input to the gate electrode of the transistor 709. As for each of the switches 703 and 704, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 701 is input to the other of the source and the drain of the transistor 709. FIG. 34 illustrates an example in which a signal output from the circuit 701 is input to the other of the source and the drain of the transistor 709. The logic value of a signal output from the second terminal of the switch 703 (the other of the source and the drain of the transistor 713) is inverted by the logic element 706, and the inverted signal is input to the circuit 701 through the circuit 720.

In the example of FIG. 34, a signal output from the second terminal of the switch 703 (the other of the source and the drain of the transistor 713) is input to the circuit 701 through the logic element 706 and the circuit 720; however, one embodiment of the present invention is not limited thereto. The signal output from the second terminal of the switch 703 (the other of the source and the drain of the transistor 713) may be input to the circuit 701 without its logic value being inverted. For example, in the case where the circuit 701 includes a node in which a signal obtained by inversion of the logic value of a signal input from the input terminal is retained, the signal output from the second terminal of the switch 703 (the other of the source and the drain of the transistor 713) can be input to the node.

As the transistor 709 in FIG. 34, the transistor 150 described in Embodiment 1 can be used. The control signal WE can be input to the gate electrode and a control signal WE2 can be input to the back gate electrode. The control signal WE2 is a signal having a constant potential. As the constant potential, for example, a ground potential GND or a potential lower than a source potential of the transistor 709 is selected. The control signal WE2 is a potential signal for controlling the threshold voltage of the transistor 709, and a drain current of the transistor 709 at a gate voltage of 0 V can be further reduced. Note that as the transistor 709, a transistor without a second gate may be used.

In FIG. 34, the transistors included in the memory element 730 except for the transistor 709 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, all the transistors in the memory element 730 may be transistors in which a channel is formed in an oxide semiconductor layer. Further alternatively, in the memory element 730, a transistor in which a channel is formed in an oxide semiconductor layer and a transistor in which a channel is formed in a layer formed using a semiconductor other than an oxide semiconductor or in the substrate 1190 can be used in combination as the transistors other than the transistor 709.

As the circuit 701 in FIG. 34, for example, a flip-flop circuit can be used. As the logic element 706, for example, an inverter or a clocked inverter can be used.

In a period during which the memory element 730 is not supplied with the power supply voltage, the semiconductor device of one embodiment of the present invention can retain data stored in the circuit 701 at the node M2 by the capacitor 708 that is provided in the circuit 702.

As described above, the off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 709, a signal retained by the capacitor 708 is retained for a long time also in a period during which the power supply voltage is not supplied to the memory element 730. The memory element 730 can accordingly retain the stored content (data) also in a period during which the supply of the power supply voltage is stopped.

Since the switches 703 and 704 are provided, the time required for the circuit 701 to retain original data again after the supply of the power supply voltage is restarted can be shortened.

In the circuit 702, a signal retained at the node M2 is input to the gate of the transistor 710. Therefore, after supply of the power supply voltage to the memory element 730 is restarted, the signal retained at the node M2 can be converted into the one corresponding to the state (the on state or the off state) of the transistor 710 to be read from the circuit 702. Consequently, an original signal can be accurately read even when a potential corresponding to the signal retained at the node M2 varies to some degree.

By applying the above-described memory element 730 to a memory device such as a register or a cache memory included in the CPU, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time at an increased frequency in the CPU or one or a plurality of logic circuits included in the CPU, resulting in lower power consumption.

Although the memory element 730 is used in a CPU in this embodiment, the memory element 730 can also be used in an LSI such as a digital signal processor (DSP), a custom LSI, or a programmable logic device (PLD), and a radio frequency (RF) tag.

[Imaging Device]

An imaging device is described as an example of a semiconductor device including any of the above-described transistors.

<Configuration Example of Imaging Device 600>

Figure 35A:
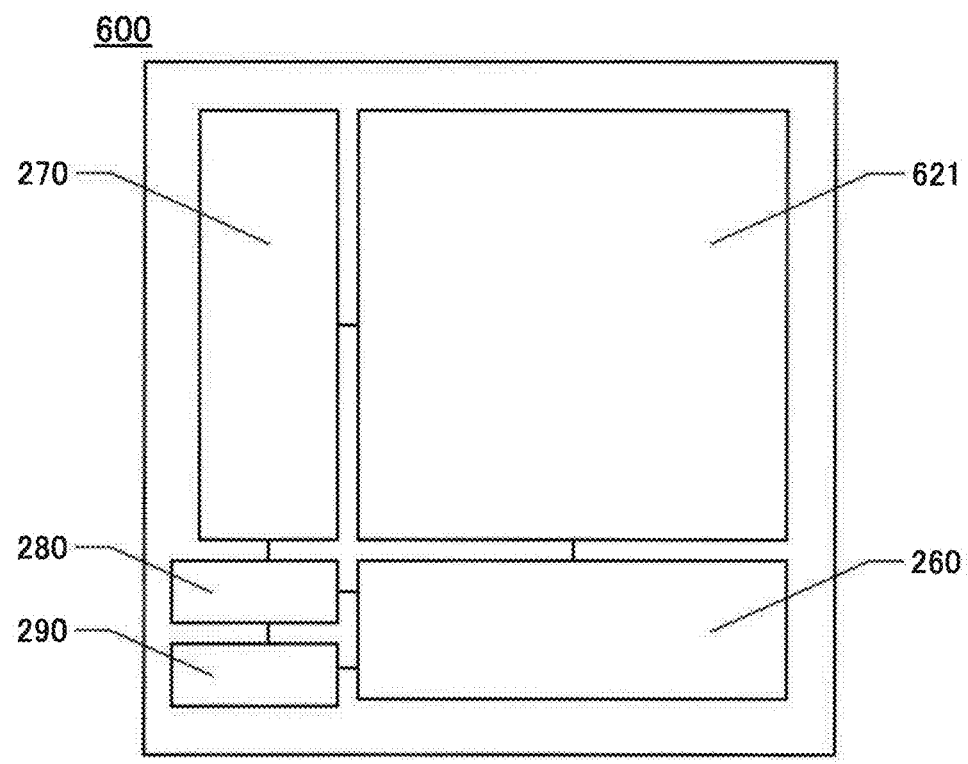
FIGS. 35A and 35B illustrate an example of an imaging device.

FIG. 35A is a plan view illustrating a configuration example of an imaging device 600. The imaging device 600 includes a pixel portion 621, a first circuit 260, a second circuit 270, a third circuit 280, and a fourth circuit 290. In this specification and the like, the first circuit 260 to the fourth circuit 290 and the like may be referred to as "peripheral circuit" or "driving circuit". For example, the first circuit 260 can be regarded as part of the peripheral circuit.

Figure 35B:
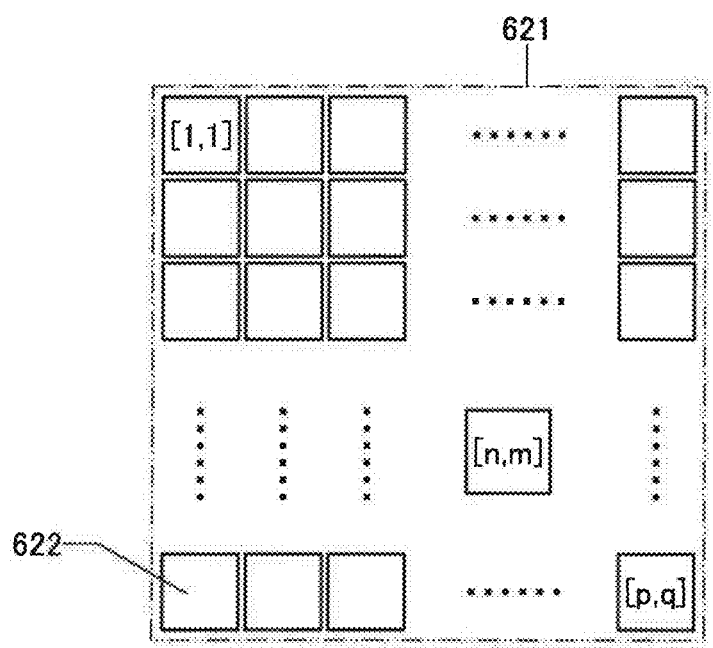

FIG. 35B illustrates a structure example of the pixel portion 621. The pixel portion 621 includes a plurality of pixels 622 (imaging element) arranged in a matrix with p rows and q columns (p and q are each a natural number greater than or equal to 2). Note that in FIG. 35B, n is a natural number of greater than or equal to 1 and smaller than or equal to p, and m is a natural number of greater than or equal to 1 and smaller than or equal to q.

For example, using the pixels 622 arranged in a matrix of 1920×1080, the imaging device 600 can take an image with "full high definition" (also referred to as "2K resolution", "2K1K", "2K", and the like). Using the pixels 622 arranged in a matrix of 4096×2160, the imaging device 600 can take an image with "ultra high definition" (also referred to as "4K resolution", "4K2K", "4K", and the like). Using the pixels 622 arranged in a matrix of 8192×4320, the imaging device 600 can take an image with "super high definition" (also referred to as "8K resolution", "8K4K", "8K", and the like). Using a larger number of display elements, the imaging device 600 can take an image with 16K or 32K resolution.

The first circuit 260 and the second circuit 270 are connected to the plurality of pixels 622 and have a function of supplying signals for driving the plurality of pixels 622. The first circuit 260 may have a function of processing an analog signal output from the pixels 622. The third circuit 280 may have a function of controlling the operation timing of the peripheral circuit. For example, the third circuit 280 may have a function of generating a clock signal. Furthermore, the third circuit 280 may have a function of converting the frequency of a clock signal supplied from the outside. Moreover, the third circuit 280 may have a function of supplying a reference potential signal (e.g., a ramp wave signal).

The peripheral circuit includes at least one of a logic circuit, a switch, a buffer, an amplifier circuit, and a converter circuit. Alternatively, transistors or the like included in the peripheral circuit may be formed using part of a semiconductor that is formed to fabricate an after-mentioned pixel driver circuit 610. Part or the whole of the peripheral circuit may be mounted using a semiconductor device such as an IC.

Note that in the peripheral circuit, at least one of the first circuit 260 to the fourth circuit 290 may be omitted. For example, when one of the first circuit 260 and the fourth circuit 290 additionally has a function of the other of the first circuit 260 and the fourth circuit 290, the other of the first circuit 260 and the fourth circuit 290 may be omitted. For another example, when one of the second circuit 270 and the third circuit 280 additionally has a function of the other of the second circuit 270 and the third circuit 280, the other of the second circuit 270 and the third circuit 280 may be omitted. For further another example, a function of another peripheral circuit may be added to one of the first circuit 260 to the fourth circuit 290 to omit that peripheral circuit.

Figure 36:
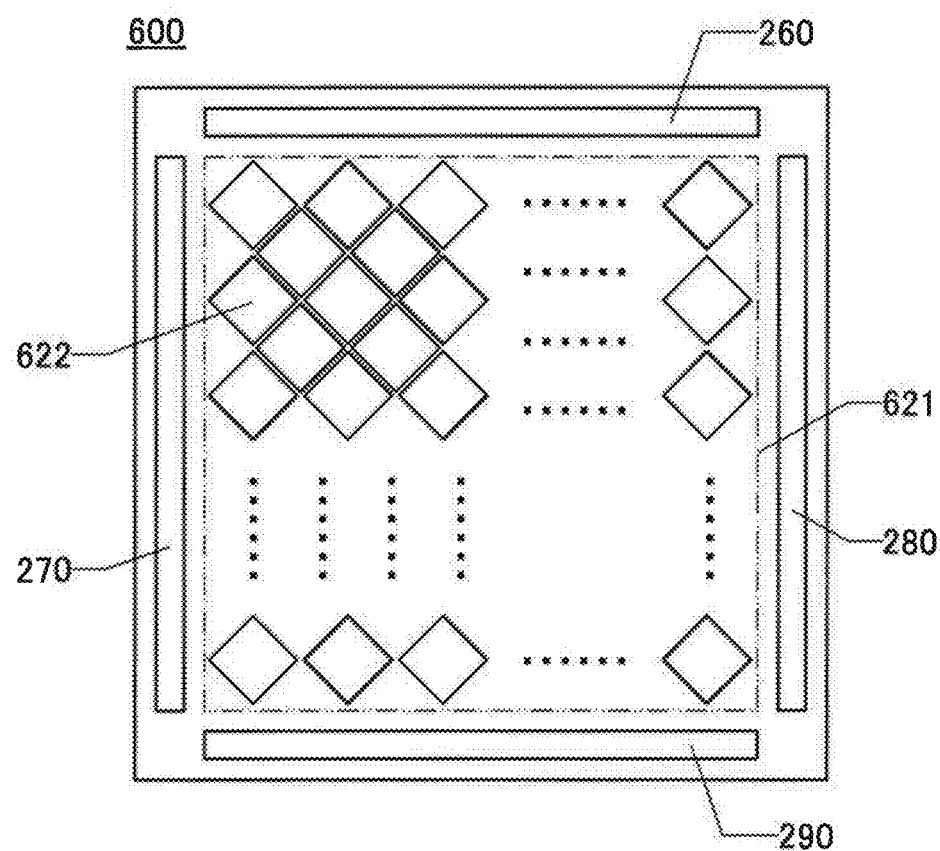
FIG. 36 illustrates an example of an imaging device.

As illustrated in FIG. 36, the first circuit 260 to the fourth circuit 290 may be provided along the periphery of the pixel portion 621. In the pixel portion 621 included in the imaging device 600, the pixels 622 may be obliquely arranged. When the pixels 622 are obliquely arranged, the distance between pixels (pitch) can be shortened in the row direction and the column direction. Accordingly, the quality of an image taken with the imaging device 600 can be improved.

Figure 37A:
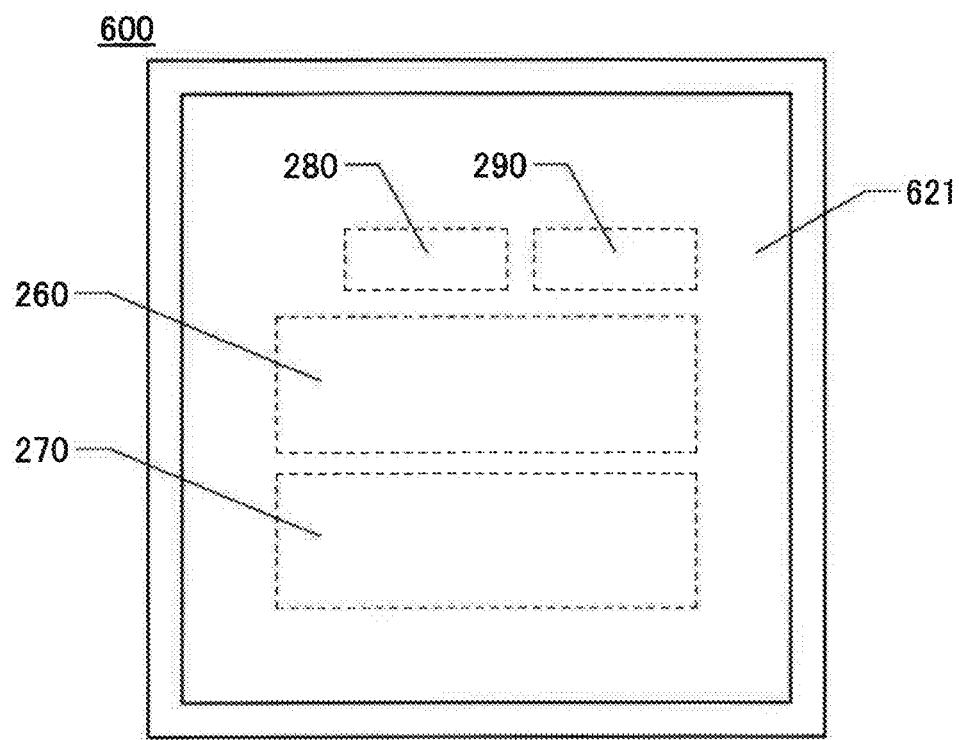
FIGS. 37A and 37B illustrate an example of an imaging device.
Figure 37B:
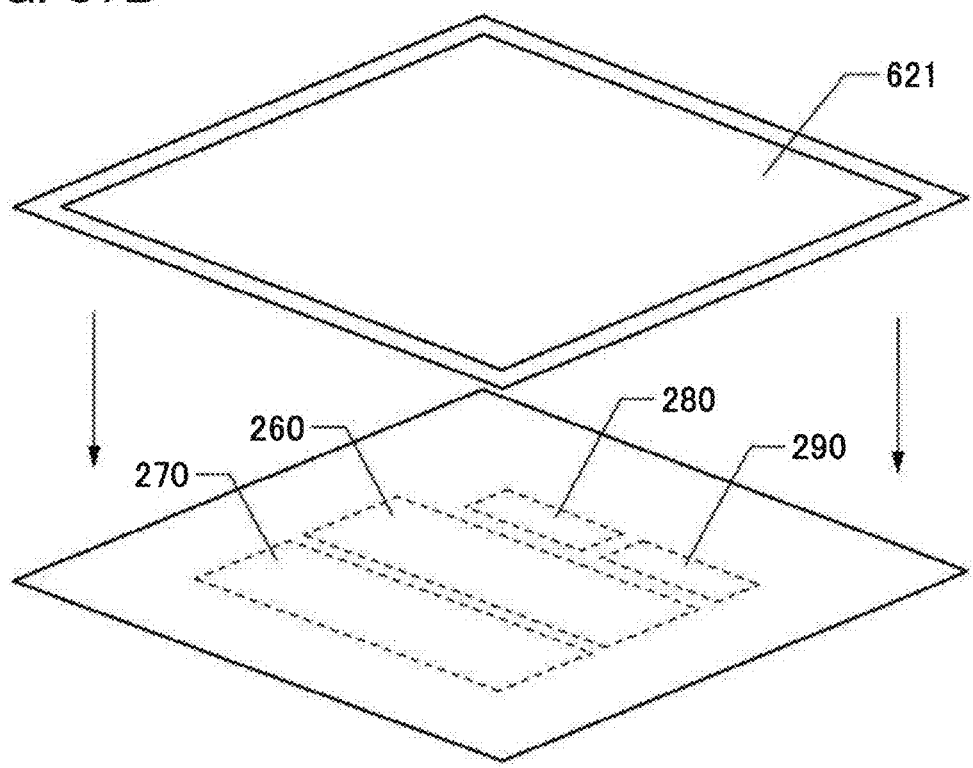

As illustrated in FIGS. 37A and 37B, the pixel portion 621 may be provided over the first circuit 260 to the fourth circuit 290 to overlap with the first circuit 260 to the fourth circuit 290. FIG. 37A is a top view of the imaging device 600 in which the pixel portion 621 is provided over the first circuit 260 to the fourth circuit 290 to overlap with the first circuit 260 to the fourth circuit 290. FIG. 37B is a perspective view illustrating the structure of the imaging device 600 illustrated in FIG. 37A.

The provision of the pixel portion 621 over the first circuit 260 to the fourth circuit 290 to overlap with the first circuit 260 to the fourth circuit 290 can increase the area occupied by the pixel portion 621 for the imaging device 600. Accordingly, the light sensitivity, the dynamic range, the resolution, the reproducibility of a taken image, or the integration degree of the imaging device 600 can be increased.

[Color Filter and the Like]

The pixels 622 included in the imaging device 600 are used as subpixels, and each of the plurality of pixels 622 is provided with a filter that transmits light in a different wavelength range (color filter), whereby data for achieving color image display can be obtained.

Figure 38A:
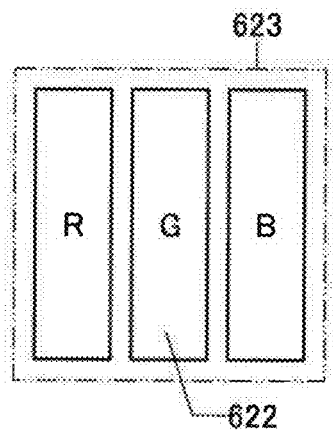
FIGS. 38A to 38D illustrate structure examples of a pixel.

FIG. 38A is a plan view showing an example of a pixel 623 with which a color image is obtained. In FIG. 38A, the pixel 622 provided with a color filter that transmits light in a red (R) wavelength range (also referred to as "pixel 622R"), the pixel 622 provided with a color filter that transmits light in a green (G) wavelength range (also referred to as "pixel 622G"), and the pixel 622 provided with a color filter that transmits light in a blue (B) wavelength range (also referred to as "pixel 622B") are provided. The pixel 622R, the pixel 622G, and the pixel 622B collectively function as one pixel 623.

The color filter used in the pixel 622 is not limited to red (R), green (G), and blue (B) color filters, and color filters that transmit light of cyan (C), yellow (Y), and magenta (M) may be used. The pixels 622 that sense light in at least three different wavelength ranges are provided in one pixel 623, whereby a full-color image can be obtained.

Figure 38B:
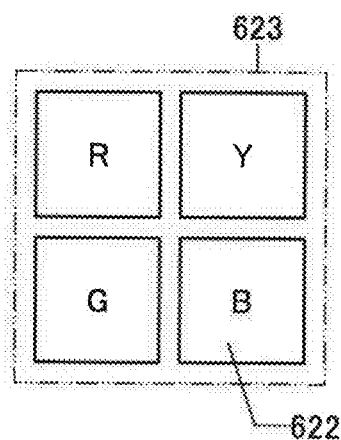
Figure 38C:
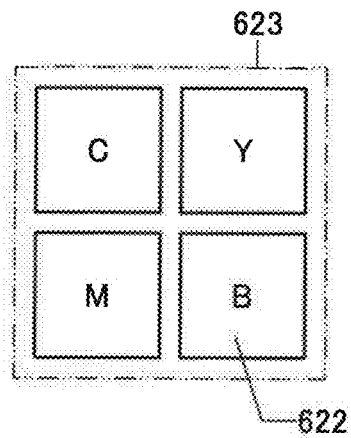

FIG. 38B illustrates the pixel 623 including the pixel 622 provided with a color filter that transmits yellow (Y) light, in addition to the pixels 622 provided with the color filters that transmit red (R), green (G), and blue (B) light. FIG. 38C illustrates the pixel 623 including the pixel 622 provided with a color filter that transmits blue (B) light, in addition to the pixels 622 provided with the color filters that transmit cyan (C), yellow (Y), and magenta (M) light. When the pixels 622 that sense light in four or more different wavelength ranges are provided in one pixel 623, the reproducibility of colors of an obtained image can be increased.

Figure 38D:
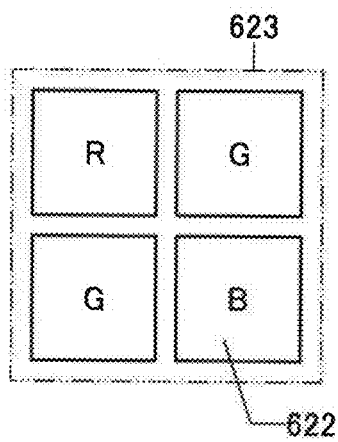

The pixel number ratio (or the ratio of light receiving area) of the pixel 622R to the pixel 622G and the pixel 622B is not necessarily be 1:1:1. The pixel number ratio (the ratio of light receiving area) of red to green and blue may be 1:2:1 (Bayer arrangement), as illustrated in FIG. 38D. Alternatively, the pixel number ratio (the ratio of light receiving area) of red to green and blue may be 1:6:1.

Although the number of pixels 622 used in the pixel 623 may be one, two or more is preferable. For example, when two or more pixels 622 that sense light in the same wavelength range are provided, the redundancy is increased, and the reliability of the imaging device 600 can be increased.

When an infrared (IR) filter that transmits infrared light and absorbs or reflects light in a wavelength shorter than or equal to that of visible light is used as the filter, the imaging device 600 that detects infrared light can be achieved. Alternatively, when an ultra violet (UV) filter that transmits ultraviolet light and absorbs or reflects light in a wavelength longer than or equal to visible light is used as the filter, the imaging device 600 that detects ultraviolet light can be achieved. Alternatively, when a scintillator that turns a radiant ray into ultraviolet light or visible light is used as the filter, the imaging device 600 can be used as a radiation detector that detects an X-ray or a γ-ray.

When a neutral density (ND) filter (dimming filter) is used as the filter, a phenomenon of output saturation, which is caused when an excessive amount of light enters a photoelectric conversion element (light-receiving element), can be prevented. With a combination of ND filters with different dimming capabilities, the dynamic range of the imaging device can be increased.

Figure 39A:
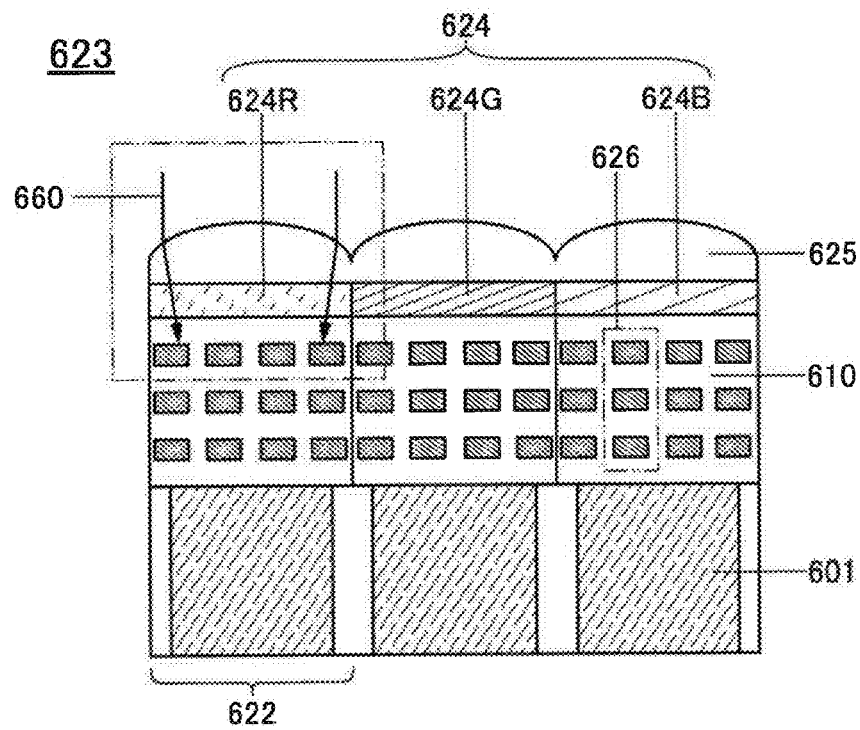
FIGS. 39A and 39B illustrate structure examples of a pixel.

Besides the above-described filter, the pixel 622 may be provided with a lens. An arrangement example of the pixel 622, the filter 624, and a lens 625 is described with reference to cross-sectional views in FIGS. 39A and 39B. With the lens 625, incident light can be efficiently received by a photoelectric conversion element. Specifically, as illustrated in FIG. 39A, light 660 enters the photoelectric conversion element 601 through the lens 625, the filter 624 (a filter 624R, a filter 624G, or a filter 624B), a pixel driver circuit 610, and the like formed in the pixel 622.

Figure 39B:
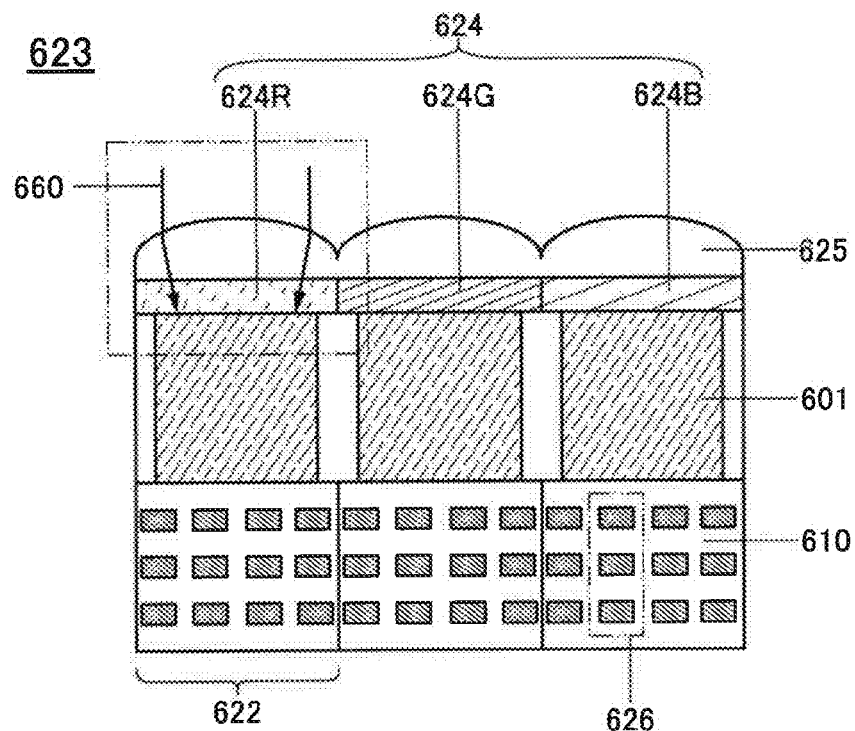

However, as illustrated in a region surrounded by the two-dot chain line, part of light 660 indicated by the arrows may be blocked by part of a wiring group 626, such as a transistor and/or a capacitor. Thus, a structure in which the lens 625 and the filter 624 are provided on the photoelectric conversion element 601 side, as illustrated in FIG. 39B, may be employed such that the incident light is efficiently received by the photoelectric conversion element 601. When the light 660 is incident on the photoelectric conversion element 601 side, the imaging device 600 with high light sensitivity can be provided.

Figure 40A:
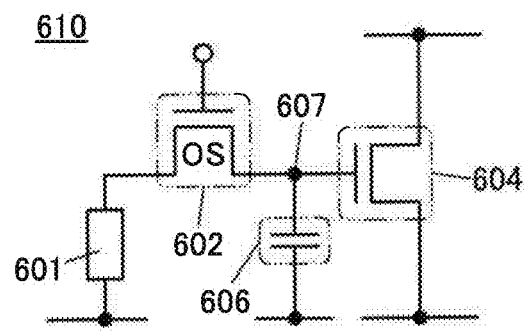
FIGS. 40A to 40C are circuit diagrams illustrating examples of an imaging device.
Figure 40B:
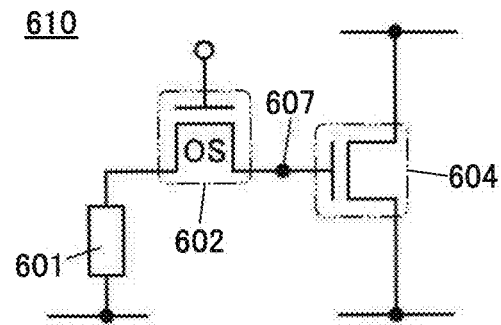
Figure 40C:
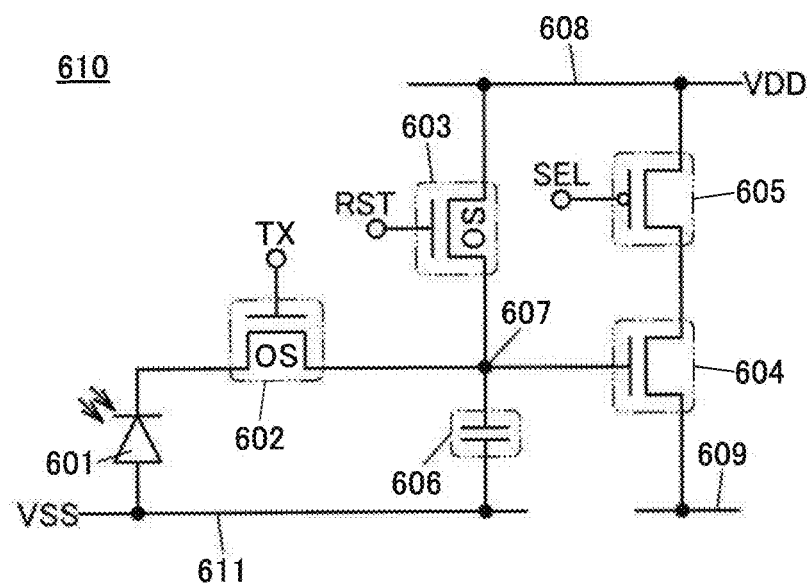

FIGS. 40A to 40C illustrate examples of the pixel driver circuit 610 that can be used for the pixel portion 621. The pixel driver circuit 610 illustrated in FIG. 40A includes a transistor 602, a transistor 604, and a capacitor 606 and is connected to a photoelectric conversion element 601. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor is extremely low, the capacitor 606 can be small. Alternatively, the capacitor 606 can be omitted as illustrated in FIG. 40B. Furthermore, when the transistor 602 is an OS transistor, the potential of the node 607 is less likely to be changed. Thus, an imaging device that is less likely to be affected by noise can be provided. Not that the transistor 604 may be an OS transistor.

A diode element formed using a silicon substrate with a PN junction or a PIN junction can be used as the photoelectric conversion element 601. Alternatively, a PIN diode element formed using an amorphous silicon film, a microcrystalline silicon film, or the like may be used. Alternatively, a diode-connected transistor may be used. Further alternatively, a variable resistor or the like utilizing a photoelectric effect may be formed using silicon, germanium, selenium, or the like.

The photoelectric conversion element may be formed using a material capable of generating electric charge by absorbing radiation. Examples of the material capable of generating electric charge by absorbing radiation include lead iodide, mercury iodide, gallium arsenide, CdTe, and CdZn.

The pixel driver circuit 610 illustrated in FIG. 40C includes the transistor 602, the transistor 603, the transistor 604, the transistor 605, and the capacitor 606 and is connected to the photoelectric conversion element 601. In the pixel driver circuit 610 illustrated in FIG. 40C, a photodiode is used as the photoelectric conversion element 601. One of the source and the drain of the transistor 602 is electrically connected to a cathode of the photoelectric conversion element 601. The other of the source and the drain of the transistor 602 is electrically connected to the node 607. An anode of the photoelectric conversion element 601 is electrically connected to a wiring 611. One of a source and a drain of the transistor 603 is electrically connected to the node 607. The other of the source and the drain of the transistor 603 is electrically connected to a wiring 608. The gate of the transistor 604 is electrically connected to the node 607. One of a source and a drain of the transistor 604 is electrically connected to a wiring 609. The other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607. The other electrode of the capacitor 606 is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, VDD is supplied to the wiring 608 and VSS is supplied to the wiring 611.

Next, operations of the pixel driver circuit 610 illustrated in FIG. 40C are described. First, the transistor 603 is turned on so that VDD is supplied to the node 607 (reset operation). Then, the transistor 603 is turned off so that VDD is retained at the node 607. Next, the transistor 602 is turned on so that the potential of the node 607 is changed in accordance with the amount of light received by the photoelectric conversion element 601 (accumulation operation). After that, the transistor 602 is turned off so that the potential of the node 607 is retained. Next, the transistor 605 is turned on so that a potential corresponding to the potential of the node 607 is output to the wiring 609 (selection operation). Measuring the potential of the wiring 609 can determine the amount of light received by the photoelectric conversion element 601.

An OS transistor is preferably used as each of the transistors 602 and 603. Since the off-state current of the OS transistor is extremely low as described above, the capacitor 606 can be small or omitted. Furthermore, when the transistors 602 and 603 are OS transistors, the potential of the node 607 is less likely to be changed. Thus, an imaging device that is less likely to be affected by noise can be provided.

A high-resolution imaging device can be obtained when the pixels 622 including any of the pixel driver circuits 610 illustrated in FIGS. 40A to 40C are arranged in a matrix.

For example, using the pixel driver circuits 610 arranged in a 1920×1080 matrix, an imaging device that can take an image with "full high definition" (also referred to as "2K resolution", "2K1K", "2K", and the like) can be obtained. Using the pixel driver circuits 610 arranged in a 4096×2160 matrix, an imaging device that can take an image with "ultra high definition" (also referred to as "4K resolution", "4K2K", "4K", and the like) can be obtained. Using the pixel driver circuits 610 arranged in a 8192×4320 matrix, an imaging device that can take an image with "super high definition" (also referred to as "8K resolution", "8K4K", "8K", and the like) can be obtained. Using a larger number of pixel driver circuits 610, an imaging device that can take an image with 16K or 32K resolution can be obtained.

Figure 41:
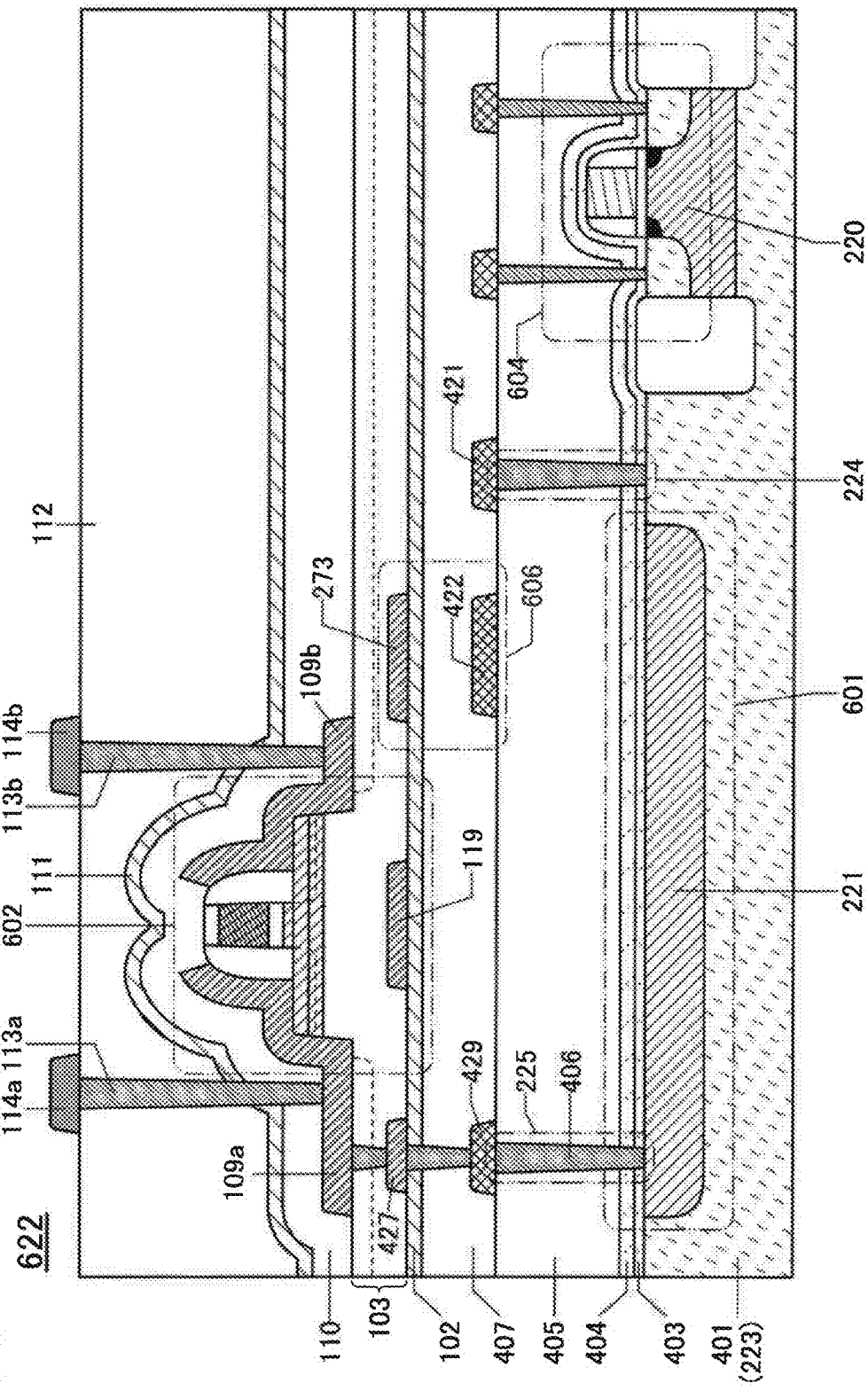
FIG. 41 is a cross-sectional view illustrating a structure example of an imaging device.

FIG. 41 illustrates a structure example of the pixel 622 including any of the above-described transistors. FIG. 41 is a cross-sectional view of part of the pixel 622.

In the pixel 622 illustrated in FIG. 41, an n-type semiconductor is used for the substrate 401. A p-type semiconductor 221 of the photoelectric conversion element 601 is provided in the substrate 401. Part of the substrate 401 functions as an n-type semiconductor 223 of the photoelectric conversion element 601.

The transistor 604 is provided on the substrate 401. The transistor 604 can function as an n-channel transistor. A well 220 of a p-type semiconductor is provided in part of the substrate 401. The well 220 can be provided by a method similar to that for forming the p-type semiconductor 221. The well 220 and the p-type semiconductor 221 can be formed at the same time. Note that the transistor 282 described above can be used as the transistor 604, for example.

The insulating layer 403, the insulating layer 404, and the insulating layer 405 are formed over the photoelectric conversion element 601 and the transistor 604. In a region of the insulating layers 403 to 405 that overlaps with the substrate 401 (the n-type semiconductor 223), an opening 224 is formed, and in a region of the insulating layers 403 to 405 that overlaps with the p-type semiconductor 221, an opening 225 is formed. Contact plugs 406 are formed in the opening 224 and the opening 225. The contact plugs 406 can be provided in a manner similar to that of the above-described contact plug 113a. The number of openings (224 and 225) to be formed or their arrangement are not particularly limited. Thus, an imaging device with high layout flexibility can be provided.

An electrode 421, an electrode 422, and an electrode 429 are formed over the insulating layer 405. The electrode 421 is electrically connected to the n-type semiconductor 223 (the substrate 401) via the contact plug 406 provided in the opening 224. The electrode 429 is electrically connected to the p-type semiconductor 221 via the contact plug 406 provided in the opening 225. The electrode 422 can function as one electrode of the capacitor 606.

The insulating layer 407 is formed so as to cover the electrode 421, the electrode 429, and the electrode 422. The insulating layer 407 can be formed using a material and a method that are similar to those of the insulating layer 405. A surface of the insulating layer 407 may be subjected to CMP treatment. By the CMP treatment, unevenness of the surface can be reduced, and coverage with an insulating layer or a conductive layer formed later can be increased. The electrode 421, the electrode 422, and the electrode 429 can be formed using a material and a method that are similar to those of the above-described electrode 114a.

The insulating layer 102 is formed over the insulating layer 407, and an electrode 427, the electrode 119, and an electrode 273 are formed over the insulating layer 102. The electrode 427 is electrically connected to the electrode 429 through a contact plug. The electrode 119 can function as a back gate of the transistor 602. The electrode 273 can function as the other electrode of the capacitor 606. As the transistor 602, the transistor 160 described above can be used, for example.

The electrode 109a is electrically connected to the electrode 427 through a contact plug.

Modification Example 1

Figure 42:
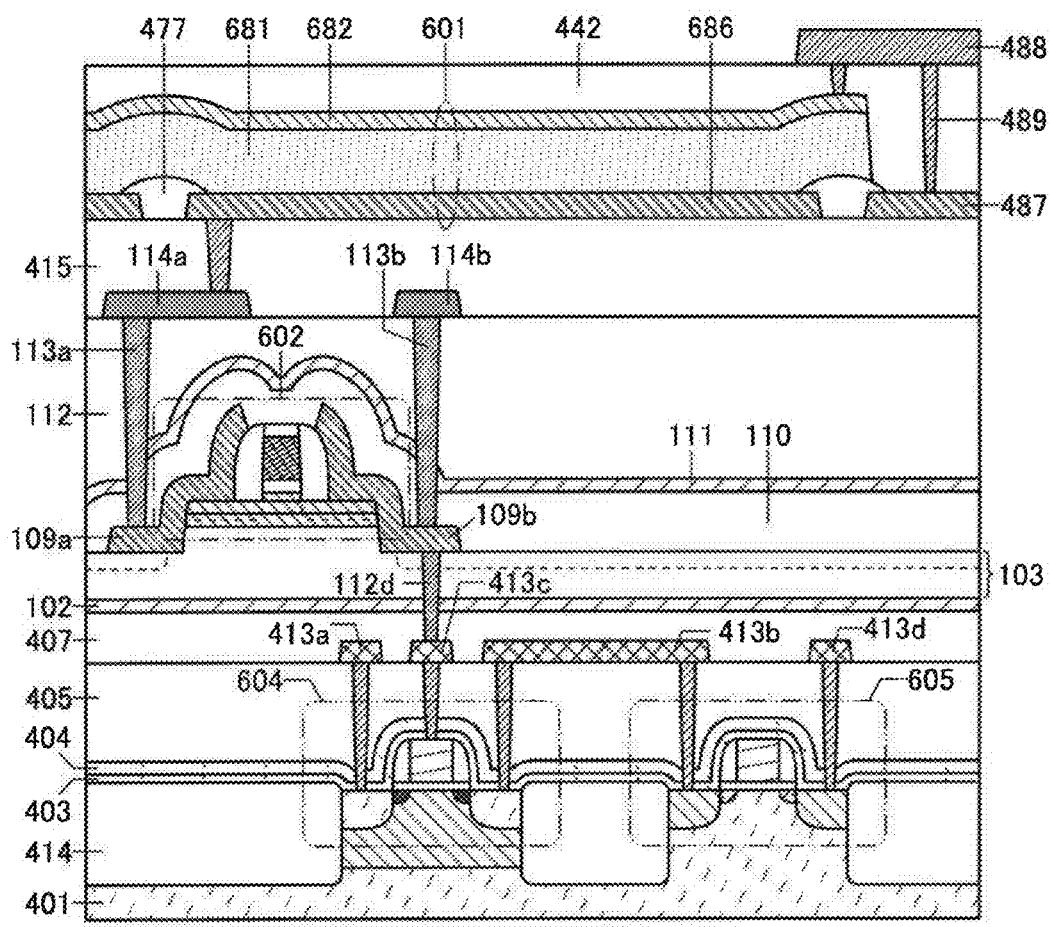
FIG. 42 is a cross-sectional view illustrating a structure example of an imaging device.

FIG. 42 illustrates a structure example of the pixel 622 that is different from that in FIG. 41. FIG. 42 is a cross-sectional view illustrating part of the pixel 622.

In the pixel 622 illustrated in FIG. 42, the transistors 604 and 605 are provided on the substrate 401. The transistor 604 can function as an n-channel transistor. The transistor 605 can function as a p-channel transistor. Note that the transistor 282 described above can be used as the transistor 604, for example. The transistor 281 described above can be used as the transistor 605, for example.

The electrode 413a, the electrode 413b, the electrode 403c, and an electrode 413d are formed over the insulating layer 405. The electrode 413a is electrically connected to one of the source and the drain of the transistor 604, and the electrode 413b is electrically connected to the other of the source and the drain of the transistor 604. The electrode 413c is electrically connected to the gate of the transistor 604. The electrode 413b is electrically connected to one of the source and the drain of the transistor 605, and the electrode 413d is electrically connected to the other of the source and the drain of the transistor 605.

The electrode 109b and the electrode 413c are electrically connected to each other through the contact plug 112d. An insulating layer 415 is formed over the electrode 114a, the electrode 114b, and the insulating layer 112. The insulating layer 415 can be formed using a material and a method that are similar to those of the insulating layer 111.

In the pixel 622 illustrated in FIG. 42, the photoelectric conversion element 601 is provided over the insulating layer 415. An insulating layer 442 is provided over the photoelectric conversion element 601, and an electrode 488 is provided over the insulating layer 442. The insulating layer 442 can be formed using a material and a method that are similar to those of the insulating layer 415.

The photoelectric conversion element 601 illustrated in FIG. 42 includes a photoelectric conversion layer 681 between an electrode 686 formed with a metal material or the like and a light-transmitting conductive layer 682. FIG. 42 illustrates the photoelectric conversion element 601 including a selenium-based material for the photoelectric conversion layer 681. The photoelectric conversion element 601 including a selenium-based material has high external quantum efficiency with respect to visible light. The use of the photoelectric conversion element can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than amorphous selenium.

Although the photoelectric conversion layer 681 is illustrated as a single layer, gallium oxide, cerium oxide, or the like as a hole blocking layer may be provided on the light reception side of the selenium-based material, and nickel oxide, antimony sulfide, or the like as an electron blocking layer may be provided on the electrode 686 side.

Furthermore, the photoelectric conversion layer 681 may be a layer including a compound of copper, indium, and selenium (CIS). Alternatively, a layer including a compound of copper, indium, gallium, and selenium (CIGS) may be used. With CIS or CIGS, a photoelectric conversion element that can utilize an avalanche phenomenon as in the case of using a single layer of selenium can be formed.

Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by combination of the OS transistor having high drain withstand voltage and a photoelectric conversion element including the selenium-based material in the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films. Although the light-transmitting conductive layer 682 and a wiring 487 are electrically connected to each other through the electrode 488 and a contact plug 489 in the structure illustrated in FIG. 42, the light-transmitting conductive layer 682 and the wiring 487 may be in direct contact with each other.

The electrode 686, the wiring 487, and the like may each have a structure in which a plurality of conductive layers are stacked. For example, the electrode 686 can include two conductive layers 686a and 686b and the wiring 487 can include two conductive layers 487a and 487b. For example, the conductive layers 686a and 487a may be made of a low-resistance metal or the like, and the conductive layers 686b and 487b may be made of a metal or the like that exhibits an excellent contact property with the photoelectric conversion layer 681. Such a structure improves the electrical properties of the photoelectric conversion element. Furthermore, even when the conductive layer 487a contains a metal that causes electrolytic corrosion, which occurs when some kinds of metal are in contact with the light-transmitting conductive layer 682, electrolytic corrosion can be prevented because the conductive layer 487b is placed between the conductive layer 487a and the light-transmitting conductive layer 682.

The conductive layers 686b and 487b can be formed using, for example, molybdenum, tungsten, or the like. The conductive layers 686a and 487a can be formed using, for example, aluminum, titanium, or a stack of titanium, aluminum, and titanium that are layered in that order.

The insulating layer 442 may be a multilayer. Note that a partition wall 477 can be formed using an inorganic insulator, an insulating organic resin, or the like. The partition wall 477 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 601. In the photodiode, an n-type semiconductor layer, an i-type semiconductor layer, and a p-type semiconductor layer are stacked in that order. The i-type semiconductor layer is preferably formed using amorphous silicon. The p-type semiconductor layer and the n-type semiconductor layer can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Note that a PN or PIN diode element is preferably provided such that the p-type semiconductor layer serves as a light-receiving surface, in which case the output current of the photoelectric conversion element 601 can be increased.

The photoelectric conversion element 601 formed using the selenium-based material, amorphous silicon, or the like can be formed through general semiconductor manufacturing processes such as a deposition process, a lithography process, and an etching process.

Modification Example 2

Figure 43:
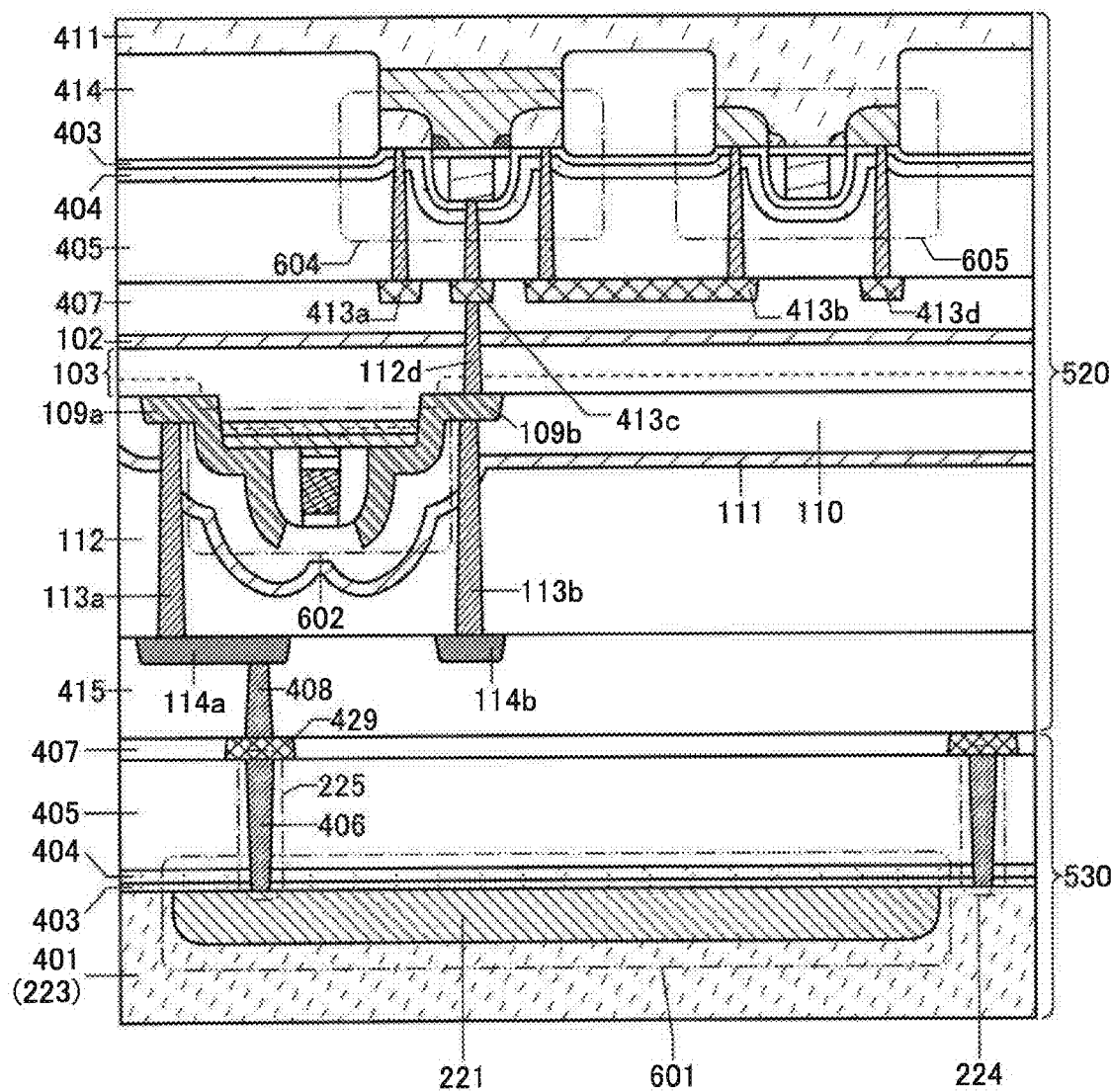
FIG. 43 is a cross-sectional view illustrating a structure example of an imaging device.

FIG. 43 illustrates a structure example of the pixel 622 that is different from FIG. 42. FIG. 43 is a cross-sectional view illustrating part of the pixel 622.

The pixel 622 illustrated in FIG. 43 is formed by attaching the substrate 520 in which a pixel driver circuit and the like are provided to the substrate 530 in which the photoelectric conversion element 601 and the like are provided. The substrate 520 includes the transistor 602, the transistor 604, the transistor 605, and the like over the substrate 411 and is provided with components up to the insulating layer 415. As the substrate 411, a substrate similar to the substrate 401 can be used. The structure of the substrate 520 can be understood by referring to FIG. 42. The substrate 530 is provided with components up to the insulating layer 407 and the electrode 429 over the substrate 401 provided with the photoelectric conversion element 601. The structure of the substrate 530 can be understood by referring to FIG. 41.

The substrates 520 and 530 overlap with each other with the insulating layers 415 and 407 facing each other. The electrode 114a is electrically connected to the electrode 429 via the contact plug 408. The pixel 622 illustrated in FIG. 43 senses light entering from the substrate 401 side. The substrate 520 in which the pixel driver circuit and the like are provided overlaps with the substrate 530 in which the photoelectric conversion element 601 and the like are provided, whereby the area occupied by the photoelectric conversion element 601 for one pixel can be increased.

[Display Device]

A display device is described as an example of a semiconductor device including any of the above-described transistors. A display device including a display element (e.g., liquid crystal display device and light-emitting display device) can employ various modes and include various elements.

The display device includes at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), an electron emitter, a display element including a carbon nanotube, a liquid crystal element, electronic ink, an electrowetting element, an electrophoretic element, a display element using micro electro mechanical systems (MEMS) (such as a grating light valve (GLV), a digital micromirror device (DMD), a digital micro shutter (DMS), MIRASOL (registered trademark), an interferometric modulator display (IMOD) element, a MEMS shutter display element, an optical-interference-type MEMS display element, or a piezoelectric ceramic display), quantum dots, and the like.

Other than above, the display device may include a display medium whose contrast, luminance, reflectance, transmittance, or the like is changed by an electric or magnetic effect. For example, the display device may be a plasma display panel (PDP).

Examples of a display device including an EL element include an EL display. Examples of a display device including an electron emitter include a field emission display (FED) and an SED-type flat panel display (SED: surface-conduction electron-emitter display).

Examples of display devices containing quantum dots in each pixel include a quantum dot display. Note that quantum dots may be provided not as display elements but as part of a backlight used for a liquid crystal display device. The use of quantum dots enables display with high color purity.

Examples of display devices including liquid crystal elements include a liquid crystal display device (e.g., a transmissive liquid crystal display, a transflective liquid crystal display, a reflective liquid crystal display, a direct-view liquid crystal display, or a projection liquid crystal display).

In the case of a transflective liquid crystal display or a reflective liquid crystal display, some of or all of pixel electrodes serve as reflective electrodes. For example, some or all of pixel electrodes are formed to contain aluminum, silver, or the like. In such a case, a memory circuit such as an SRAM can be provided under the reflective electrodes, leading to lower power consumption.

An example of a display device including electronic ink, Electronic Liquid Powder (registered trademark), or an electrophoretic element is electronic paper.

Note that in the case of using an LED chip for a display element or the like, graphene or graphite may be provided under an electrode or a nitride semiconductor of the LED chip. Graphene or graphite may be a multilayer film in which a plurality of layers are stacked. As described above, provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method.

In a display element including MEMS, a dry agent may be provided in a space where a display element is sealed (or between an element substrate over which the display element is placed and a counter substrate opposed to the element substrate, for example). Providing a dry agent can prevent MEMS and the like from becoming difficult to move or deteriorating easily because of moisture or the like.

<Example of Pixel Circuit Configuration>

Figure 44A:
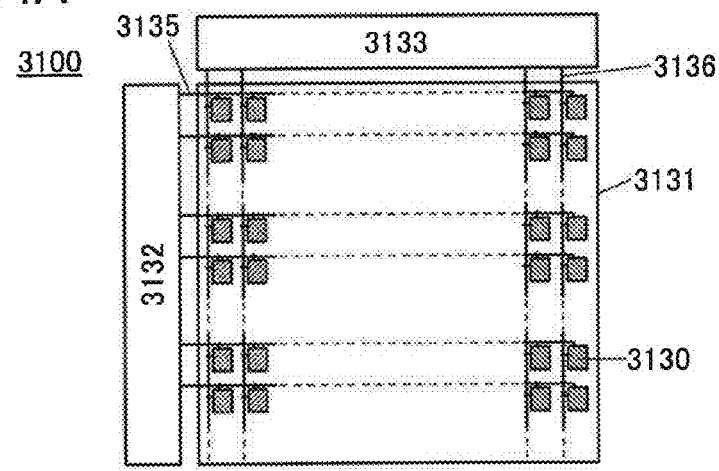
FIGS. 44A to 44C are block diagrams illustrating examples of a display device

Next, an example of a specific configuration of the display device is described with reference to FIGS. 44A to 44C. FIG. 44A is a block diagram illustrating the configuration of a display device 3100. The display device 3100 includes a display area 3131, a circuit 3132, and a circuit 3133. The circuit 3132 functions as a scan line driver circuit, for example, and the circuit 3133 functions as a signal line driver circuit, for example.

The display device 3100 includes m scan lines 3135 that are arranged parallel or substantially parallel to each other and whose potentials are controlled by the circuit 3132, and n signal lines 3136 that are arranged parallel or substantially parallel to each other and whose potentials are controlled by the circuit 3133. The display area 3131 includes a plurality of pixels 3130 arranged in a matrix of m rows by n columns. Note that m and n are each a natural number of 2 or more.

Each of the scan lines 3135 is electrically connected to the n pixels 3130 in the corresponding row among the pixels 3130 in the display area 3131. Each of the signal lines 3136 is electrically connected to the m pixels 3130 in the corresponding column among the pixels 3130.

Figure 44B:
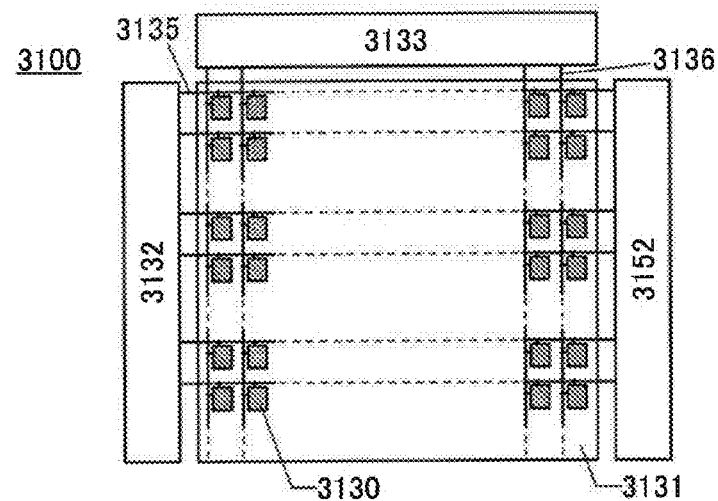

Furthermore, as illustrated in FIG. 44B, a circuit 3152 may be provided on the opposite side of the display area 3131 from the circuit 3132. As illustrated in FIG. 44C, a circuit 3152 may be provided on the opposite side of the display area 3131 from the circuit 3133. In each of FIGS. 44B and 44C, like the circuit 3132, the circuit 3152 is connected to the scan lines 3135. Note that the present invention is not limited to these configurations. For example, the scan lines 3135 may be connected alternately to the circuit 3132 and the circuit 3152 every several rows. In the example of FIG. 44C, like the circuit 3133, the circuit 3153 is connected to the signal lines 3136. Note that the present invention is not limited to this configuration. For example, the signal lines 3136 may be connected alternately to the circuit 3133 and the circuit 3153 every several rows. The circuits 3132, 3133, 3152, and 3153 may have a function other than the function of driving the pixels 3130.

In some cases, the circuits 3132, 3133, 3152, and 3153 may be collectively called a driver circuit portion. The pixel 3130 includes a pixel circuit 3137 and a display element. The pixel circuit 3137 is a circuit that drives the display element. A transistor included in the driver circuit portion and a transistor included in the pixel circuit 3137 can be formed at the same time. Part of the driver circuit portion or the entire driver circuit portion may be formed over another substrate and electrically connected to the display device 3100. For example, part of the driver circuit portion or the entire driver circuit portion may be formed using a single crystal substrate and electrically connected to the display device 3100.

FIGS. 45A1, 45A2, 45B1, and 45B2 illustrate circuit configurations that can be used for the pixels 3130 in the display device 3100.

[Example of Pixel Circuit for Light-Emitting Display Device]

FIGS. 45A1 and 45A2 illustrate examples of a pixel circuit that can be used for a light-emitting display device. The pixel circuit 3137 illustrated in FIGS. 45A1 and 45A2 includes a transistor 3431, a capacitor 3233, a transistor 3232, and a transistor 3434. In a circuit diagram of FIG. 45A2, the transistors 3431, 3232, and 3434 each include a back gate electrode. The pixel circuit 3137 is electrically connected to a light-emitting element 3125 that can function as a display element.

One of a source electrode and a drain electrode of the transistor 3431 is electrically connected to the signal line 3136 in the n-th column to which a data signal is supplied (hereinafter referred to as a signal line DL_n). A gate electrode of the transistor 3431 is electrically connected to the scan line 3135 in the m-th row to which a gate signal is supplied (hereinafter referred to as a scan line GL_m).

The transistor 3431 has a function of controlling whether to write a data signal to a node 3435.

One of a pair of electrodes of the capacitor 3233 is electrically connected to the node 3435, and the other is electrically connected to a node 3437. The other of the source electrode and the drain electrode of the transistor 3431 is electrically connected to the node 3435.

The capacitor 3233 functions as a storage capacitor for storing data written to the node 3435.

One of a source electrode and a drain electrode of the transistor 3232 is electrically connected to a potential supply line VL_a, and the other is electrically connected to the node 3437. A gate electrode of the transistor 3232 is electrically connected to the node 3435.

One of a source electrode and a drain electrode of the transistor 3434 is electrically connected to a potential supply line VL_c, and the other is electrically connected to the node 3437. A gate electrode of the transistor 3434 is electrically connected to the scan line GL_m.

One of an anode and a cathode of the light-emitting element 3125 is electrically connected to a potential supply line VL_b, and the other is electrically connected to the node 3437.

As the light-emitting element 3125, an organic electroluminescent element (also referred to as an organic EL element) or the like can be used, for example. Note that the light-emitting element 3125 is not limited to organic EL elements; an inorganic EL element including an inorganic material can be used.

For example, the potential supply line VL_a has a function of supplying VDD. The potential supply line VL_b has a function of supplying VSS. The potential supply line VL_c has a function of supplying VSS.

An operation example of a display device including the pixel circuit 3137 illustrated in FIGS. 45A1 and 45A2 is described here. First, the circuit 3132 sequentially selects the pixel circuits 3137 row by row. In each of the pixel circuits 3137, the transistor 3431 is turned on so that a data signal (potential) is written into the node 3435. Next, the transistor 3434 is turned on, and the potential of the node 3437 is set to VSS.

Then, the transistor 3431 is turned off and the data signal written to the node 3435 is retained. Next, the transistor 3434 is turned off. The amount of current flowing between the source and the drain of the transistor 3232 is determined by the data signal written to the node 3435. Thus, the light-emitting element 3125 emits light with a luminance corresponding to the amount of flowing current. This operation is sequentially performed row by row; thus, an image can be displayed.

A plurality of pixels 3130 are each used as a subpixel, and the subpixels emit light in different wavelength ranges, so that a color image can be obtained. For example, the pixel 3130 emitting light in a red wavelength range, the pixel 3130 emitting light in a green wavelength range, and the pixel 3130 emitting light in a blue wavelength range are used as one pixel.

The combination of the wavelength ranges of light is not limited to red, green, and blue and may be cyan, yellow, and magenta. Subpixels emitting light in at least three different wavelength ranges are provided in one pixel, whereby a full-color image can be obtained.

A subpixel that emits light in a yellow wavelength range may be added, in addition to red, green, and blue. A subpixel that emits light in a blue wavelength range may be added in addition to cyan, yellow, and magenta. When the subpixels that emit light in four or more different wavelength ranges are provided in one pixel, the reproducibility of colors of a displayed image can be further increased.

The pixel number ratio (or the ratio of light emitting area) of red to green and blue used for one pixel is not necessarily be 1:1:1. For example, the pixel number ratio (the ratio of light emitting area) of red to green and blue may be 1:1:2. Alternatively, the pixel number ratio (the ratio of light emitting area) of red to green and blue may be 1:2:3.

A subpixel emitting white light may be combined with red, green, and blue color filters or the like to enable full-color display. Alternatively, a subpixel emitting light in a red wavelength range, a subpixel emitting light in a green wavelength range, and a subpixel emitting light in a blue wavelength range may be combined with a color filter transmitting light in a red wavelength, a color filter transmitting light in a green wavelength, and a color filter transmitting light in a blue wavelength, respectively.

[Example of Pixel Circuit for Liquid Crystal Display Device]

FIGS. 45B1 and 45B2 illustrate examples of a pixel circuit that can be used for a liquid crystal display device. The pixel circuit 3137 illustrated in FIGS. 45B1 and 45B2 includes a transistor 3431 and a capacitor 3233. In a circuit diagram of FIG. 45B2, the transistor 3431 includes a back gate electrode. The pixel circuit 3137 is electrically connected to a liquid crystal element 3432 that can function as a display element.

The potential of one of a pair of electrodes of the liquid crystal element 3432 is set in accordance with the specifications of the pixel circuit 3137 as appropriate. The alignment state of a liquid crystal in the liquid crystal element 3432 depends on data written to a node 3436. A common potential may be applied to one of the pair of electrodes of the liquid crystal element 3432 included in each of the plurality of pixel circuits 3137.

As examples of a mode of the liquid crystal element 3432, the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

In the pixel circuit 3137 in the m-th row and the n-th column, one of the source electrode and the drain electrode of the transistor 3431 is electrically connected to a signal line DL_n, and the other is electrically connected to the node 3436. The gate electrode of the transistor 3431 is electrically connected to the scan line GL_m. The transistor 3431 has a function of controlling whether to write a data signal to the node 3436.

One of the pair of electrodes of the capacitor 3233 is electrically connected to a wiring to which a particular potential is supplied (hereinafter also referred to as a "capacitor line CL"), and the other is electrically connected to the node 3436. The other of the pair of electrodes of the liquid crystal element 3432 is electrically connected to the node 3436. The potential of the capacitor line CL is set in accordance with the specifications of the pixel circuit 3137 as appropriate. The capacitor 3233 functions as a storage capacitor for storing data written to the node 3436.

Figure 44C:
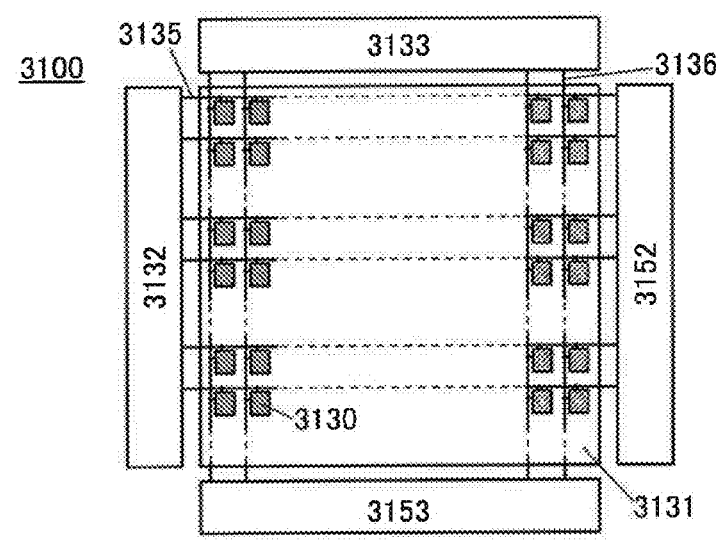

An operation example of a display device including the pixel circuit 3137 illustrated in FIG. 44C is described here. First, the circuit 3132 sequentially selects the pixel circuits 3137 row by row. In each of the pixel circuits 3137, the transistor 3431 is turned on so that a data signal is written into the node 3436.

Then, the transistor 3431 is turned off and the data signal written to the node 3436 is stored. The amount of light transmitted through the liquid crystal element 3432 is determined in accordance with the data signal written to the node 3436. This operation is sequentially performed row by row; thus, an image can be displayed on the display area 3131.

<Structure Example of Display Device>

Some or all of driver circuits that include the transistor described in the above embodiment can be formed over a substrate where a pixel portion is formed, whereby a system-on-panel can be obtained. Structure examples of a display device to which the transistor described in the above embodiment can be used are described with reference to FIGS. 46A to 46C and FIGS. 47A and 47B.

[Liquid Crystal Display Device and EL Display Device]

Figure 46A:
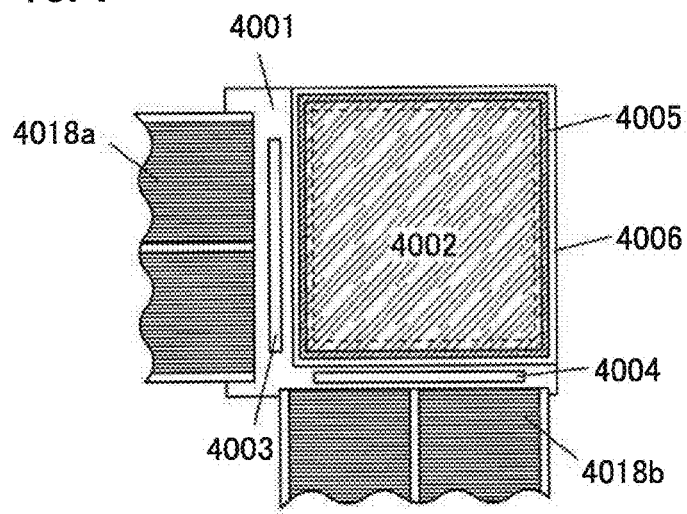
FIGS. 46A to 46C illustrate examples of a display device.

A display device including a liquid crystal element and a display device including an EL element are described as examples of the display device. In FIG. 46A, a sealant 4005 is provided so as to surround a pixel portion 4002 provided over a first substrate 4001, and the pixel portion 4002 is sealed with a second substrate 4006. In FIG. 46A, a signal line driver circuit 4003 and a scan line driver circuit 4004 each are formed using a single crystal semiconductor or a polycrystalline semiconductor over another substrate, and mounted in a region different from the region surrounded by the sealant 4005 over the first substrate 4001. Various signals and potentials are supplied to the signal line driver circuit 4003, the scan line driver circuit 4004, and the pixel portion 4002 through flexible printed circuits (FPCs) 4018*a* and 4018*b*.

Figure 46B:
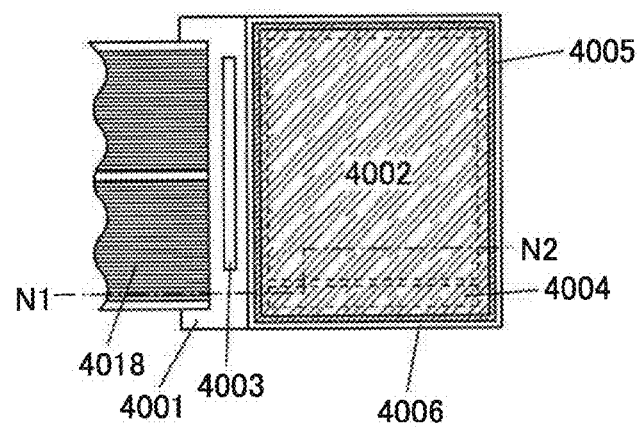
Figure 46C:
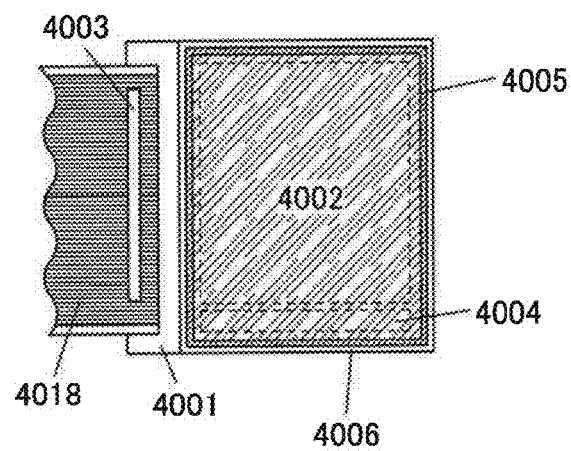

In FIGS. 46B and 46C, the sealant 4005 is provided so as to surround the pixel portion 4002 and the scan line driver circuit 4004 that are provided over the first substrate 4001. The second substrate 4006 is provided over the pixel portion 4002 and the scan line driver circuit 4004. Hence, the pixel portion 4002 and the scan line driver circuit 4004 are sealed together with the display element, by the first substrate 4001, the sealant 4005, and the second substrate 4006. Furthermore, in FIGS. 46B and 46C, the signal line driver circuit 4003 that is formed using a single crystal semiconductor or a polycrystalline semiconductor over another substrate is mounted in a region that is different from the region surrounded by the sealant 4005 over the first substrate 4001. In FIGS. 46B and 46C, various signals and potentials are supplied to the signal line driver circuit 4003, the scan line driver circuit 4004, and the pixel portion 4002 through an FPC 4018.

Although FIGS. 46B and 46C each illustrate an example in which the signal line driver circuit 4003 is formed separately and mounted on the first substrate 4001, an embodiment of the present invention is not limited to this structure. The scan line driver circuit may be separately formed and then mounted, or only part of the signal line driver circuit or only part of the scan line driver circuit may be separately formed and then mounted.

The connection method of a separately formed driver circuit is not particularly limited; wire bonding, a chip on glass (COG), a tape carrier package (TCP), a chip on film (COF), or the like can be used. FIG. 46A illustrates an example in which the signal line driver circuit 4003 and the scan line driver circuit 4004 are mounted by a COG. FIG. 46B illustrates an example in which the signal line driver circuit 4003 is mounted by a COG. FIG. 46C illustrates an example in which the signal line driver circuit 4003 is mounted by a TCP.

In some cases, the display device encompasses a panel in which a display element is sealed, and a module in which an IC or the like including a controller is mounted on the panel.

The pixel portion and the scan line driver circuit provided over the first substrate include a plurality of transistors to which the transistor that is described in the above embodiment can be applied.

FIGS. 47A and 47B correspond to cross-sectional views taken along chain line N1-N2 in FIG. 46B. As shown in FIGS. 47A and 47B, the display device has an electrode 4015, and the electrode 4015 is electrically connected to a terminal included in the FPC 4018 through an anisotropic conductive layer 4019. The electrode 4015 is electrically connected to a wiring 4014 in an opening formed in insulating layers 4112, 4111, and 4110.

The electrode 4015 is formed of the same conductive layer as a first electrode layer 4030, and the wiring 4014 is formed of the same conductive layer as a source and drain electrodes of transistors 4010 and 4011.

The pixel portion 4002 and the scan line driver circuit 4004 provided over the first substrate 4001 include a plurality of transistors. In FIGS. 47A and 47B, the transistor 4010 included in the pixel portion 4002 and the transistor 4011 included in the scan line driver circuit 4004 are shown as an example. The insulating layers 4112, 4111, and 4110 are provided over the transistors 4010 and 4011 in FIG. 47A, and a bank 4510 is further provided over the insulating layer 4112 in FIG. 47B.

The transistors 4010 and 4011 are provided over an insulating layer 4102. The transistors 4010 and 4011 each include an electrode 4017 over the insulating layer 4102. An insulating layer 4103 is formed over the electrode 4017. The electrode 4017 can serve as a back gate electrode.

The transistor described in the above embodiment can be applied to the transistors 4010 and 4011. A change in the electric characteristics of the transistor described in the above embodiment is suppressed, and thus the transistor is electrically stable. Accordingly, the display devices of this embodiment illustrated in FIGS. 47A and 47B can be highly reliable display devices.

FIGS. 47A and 47B illustrate the case where a transistor having a structure similar to that of the transistor 160 described in the above embodiment is used as each of the transistors 4010 and 4011.

The display devices illustrated in FIG. 47A and FIG. 47B each include a capacitor 4020. The capacitor 4020 includes a region where part of a source electrode or part of a drain electrode of the transistor 4010 overlaps with an electrode 4021 with the insulating layer 4103 interposed therebetween. The electrode 4021 is formed using the same conductive layer as the electrode 4017.

In general, the capacitance of the capacitor provided in a display device is set in consideration of leakage current or the like of transistors provided in a pixel portion so that charge can be held for a predetermined period. The capacitance of the capacitor may be set considering off-state current of the transistor or the like.

For example, when an OS transistor is used for a pixel portion of a liquid crystal display device, the capacitance of the capacitor can be one-third or smaller, furthermore, one-fifth or smaller of the capacitance of a liquid crystal. Using an OS transistor can omit the formation of a capacitor.

The transistor 4010 included in the pixel portion 4002 is electrically connected to the display element. An example of a liquid crystal display device using a liquid crystal element as a display element is illustrated in FIG. 47A. In FIG. 47A, a liquid crystal element 4013 that is the display element includes the first electrode layer 4030, a second electrode layer 4031, and a liquid crystal layer 4008. Insulating films 4032 and 4033 serving as alignment films are provided so that the liquid crystal layer 4008 is sandwiched therebetween. The second electrode layer 4031 is provided on the second substrate 4006 side, and the first electrode layer 4030 and the second electrode layer 4031 overlap with each other with the liquid crystal layer 4008 positioned therebetween.

A spacer 4035 is a columnar spacer obtained by selective etching of an insulating layer and is provided in order to control a distance between the first electrode layer 4030 and the second electrode layer 4031 (a cell gap). A spherical spacer may alternatively be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on a condition.

Alternatively, liquid crystal exhibiting a blue phase for which an alignment film is not involved may be used. A blue phase is one of liquid crystal phases, which is generated just before a cholesteric phase changes into an isotropic phase while the temperature of cholesteric liquid crystal is increased. Since the blue phase appears only in a narrow temperature range, a liquid crystal composition in which 5 wt. % or more of a chiral material is mixed is used for the liquid crystal layer in order to widen the temperature range. The liquid crystal composition that includes the liquid crystal exhibiting a blue phase and a chiral material has a short response time of 1 msec or less, and has optical isotropy, which makes the alignment process unnecessary and the viewing angle dependence small. In addition, since an alignment film is not involved and thus rubbing treatment is unnecessary, electrostatic discharge damage caused by the rubbing treatment can be prevented, so that defects and damage of the liquid crystal display device in the manufacturing process can be reduced. Thus, productivity of the liquid crystal display device can be increased.

Furthermore, it is possible to use a method called domain multiplication or multi-domain design in which a pixel is divided into some regions (subpixels) and molecules are aligned in different directions in their respective regions.

The inherent resistance of the liquid crystal material is greater than or equal to $1\times10^9$ Ω·cm, preferably greater than or equal to $1\times10^{11}$ Ω·cm, further preferably greater than or equal to $1\times10^{12}$ Ω·cm. The inherent resistance in this specification is measured at 20° C.

In the OS transistor used in this embodiment, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In the OS transistor, relatively high field-effect mobility can be obtained, whereby high-speed operation is possible. Consequently, when the above transistor is used in a pixel portion of a semiconductor device having a display function, high-quality images can be obtained. Since a driver circuit portion and the pixel portion can be formed over one substrate with the use of the above transistor, the number of components of the display device can be reduced.

In the display device, a black matrix (a light-blocking layer), an optical member (an optical substrate) such as a polarizing member, a retardation member, or an anti-reflection member, and the like may be provided as appropriate. For example, circular polarization may be applied with a polarizing substrate and a retardation substrate. In addition, a backlight, a side light, or the like may be used as a light source.

As the display element included in the display device, a light-emitting element utilizing electroluminescence (also referred to as an "EL element") can be used. An EL element includes a layer containing a light-emitting compound (also referred to as an "EL layer") is sandwiched between a pair of electrodes. By generating a potential difference between the pair of electrodes that is greater than the threshold voltage of the EL element, holes are injected to the EL layer from the anode side and electrons are injected to the EL layer from the cathode side. The injected electrons and holes are recombined in the EL layer, so that a light-emitting substance contained in the EL layer emits light.

EL elements are classified depending on whether a light-emitting material is an organic compound or an inorganic compound. In general, the former is referred to as an organic EL element, and the latter is referred to as an inorganic EL element.

In an organic EL element, by voltage application, electrons are injected form one electrode to the EL layer and holes are injected from the other electrode to the EL layer. The carriers (i.e., electrons and holes) are recombined; thus, the light-emitting organic compound becomes in an excited state. The light-emitting organic compound returns to a ground state from the excited state, thereby emitting light. Based on such a mechanism, such a light-emitting element is referred to as a current-excitation type light-emitting element.

In addition to the light-emitting compound, the EL layer may further include any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

The EL layer can be formed by an evaporation method (including a vacuum evaporation method), a transfer method, a printing method, an inkjet method, a coating method, or the like.

Inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission that utilizes a donor level and an acceptor level. On the other hand, the thin-film inorganic EL element has a structure where a light-emitting layer is sandwiched between dielectric layers, which is further sandwiched between electrodes, and its light emission mechanism is localized type light emission that utilizes inner-shell electron transition of metal ions. An example in which an organic EL element is used as the light-emitting element is described here.

In order to extract light emitted from the light-emitting element, at least one of the pair of electrodes is transparent. The transistor and the light-emitting element are formed over a substrate. The light-emitting element can have a top emission structure in which light emission is extracted through the surface opposite to the substrate; a bottom emission structure in which light emission is extracted through the surface on the substrate side; or a dual emission structure in which light emission is extracted through the side opposite to the substrate and the substrate side.

FIG. 47B illustrates an example of a light-emitting display device (also referred to as an "EL display device") using a light-emitting element as a display element. A light-emitting element 4513 that is the display element is electrically connected to the transistor 4010 in the pixel portion 4002. The structure of the light-emitting element 4513 is the stacked-layer structure including the first electrode layer 4030, a light-emitting layer 4511, and the second electrode layer 4031; however, this embodiment is not limited to this structure. The structure of the light-emitting element 4513 can be changed as appropriate depending on the direction in which light is extracted from the light-emitting element 4513, or the like.

The bank 4510 can be formed using an organic insulating material or an inorganic insulating material. It is particularly preferable that the bank 4510 be formed using a photosensitive resin material to have an opening over the first electrode layer 4030 so that a side surface of the opening slopes with continuous curvature.

The light-emitting layer 4511 consists of either a single layer or a plurality of layers stacked.

A protective layer may be formed over the second electrode layer 4031 and the bank 4510 in order to prevent entry of oxygen, hydrogen, moisture, carbon dioxide, or the like into the light-emitting element 4513. For the protective layer, silicon nitride, silicon nitride oxide, aluminum oxide, aluminum nitride, aluminum oxynitride, aluminum nitride oxide, diamond like carbon (DLC), or the like can be used. In addition, in a space that is confined by the first substrate 4001, the second substrate 4006, and the sealant 4005, a filler 4514 is provided for sealing. It is preferable that the panel be packaged (sealed) with a protective film (such as a laminate film or an ultraviolet curable resin film) or a cover member with high air-tightness and little degasification so that the panel is not exposed to the outside air, in this manner.

As the filler 4514, an ultraviolet curable resin or a thermosetting resin can be used as well as an inert gas such as nitrogen or argon; for example, polyvinyl chloride (PVC), an acrylic resin, polyimide, an epoxy resin, a silicone resin, polyvinyl butyral (PVB), ethylene vinyl acetate (EVA), or the like can be used. A drying agent may be contained in the filler 4514.

For example, a glass material such as a glass frit, or a resin that is curable at room temperature such as a two-component-mixture-type resin, a light curable resin, a thermosetting resin, and the like can be used for the sealant 4005. A drying agent may be contained in the sealant 4005.

In addition, if necessary, an optical film, such as a polarizing plate, a circularly polarizing plate (including an elliptically polarizing plate), a retardation plate (a quarter-wave plate or a half-wave plate), or a color filter, may be provided as appropriate on a light-emission surface of the light-emitting element. Furthermore, the polarizing plate or the circularly polarizing plate may be provided with an anti-reflection film. For example, anti-glare treatment by which reflected light can be diffused by unevenness of the surface so as to reduce the glare can be performed.

When the light-emitting element has a microcavity structure, light with high color purity can be extracted. Furthermore, when a microcavity structure and a color filter are used in combination, the glare can be reduced and visibility of a display image can be increased.

The first electrode layer and the second electrode layer (each of which is also called a pixel electrode layer, a common electrode layer, a counter electrode layer, or the like) for applying voltage to the display element each have either a light-transmitting property or a light-reflecting property, which depends on the direction in which light is extracted, the position where the electrode layer is provided, the pattern structure of the electrode layer, and the like.

The first electrode layer 4030 and the second electrode layer 4031 can be formed using a light-transmitting conductive material such as indium oxide containing tungsten oxide, indium zinc oxide containing tungsten oxide, indium oxide containing titanium oxide, indium tin oxide, indium tin oxide containing titanium oxide, indium zinc oxide, or indium tin oxide to which silicon oxide is added.

The first electrode layer 4030 and the second electrode layer 4031 each can also be formed using one or more kinds selected from a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof and a nitride thereof.

A conductive composition containing a conductive high molecule (also called a conductive polymer) can also be used for any of the first electrode layer 4030 and the second electrode layer 4031. As the conductive high molecule, a so-called 7c-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken owing to static electricity or the like, a protective circuit for protecting the driver circuit is preferably provided. The protection circuit is preferably formed using a nonlinear element.

As described above, by applying the transistor described in the above embodiment, a highly reliable display device can be provided. With the use of the transistor described in the above embodiment, a display device that has a high resolution, a large size, and high display quality can be provided. Furthermore, a display device with low power consumption can be provided.

<Display Module>

Figure 48:
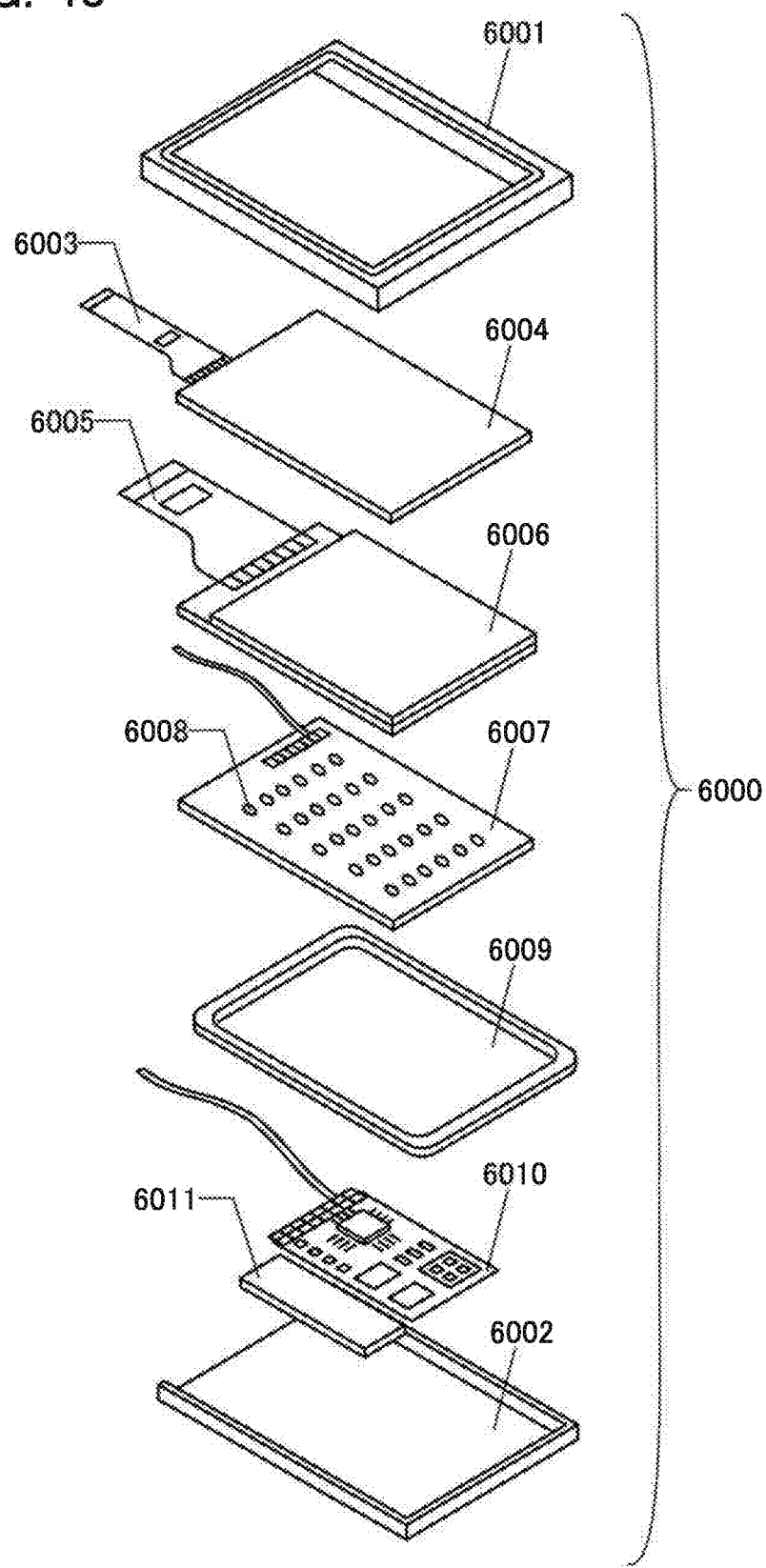
FIG. 48 illustrates an example of a display module.

A display module is described as an example of a semiconductor device using the above-described transistor. In a display module 6000 in FIG. 48, a touch sensor 6004 connected to an FPC 6003, a display panel 6006 connected to an FPC 6005, a backlight unit 6007, a frame 6009, a printed board 6010, and a battery 6011 are provided between an upper cover 6001 and a lower cover 6002. Note that the backlight unit 6007, the battery 6011, the touch sensor 6004, and the like are not provided in some cases.

The semiconductor device of one embodiment of the present invention can be used for, for example, the touch sensor 6004, the display panel 6006, an integrated circuit mounted on a printed circuit board 6010, and the like. For example, the above-described display device can be used in the display panel 6006.

The shapes and sizes of the upper cover 6001 and the lower cover 6002 can be changed as appropriate in accordance with the sizes of the touch sensor 6004, the display panel 6006, and the like.

The touch sensor 6004 can be a resistive touch panel or a capacitive touch panel and may be formed to overlap with the display panel 6006. The display panel 6006 can have a touch panel function. For example, an electrode for a touch sensor may be provided in each pixel of the display panel 6006 so that a capacitive touch panel function is added. Alternatively, a photosensor may be provided in each pixel of the display panel 6006 so that an optical touch sensor function is added.

The backlight unit 6007 includes a light source 6008. The light source 6008 may be provided at an end portion of the backlight unit 6007 and a light diffusing plate may be used. When a light-emitting display device or the like is used for the display panel 6006, the backlight unit 6007 can be omitted.

The frame 6009 protects the display panel 6006 and also functions as an electromagnetic shield for blocking electromagnetic waves generated from the printed board 6010 side. The frame 6009 may function as a radiator plate.

The printed board 6010 has a power supply circuit, a signal processing circuit for outputting a video signal and a clock signal, and the like. As a power source for supplying power to the power supply circuit, the battery 6011 or a commercial power source may be used. Note that the battery 6011 can be omitted in the case where a commercial power source is used as the power source.

The display module 6000 can be additionally provided with a member such as a polarizing plate, a retardation plate, or a prism sheet.

This embodiment can be combined as appropriate with any of the other embodiments in this specification.

[RF Tag]

An RF tag is described as an example of a semiconductor device including any of the above-described transistors.

The RF tag of one embodiment of the present invention includes a memory circuit (a memory device), stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

Figure 49:
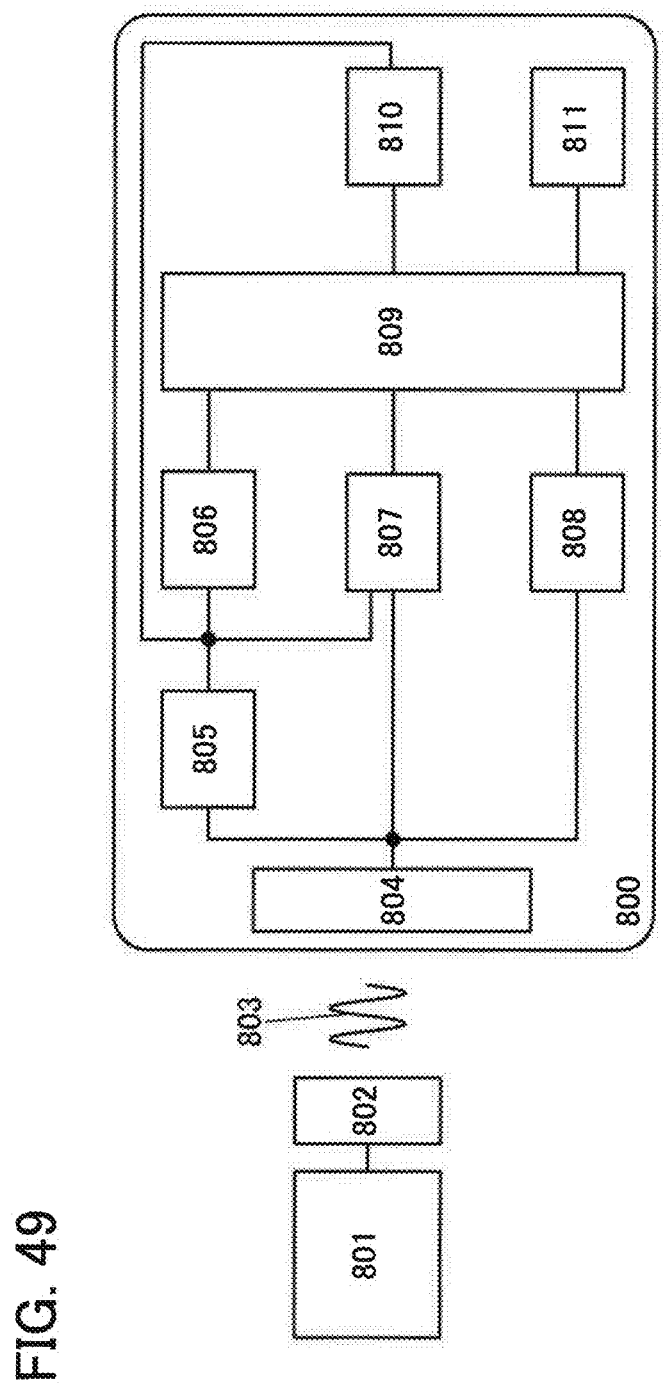
FIG. 49 is a block diagram illustrating an example of an RF tag.
Figure 50A:
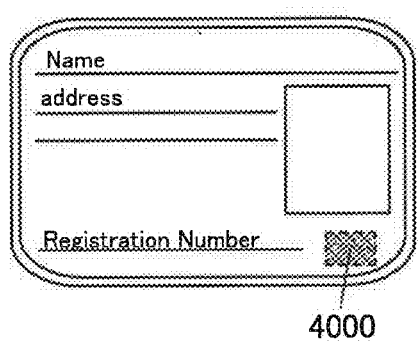
FIGS. 50A to 50F. illustrate usage examples of an RF tag.
Figure 50B:
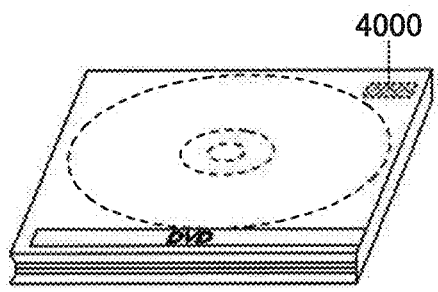
Figure 50C:
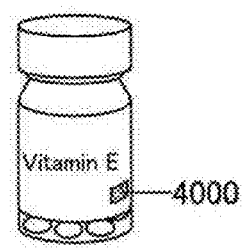
Figure 50D:
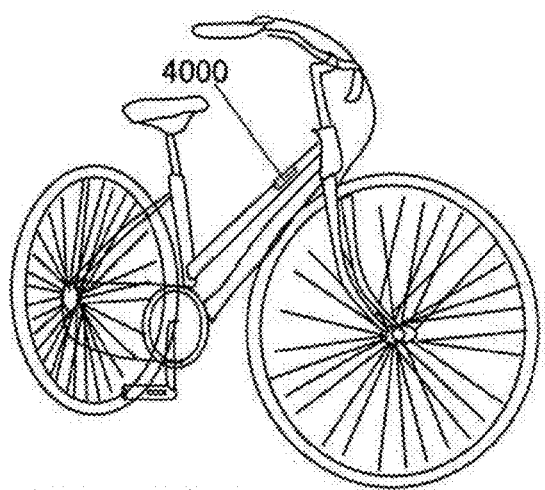
Figure 50E:
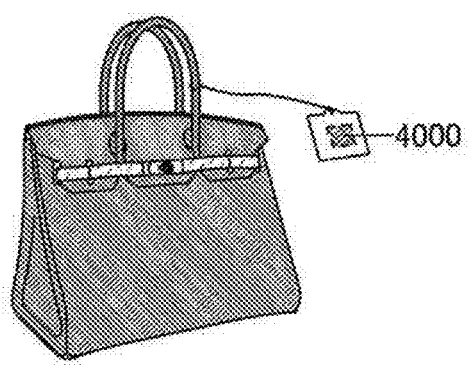
Figure 50F:
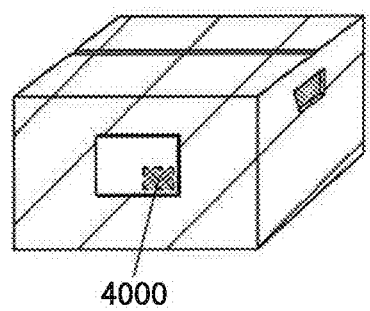

A configuration of the RF tag is described with reference to FIG. 49. FIG. 49 is a block diagram illustrating a configuration example of an RF tag.

As shown in FIG. 49, an RF tag 800 includes an antenna 804 that receives a radio signal 803 that is transmitted from an antenna 802 connected to a communication device 801 (also referred to as an interrogator, a reader/writer, or the like). Any of the above-described transistors may be used in the communication device 801. The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material that enables a reverse current to be low enough, for example, an oxide semiconductor. This can suppress the phenomenon of a rectifying function becoming weaker due to generation of reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit is described. The antenna 804 exchanges the radio signal 803 with the antenna 802 that is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor in a later stage in the rectifier circuit 805. Note that a limiter circuit may be provided on an input side or an output side of the rectifier circuit 805. The limiter circuit controls electric power so that electric power that is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate.

The memory device described above can be used as the memory circuit 810. Since the memory device of one embodiment of the present invention can retain data even when not powered, the memory circuit can be favorably used for an RF tag. Furthermore, the memory device of one embodiment of the present invention needs less power (voltage) for data writing than a conventional nonvolatile memory; thus, it is possible to prevent a difference between the maximum communication range in data reading and that in data writing. In addition, it is possible to suppress malfunction or incorrect writing that is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

Application examples of an RF tag of one embodiment of the present invention are described with reference to FIGS. 50A to 50F. The RF tag is widely used and can be provided for, for example, products, e.g., bills, coins, securities, bearer bonds, documents such as driver's licenses or resident's cards (see FIG. 50A), recording media such as DVD software or video tapes (see FIG. 50B), containers such as plates, cups, or bottles (see FIG. 50C), packaging containers such as wrapping paper, boxes, or ribbon, moving objects such as bicycles (see FIG. 50D), personal belongings such as bags or glasses, plants, animals, human bodies, clothing, household goods, medical supplies such as medicine and chemicals, and electronic devices (e.g., liquid crystal display devices, EL display devices, television sets, or cellular phones), or tags on products (see FIGS. 50E and 50F).

The RF tag 800 of one embodiment of the present invention is fixed to a product by being attached to a surface thereof or embedded therein. For example, the RF tag 800 is fixed to each product by being embedded in paper of a book, or embedded in an organic resin of a package. Since the RF tag 800 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 800 of one embodiment of the present invention, and the identification function can be utilized to prevent counterfeiting. Moreover, the efficiency of a system such as an inspection system can be improved by providing the RF tag 800 of one embodiment of the present invention for packaging containers, recording media, personal belongings, clothing, household goods, electronic devices, or the like. Moving objects can also have higher security against theft or the like by being provided with the RF tag 800 of one embodiment of the present invention. As described above, the RF tag 800 of one embodiment of the present invention can be used for each application described above.

This embodiment can be implemented in appropriate combinations with any of the other embodiments.

Embodiment 5

<Package Using a Lead Frame Interposer>

Figure 51A:
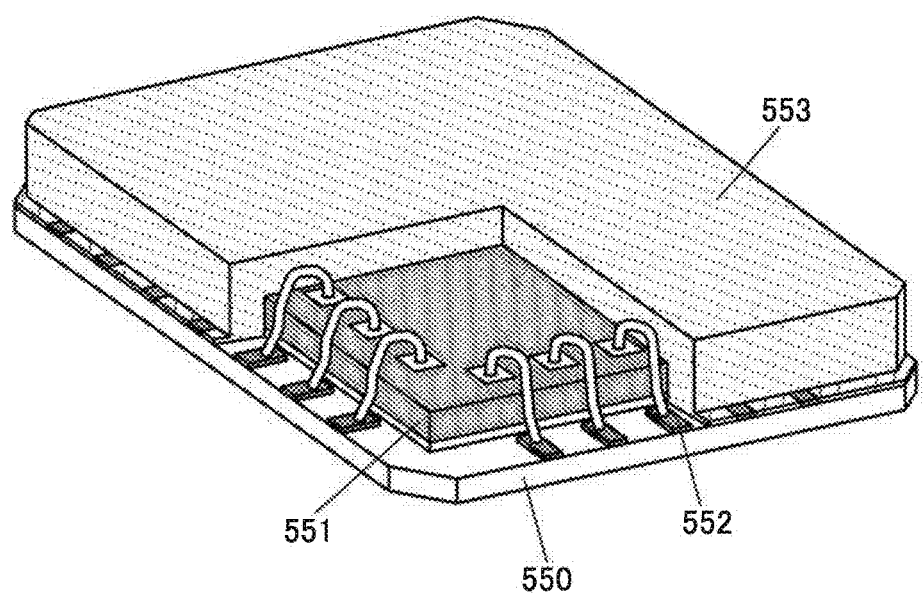
FIGS. 51A and 51B are perspective views illustrating a cross-sectional structure of a package using a lead frame interposer.

FIG. 51A is a perspective view illustrating a cross-sectional structure of a package using a lead frame interposer. In the package illustrated in FIG. 51A, a chip 551 corresponding to the semiconductor device of one embodiment of the present invention is connected to a terminal 552 over an interposer 550 by wire bonding. The terminal 552 is placed on a surface of the interposer 550 on which the chip 551 is mounted. The chip 551 may be sealed by a mold resin 553, in which case the chip 551 is sealed such that part of each of the terminals 552 is exposed.

Figure 51B:
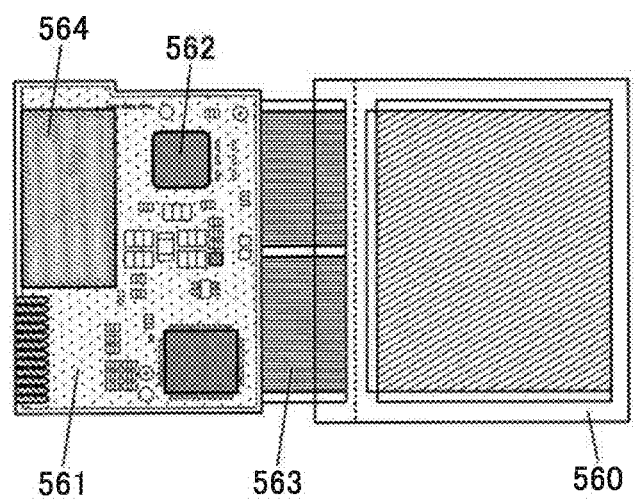

FIG. 51B illustrates a structure example of an electronic device in which a package is mounted on a circuit board. The electronic device illustrated in FIG. 51B is mounted on a mobile phone, for example. In the electronic device in FIG. 51B, a package 562 and a battery 564 are mounted on a printed wiring board 561. The printed wiring board 561 is mounted on a panel 560 including a display element by an FPC 563.

This embodiment can be combined as appropriate with any of the other embodiments in this specification.

Embodiment 6

In this embodiment, examples of an electronic device that uses the semiconductor device of one embodiment of the present invention are described.

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by electric motors using power from non-aqueous secondary batteries and fuel engines may also be included in the range of electronic devices. Examples of the moving objects include electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Figure 52A:
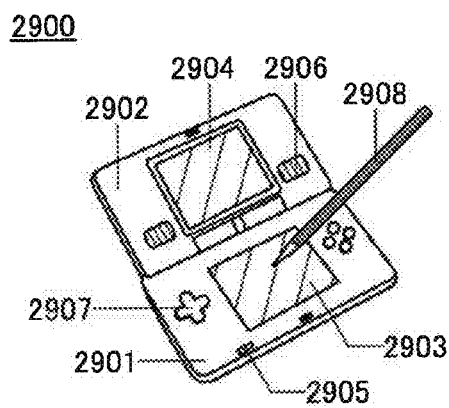
FIGS. 52A to 52H illustrate an example of an electronic device.

A portable game machine 2900 illustrated in FIG. 52A includes a housing 2901, a housing 2902, a display portion 2903, a display portion 2904, a microphone 2905, a speaker 2906, an operation key 2907, and the like. Although the portable game machine in FIG. 52A has the two display portions 2903 and 2904, the number of display portions is not limited to this. The display portion 2903 is provided with a touch screen as an input device, which can be handled with a stylus 2908 or the like.

Figure 52B:
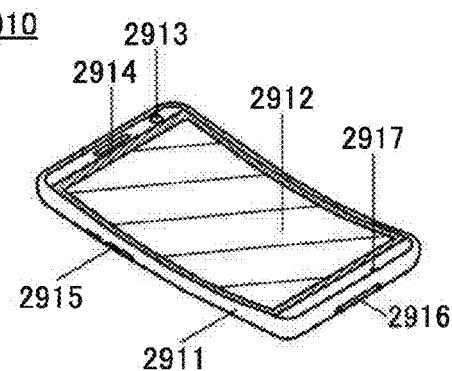

An information terminal 2910 illustrated in FIG. 52B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet personal computer, or an e-book reader.

Figure 52C:
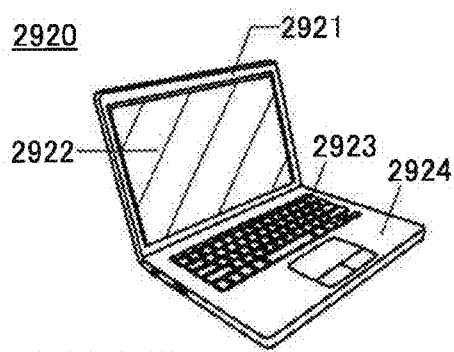

A notebook personal computer 2920 illustrated in FIG. 52C includes a housing 2921, a display portion 2922, a keyboard 2923, a pointing device 2924, and the like.

Figure 52D:
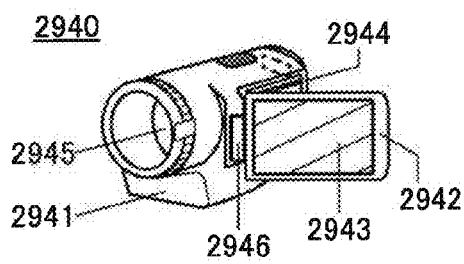

A video camera 2940 illustrated in FIG. 52D includes a housing 2941, a housing 2942, a display portion 2943, operation keys 2944, a lens 2945, a joint 2946, and the like. The operation keys 2944 and the lens 2945 are provided for the housing 2941, and the display portion 2943 is provided for the housing 2942. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 52E:
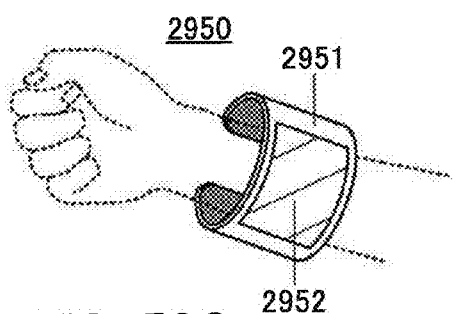

FIG. 52E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 52F:
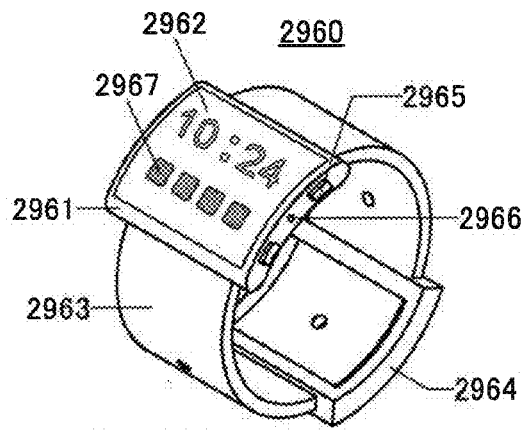

FIG. 52F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation button 2965, a variety of functions such as time setting, ON/OFF of the power, ON/OFF of wireless communication, setting and cancellation of a silent mode, and setting and cancellation of a power saving mode can be performed. For example, the functions of the operation button 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 52G:
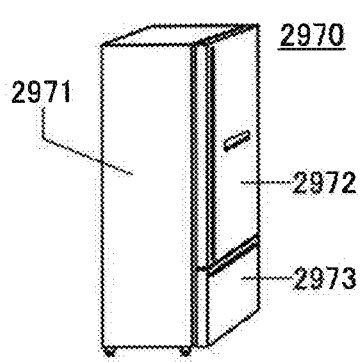

FIG. 52G illustrates an electric refrigerator-freezer as an example of a home electronic device. An electric refrigerator-freezer 2970 includes a housing 2971, a refrigerator door 2972, a freezer door 2973, and the like.

Figure 52H:
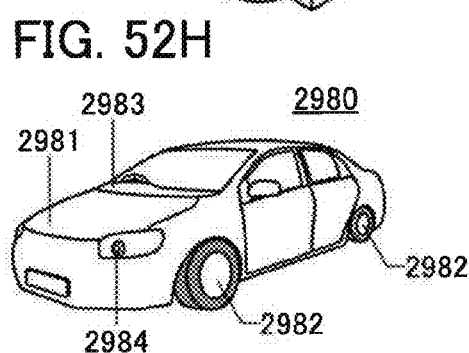

FIG. 52H is an external view illustrating an example of a car. A car 2980 includes a car body 2981, wheels 2982, a dashboard 2983, lights 2984, and the like.

The electronic devices described in this embodiment include any of the above-described transistors, semiconductor devices, or the like.

This embodiment can be implemented in appropriate combinations with any of the other embodiments.

Embodiment 7

In this embodiment, a deposition apparatus (a sputtering apparatus) including a deposition chamber in which a sputtering target can be placed is described below. The deposition apparatus described in this embodiment can be used as a parallel-plate-type sputtering apparatus, a facing-targets sputtering apparatus, or the like.

Deposition using a facing-targets sputtering apparatus causes less damage to a formation surface and thus facilitates the formation of a film with high crystallinity. For this reason, a facing-targets sputtering apparatus is preferably used for the deposition of the CAAC-OS or the like in some cases.

Note that deposition using a parallel-plate-type sputtering apparatus can also be referred to as parallel electrode sputtering (PESP), and deposition using a facing-targets sputtering apparatus can also be referred to as vapor deposition sputtering (VDSP).

First, a structure of a deposition apparatus that hardly allows the entry of impurities into a film during deposition or the like is described with reference to FIG. 53 and FIGS. 54A to 54C.

Figure 53:
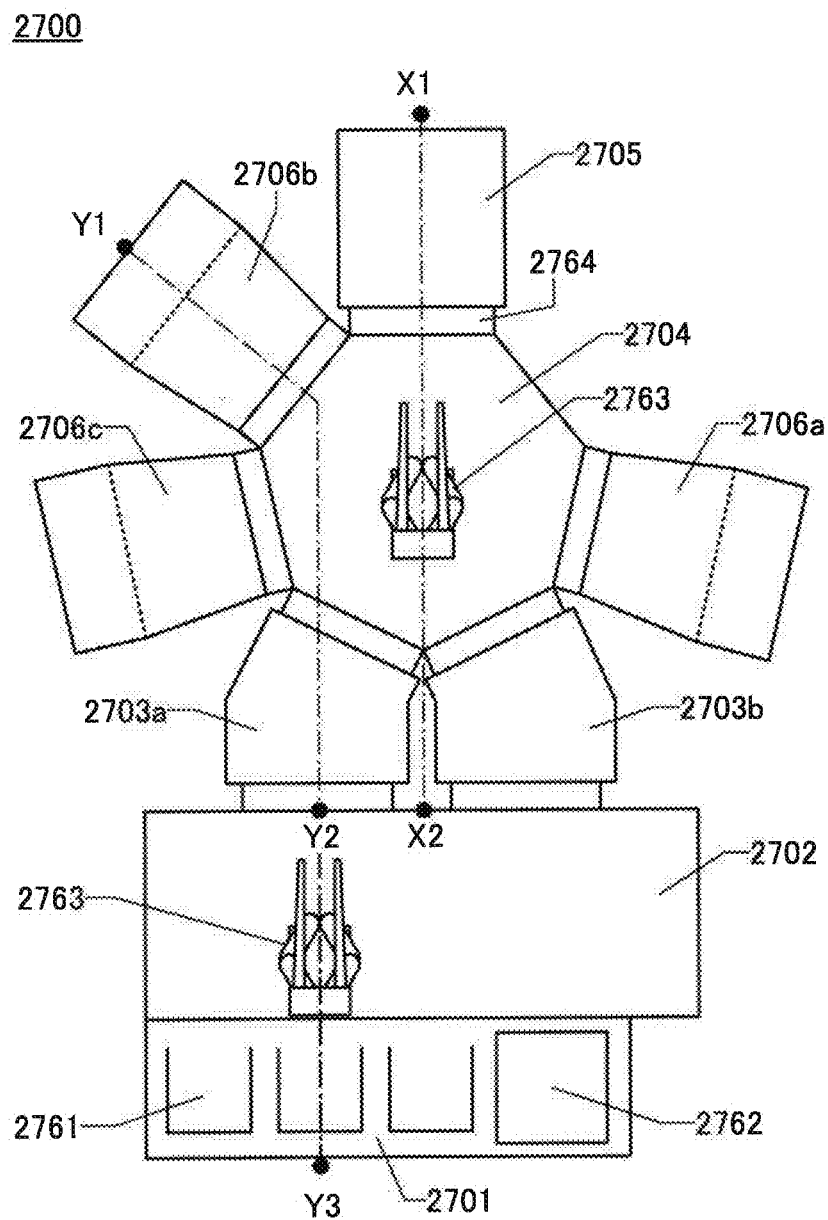
FIG. 53 is a top view illustrating an example of a film formation apparatus.

FIG. 53 is a schematic top view of a single wafer multi-chamber deposition apparatus 2700. The deposition apparatus 2700 includes an atmosphere-side substrate supply chamber 2701 including a cassette port 2761 for storing substrates and an alignment port 2762 for performing alignment of substrates, an atmosphere-side substrate transfer chamber 2702 through which a substrate is transferred from the atmosphere-side substrate supply chamber 2701, a load lock chamber 2703a where a substrate is carried in and the pressure is switched from atmospheric pressure to reduced pressure or from reduced pressure to atmospheric pressure, an unload lock chamber 2703b where a substrate is carried out and the pressure is switched from reduced pressure to atmospheric pressure or from atmospheric pressure to reduced pressure, a transfer chamber 2704 where a substrate is transferred in a vacuum, a substrate heating chamber 2705 where a substrate is heated, and deposition chambers 2706a, 2706b, and 2706c in each of which a sputtering target is placed for deposition. Note that for the deposition chambers 2706a, 2706b, and 2706c, the structure of a deposition chamber that is described later can be referred to.

The atmosphere-side substrate transfer chamber 2702 is connected to the load lock chamber 2703a and the unload lock chamber 2703b, the load lock chamber 2703a and the unload lock chamber 2703b are connected to the transfer chamber 2704, and the transfer chamber 2704 is connected to the substrate heating chamber 2705 and the deposition chambers 2706a, 2706b, and 2706c.

Note that gate valves 2764 are provided in connecting portions between the chambers so that each chamber excluding the atmosphere-side substrate supply chamber 2701 and the atmosphere-side substrate transfer chamber 2702 can be independently kept in a vacuum state. In each of the atmosphere-side substrate supply chamber 2702 and the transfer chamber 2704, a transfer robot 2763 is provided, which is capable of transferring substrates.

It is preferable that the substrate heating chamber 2705 also serve as a plasma treatment chamber. In the deposition apparatus 2700, substrates can be transferred without being exposed to the air between treatments, and adsorption of impurities to substrates can be suppressed. In addition, the order of deposition, heat treatment, or the like can be freely determined. Note that the number of transfer chambers, the number of deposition chambers, the number of load lock chambers, the number of unload lock chambers, and the number of substrate heating chambers are not limited to the above, and the numbers thereof can be set as appropriate depending on the space for installation or the process conditions.

Figure 54A:
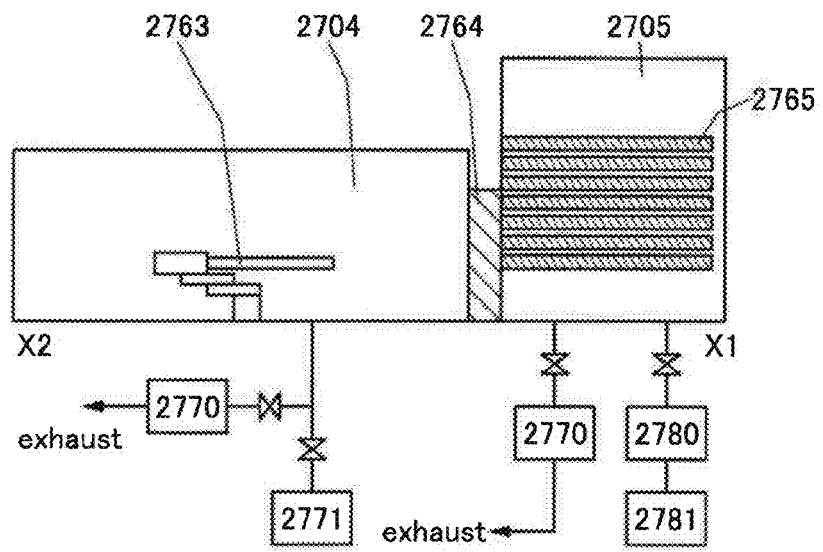
FIGS. 54A to 54C are cross-sectional views each illustrating an example of a deposition apparatus.
Figure 54B:
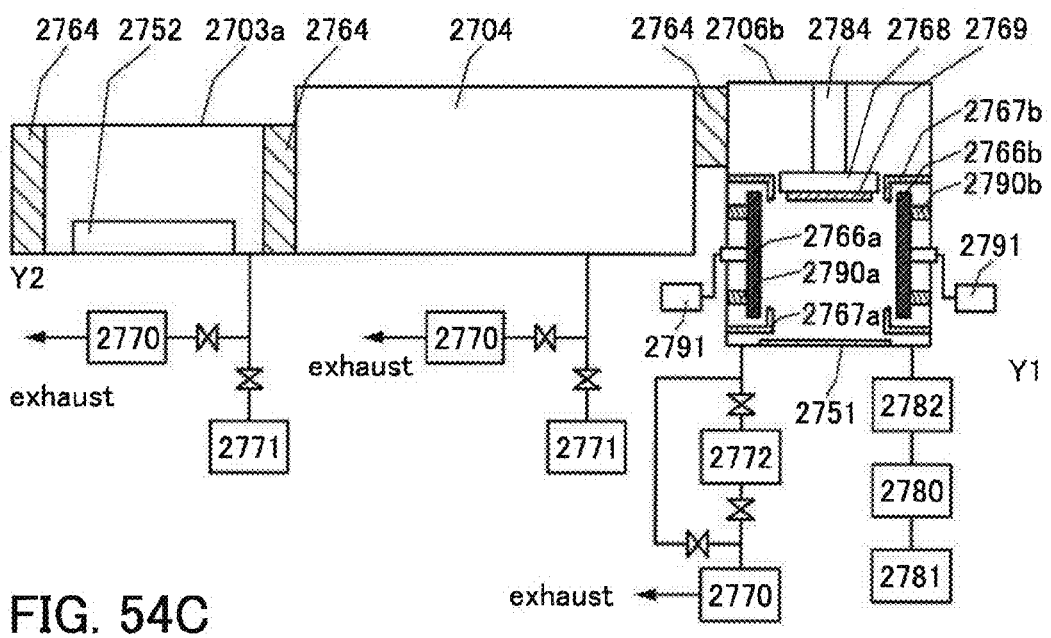
Figure 54C:
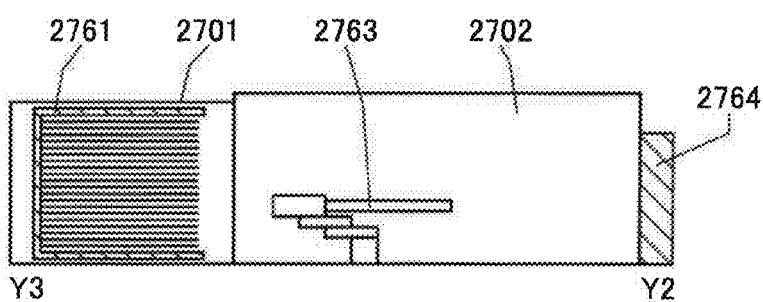

Next, FIG. 54A, FIG. 54B, and FIG. 54C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 2700 illustrated in FIG. 53.

FIG. 54A illustrates a cross section of the substrate heating chamber 2705 and the transfer chamber 2704, and the substrate heating chamber 2705 includes a plurality of heating stages 2765 that can hold a substrate. Note that the substrate heating chamber 2705 is connected to a vacuum pump 2770 through a valve. As the vacuum pump 2770, a dry pump and a mechanical booster pump can be used, for example.

As a heating mechanism that can be used for the substrate heating chamber 2705, a resistance heater may be used for heating, for example. Alternatively, heat conduction or heat radiation from a medium such as a heated gas may be used as the heating mechanism. For example, RTA such as GRTA or LRTA can be used.

Moreover, the substrate heating chamber 2705 is connected to a refiner 2781 through a mass flow controller 2780. Note that although the mass flow controller 2780 and the refiner 2781 can be provided for each of a plurality of kinds of gases, only one mass flow controller 2780 and one refiner 2781 are provided for easy understanding. As the gas introduced to the substrate heating chamber 2705, a gas whose dew point is −80° C. or lower, preferably −100° C. or lower can be used; for example, an oxygen gas, a nitrogen gas, and a rare gas (e.g., an argon gas) are used.

The transfer chamber 2704 includes the transfer robot 2763. The transfer robot 2763 can transfer a substrate to each chamber. Furthermore, the transfer chamber 2704 is connected to the vacuum pump 2770 and a cryopump 2771 through valves. Owing to such a structure, exhaust is performed using the vacuum pump 2770 until the pressure inside the transfer chamber 2704 becomes in the range of atmospheric pressure to low or medium vacuum (approximately 0.1 Pa to several hundred pascals) and then the valves are switched so that exhaust is performed using the cryopump 2771 until the pressure inside the transfer chamber 2704 becomes in the range of middle vacuum to high or ultra-high vacuum (0.1 Pa to $1 \times 10^{-7}$ Pa).

Alternatively, two or more cryopumps 2771 may be connected in parallel to the transfer chamber 2704. With such a structure, even when one of the cryopumps is in regeneration, exhaust can be performed using any of the other cryopumps. Note that the above regeneration refers to treatment for discharging molecules (or atoms) entrapped in the cryopump. When molecules (or atoms) are entrapped too much in a cryopump, the exhaust capability of the cryopump is lowered; therefore, regeneration is performed regularly.

FIG. 54B illustrates a cross section of the deposition chamber 2706b, the transfer chamber 2704, and the load lock chamber 2703a.

Here, the details of the deposition chamber (sputtering chamber) are described with reference to FIG. 54B. The deposition chamber 2706b illustrated in FIG. 54B includes a target 2766a, a target 2766b, a target shield 2767a, a target shield 2767b, a magnet unit 2790a, a magnet unit 2790b, a substrate holder 2768, and power sources 2791. Although not illustrated, each of the target 2766a and the target 2766b is fixed to a target holder with a backing plate provided therebetween. The power source 2791 is electrically connected to each of the target 2766a and the target 2766b. The magnet unit 2790a is placed on a back side of the target 2766a and the magnet unit 2790b is placed on a back side of the target 2766b. The target shield 2767a is provided so as to surround an end portion of the target 2766a and the target shield 2767b is provided so as to surround an end portion of target 2766b. Note that here, a substrate 2769 is supported by the substrate holder 2768. The substrate holder 2768 is fixed to the deposition chamber 2706b by an adjustment member 2784. Owing to the adjustment member 2784, the substrate holder 2768 can move to a region between the targets 2766a and 2766b (a region between targets). Providing the substrate holder 2768 supporting the substrate 2769 in the region between targets can reduce damage due to plasma in some cases, for example. Although not illustrated, the substrate holder 2768 may include a substrate holding mechanism that holds the substrate 2769, a heater that heats the substrate 2769 from the back side, or the like.

The target shields 2767 can suppress deposition of a particle that is sputtered from the target 2766 on a region where deposition is not needed. Moreover, the target shields 2767 are preferably processed to prevent accumulated sputtered particles from being separated. For example, blasting treatment that increases surface roughness may be performed, or roughness may be formed on the surfaces of the target shields 2767.

The deposition chamber 2706b is connected to the mass flow controller 2780 through a gas heating mechanism 2782, and the gas heating mechanism 2782 is connected to the refiner 2781 through the mass flow controller 2780. With the gas heating mechanism 2782, a gas that is introduced to the deposition chamber 2706b can be heated to a temperature higher than or equal to 40° C. and lower than or equal to 400° C., preferably higher than or equal to 50° C. and lower than or equal to 200° C. Note that although the gas heating mechanism 2782, the mass flow controller 2780, and the refiner 2781 can be provided for each of a plurality of kinds of gases, only one gas heating mechanism 2782, one mass flow controller 2780, and one refiner 2781 are provided for easy understanding. As the gas introduced to the deposition chamber 2706b, a gas whose dew point is −80° C. or lower, preferably −100° C. or lower can be used; for example, an oxygen gas, a nitrogen gas, and a rare gas (e.g., an argon gas) are used.

In the case where the refiner is provided near a gas inlet, the length of a pipe between the refiner and the deposition chamber 2706b is less than or equal to 10 m, preferably less than or equal to 5 m, and further preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example.

Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where a resin or the like is used.

The deposition chamber 2706b is connected to a turbo molecular pump 2772 and the vacuum pump 2770 through valves.

In addition, the deposition chamber 2706b is provided with a cryotrap 2751.

The cryotrap 2751 is a mechanism that can adsorb a molecule (or an atom) having a relatively high melting point, such as water. The turbo molecular pump 2772 is capable of stably removing a large-sized molecule (or atom), needs low frequency of maintenance, and thus enables high productivity, whereas it has a low capability in removing hydrogen and water. Hence, the cryotrap 2751 is connected to the deposition chamber 2706b so as to have a high capability in removing water or the like. The temperature of a refrigerator of the cryotrap 2751 is set to be lower than or equal to 100 K, preferably lower than or equal to 80 K. In the case where the cryotrap 2751 includes a plurality of refrigerators, it is preferable to set the temperatures of the refrigerators at different temperatures because efficient exhaust is possible. For example, the temperature of a first-stage refrigerator may be set to be lower than or equal to 100 K and the temperature of a second-stage refrigerator may be set to be lower than or equal to 20 K. Note that when a titanium sublimation pump is used instead of the cryotrap, a higher vacuum can be achieved in some cases. Using an ion pump instead of a cryopump or a turbo molecular pump can also achieve higher vacuum in some cases.

Note that the exhaust method of the deposition chamber 2706b is not limited to the above, and a structure similar to that in the exhaust method described above for the transfer chamber 2704 (the exhaust method using the cryopump and the vacuum pump) may be employed. Needless to say, the exhaust method of the transfer chamber 2704 may have a structure similar to that of the deposition chamber 2706b (the exhaust method using the turbo molecular pump and the vacuum pump).

Note that in each of the transfer chamber 2704, the substrate heating chamber 2705, and the deposition chamber 2706b that are described above, the back pressure (total pressure) and the partial pressure of each gas molecule (atom) are preferably set as follows. In particular, the back pressure and the partial pressure of each gas molecule (atom) in the deposition chamber 2706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, and further preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, and further preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, and further preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, and further preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 2704, the substrate heating chamber 2705, and the deposition chamber 2706b that are described above preferably have a small amount of external leakage or internal leakage.

For example, in each of the transfer chamber 2704, the substrate heating chamber 2705, and the deposition chamber 2706b that are described above, the leakage rate is less than or equal to $3\times10^{-6}$ Pa·m³/s, preferably less than or equal to $1\times10^{-6}$ Pa·m³/s. The leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s. The leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s. The leakage rate of a gas molecule (atom) having a mass-to-charge ratio (m/z) of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate can be set to be less than or equal to the above value.

For example, an open/close portion of the deposition chamber 2706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 2700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 2700 may be covered with iron fluoride, aluminum oxide, chromium oxide, or the like.

The member of the deposition apparatus 2700 is preferably formed using only metal when possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the exhaust rate, it is important that the adsorbed substance present in the deposition chamber be desorbed as much as possible and exhaust be performed in advance with the use of a pump with high exhaust capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to desorb simply by exhaust, can be further increased. Note that when the inert gas that is introduced is heated to substantially the same temperature as the baking temperature, the desorption rate of the adsorbed substance can be further increased. Here, a rare gas is preferably used as an inert gas. Depending on the kind of a film to be deposited, oxygen or the like may be used instead of an inert gas. For example, in deposition of an oxide, the use of oxygen that is a main component of the oxide is preferable in some cases. The baking is preferably performed using a lamp.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, further preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. As the dummy substrate, a substrate that releases a smaller amount of gas is preferably used. By performing dummy deposition, the concentration of impurities in a film to be formed later can be reduced. Note that the dummy deposition may be performed at the same time as the baking of the deposition chamber.

Next, the details of the transfer chamber 2704 and the load lock chamber 2703*a* illustrated in FIG. 54B and the atmosphere-side substrate transfer chamber 2702 and the atmosphere-side substrate supply chamber 2701 illustrated in FIG. 54C are described. Note that FIG. 54C illustrates a cross section of the atmosphere-side substrate transfer chamber 2702 and the atmosphere-side substrate supply chamber 2701.

For the transfer chamber 2704 illustrated in FIG. 54B, the description of the transfer chamber 2704 illustrated in FIG. 54A can be referred to.

The load lock chamber 2703*a* includes a substrate delivery stage 2752. When a pressure in the load lock chamber 2703*a* becomes atmospheric pressure by being increased from reduced pressure, the substrate delivery stage 2752 receives a substrate from the transfer robot 2763 provided in the atmosphere-side substrate transfer chamber 2702. After that, the load lock chamber 2703*a* is evacuated into vacuum so that the pressure therein becomes reduced pressure and then the transfer robot 2763 provided in the transfer chamber 2704 receives the substrate from the substrate delivery stage 2752.

Furthermore, the load lock chamber 2703*a* is connected to the vacuum pump 2770 and the cry opump 2771 through valves. For a method for connecting exhaust systems such as the vacuum pump 2770 and the cryopump 2771, the description of the method for connecting the transfer chamber 2704 can be referred to, and the description thereof is omitted here. Note that the unload lock chamber 2703*b* illustrated in FIG. 53 can have a structure similar to that of the load lock chamber 2703*a*.

The atmosphere-side substrate transfer chamber 2702 includes the transfer robot 2763. The transfer robot 2763 can deliver a substrate from the cassette port 2761 to the load lock chamber 2703*a* or deliver a substrate from the load lock chamber 2703*a* to the cassette port 2761. Furthermore, a mechanism for cleaning dust or a particle, such as a high-efficiency particulate air (HEPA) filter, may be provided above the atmosphere-side substrate transfer chamber 2702 and the atmosphere-side substrate supply chamber 2701.

The atmosphere-side substrate supply chamber 2701 includes a plurality of cassette ports 2761. The cassette port 2761 can hold a plurality of substrates.

The surface temperature of the target is set to be lower than or equal to 100° C., preferably lower than or equal to 50° C., and further preferably about room temperature (typified by 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal of a bonding material used for adhesion between the backing plate and the target might be sputtered and might cause an increase in impurity concentration. Thus, it is preferable that the target be cooled sufficiently.

Specifically, to efficiently cool the target, a metal having high conductivity and a high heat dissipation property (specifically copper) is used for the backing plate, or a sufficient amount of cooling water is made to flow through a water channel formed in the backing plate.

Note that in the case where the target includes zinc, plasma damage is alleviated by the deposition in an oxygen gas atmosphere; thus, an oxide in which zinc is unlikely to be volatilized can be obtained.

The above-described deposition apparatus enables deposition of an oxide semiconductor whose hydrogen concentration measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, and still further preferably lower than or equal to $5\times10^{18}$ atoms/cm$^3$.

Furthermore, an oxide semiconductor whose nitrogen concentration measured by SIMS is lower than $5\times10^{19}$ atoms/cm$^3$, preferably lower than or equal to $1\times10^{19}$ atoms/cm$^3$, further preferably lower than or equal to $5\times10^{18}$ atoms/cm$^3$, and still further preferably lower than or equal to $1\times10^{18}$ atoms/cm$^3$ can be deposited.

Moreover, an oxide semiconductor whose carbon concentration measured by SIMS is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ can be deposited.

Furthermore, an oxide semiconductor can be deposited in which the released amount of each of the following gas molecules (atoms) measured by thermal desorption spectroscopy (TDS) is less than or equal to $1\times10^{19}$/cm$^3$ and preferably less than or equal to $1\times10^{18}$/cm$^3$: a gas molecule (atom) having a mass-to-charge ratio (m/z) of 2 (e.g., a hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the oxide semiconductor can be suppressed. Furthermore, when a film in contact with the oxide semiconductor is formed with the use of the above deposition apparatus, the entry of impurities into the oxide semiconductor from the film in contact therewith can be suppressed.

This embodiment can be implemented in appropriate combinations with any of the other embodiments.

This application is based on Japanese Patent Application serial No. 2015-040597 filed with Japan Patent Office on Mar. 2, 2015 and Japanese Patent Application serial No. 2015-056030 filed with Japan Patent Office on Mar. 19, 2015, the entire contents of which are hereby incorporated by reference.

What is claimed is:

1. A method for manufacturing a transistor comprising the steps of:
   forming a second oxide layer over a first oxide layer;
   processing the first oxide layer and the second oxide layer into an island shape;
   forming a third oxide layer to cover the second oxide layer;
   forming a first insulating layer to cover the third oxide layer;
   forming a first electrode over the first insulating layer;
   removing part of the third oxide layer and part of the first insulating layer using the first electrode as a mask to expose part of the second oxide layer;
   introducing elements to the part of the second oxide layer;
   forming a second insulating layer;
   processing the second insulating layer to form a structure body covering a side surface of the first electrode;
   forming a second electrode and a third electrode to be in contact with the exposed region of the second oxide layer;
   forming a third insulating layer to cover the second electrode and the third electrode;
   introducing oxygen to the third insulating layer when a fourth insulating layer is formed to cover the third insulating layer; and
   performing a heat treatment after the step of introducing oxygen to the third insulating layer when the fourth insulating layer is formed to cover the third insulating layer,
   wherein the second oxide layer is an oxide semiconductor.

2. The method for manufacturing a transistor according to claim 1, wherein the structure body comprises silicon and oxygen.

3. The method for manufacturing a transistor according to claim 1, wherein the element is tungsten, titanium, aluminum, or a rare gas element.

4. The method for manufacturing a transistor according to claim 1, wherein the step of introducing oxygen to the third insulating layer when the fourth insulating layer is formed to cover the third insulating layer is performed by a sputtering method.

5. The method for manufacturing a transistor according to claim 1, wherein the second oxide layer comprises one or both of indium and zinc.

6. The method for manufacturing a transistor according to claim 1, wherein the second oxide layer comprises a c-axis aligned crystalline oxide semiconductor.

7. The method for manufacturing a transistor according to claim 1, wherein the first oxide layer and the third oxide layer contain a metal element that is the same kind as at least one metal element contained in the second oxide layer.

8. A semiconductor device comprising:
   a transistor manufactured by the method according to claim 1; and
   a capacitor or a resistor.

9. An electronic device comprising:
   the semiconductor device according to claim 8; and
   an antenna, a battery, an operation switch, a microphone, or a speaker.

10. An electronic device comprising:
    the transistor manufactured by the method according to claim 1; and
    an antenna, a battery, an operation switch, a microphone, or a speaker.

* * * * *